United States Patent
Ogiwara et al.

(10) Patent No.: US 11,651,818 B2
(45) Date of Patent: May 16, 2023

(54) MEMORY DEVICE

(71) Applicant: Kioxia Corporation, Tokyo (JP)

(72) Inventors: Ryu Ogiwara, Yokohama Kanagawa (JP); Daisaburo Takashima, Yokohama Kanagawa (JP); Takahiko Iizuka, Fujisawa Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 121 days.

(21) Appl. No.: 17/443,586

(22) Filed: Jul. 27, 2021

(65) Prior Publication Data

US 2022/0028452 A1    Jan. 27, 2022

(30) Foreign Application Priority Data

Jul. 27, 2020 (JP) .............................. JP2020-126450

(51) Int. Cl.
| | | |
|---|---|---|
| *G11C 11/00* | (2006.01) | |
| *G11C 13/00* | (2006.01) | |
| *G11C 16/34* | (2006.01) | |
| *G11C 16/04* | (2006.01) | |

(52) U.S. Cl.
CPC ........ *G11C 13/0028* (2013.01); *G11C 13/004* (2013.01); *G11C 13/0026* (2013.01); *G11C 13/0038* (2013.01); *G11C 13/0069* (2013.01); *G11C 16/0433* (2013.01); *G11C 16/3404* (2013.01)

(58) Field of Classification Search
CPC ............ G11C 13/0028; G11C 13/0026; G11C 13/0038; G11C 13/004

USPC ......................................................... 365/148
See application file for complete search history.

(56) References Cited

U.S. PATENT DOCUMENTS

| | | | |
|---|---|---|---|
| 5,894,447 A | 4/1999 | Takashima | |
| 9,025,369 B2 | 5/2015 | Takashima | |
| 9,966,136 B2 | 5/2018 | Ogiwara et al. | |
| 2013/0100754 A1* | 4/2013 | Asaoka .............. | G11C 16/3404 365/222 |
| 2014/0211539 A1* | 7/2014 | Kanno ................. | G11C 13/004 365/148 |

(Continued)

OTHER PUBLICATIONS

U.S. Appl. No. 17/348,839, First Named Inventor: Takahiko Iizuka; Title: "Memory Device and Method of Manufacturing Memory Device", filed Jun. 16, 2021.

(Continued)

*Primary Examiner* — Vu A Le
(74) *Attorney, Agent, or Firm* — Holtz, Holtz & Volek PC

(57) ABSTRACT

According to one embodiment, a memory device includes: a variable resistance memory region; a semiconductor layer; an insulating layer; first and second word lines; and a first select gate line. When information stored in the first memory cell is read, or when information is written into the first memory cell, after a voltage of the first select gate line is set to a first voltage and voltages of the first and second word lines are set to a second voltage, the voltage of the first select gate line is increased from the first voltage to a third voltage. After the voltage of the first select gate line is increased to at least the second voltage, the voltage of the first word line is decreased from the second voltage to the first voltage, and the voltage of the second word line is increased from the second voltage to a fourth voltage.

35 Claims, 39 Drawing Sheets

(56) References Cited

U.S. PATENT DOCUMENTS

2020/0403035 A1  12/2020  Ogiwara et al.

OTHER PUBLICATIONS

Kinoshita, et al., "Scalable 3-D vertical chain-cell type phase-change memory with 4F2 poly-Si diodes", Symposium on VLSI Technology Digest of Technical Papers, 2012, pp. 35-36.

* cited by examiner

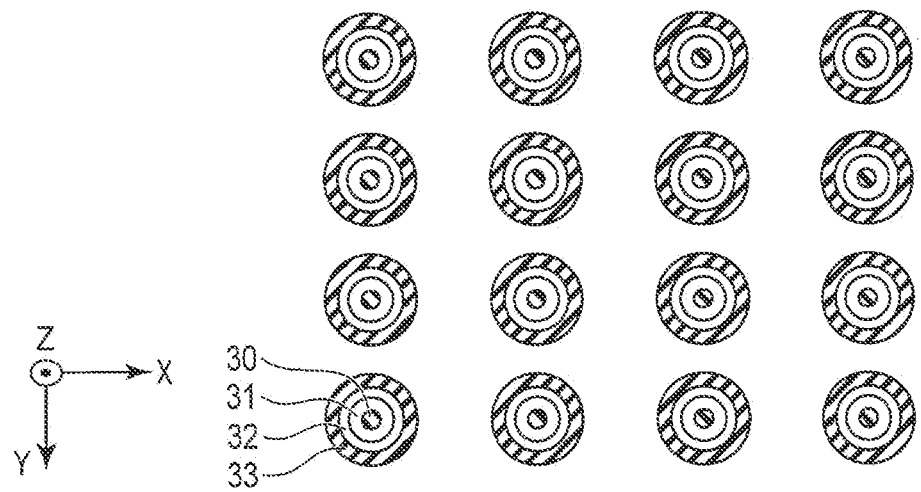
F I G. 7
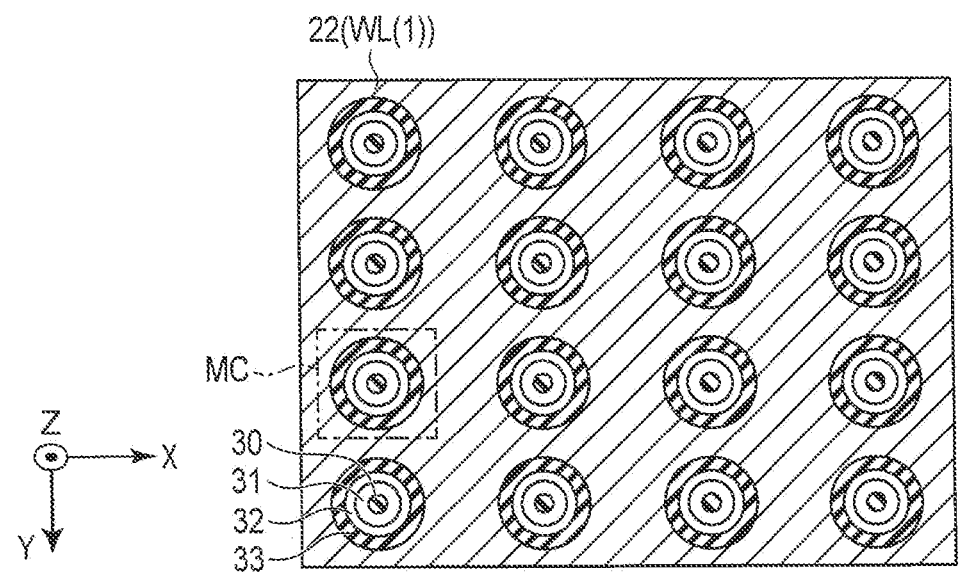
F I G. 8

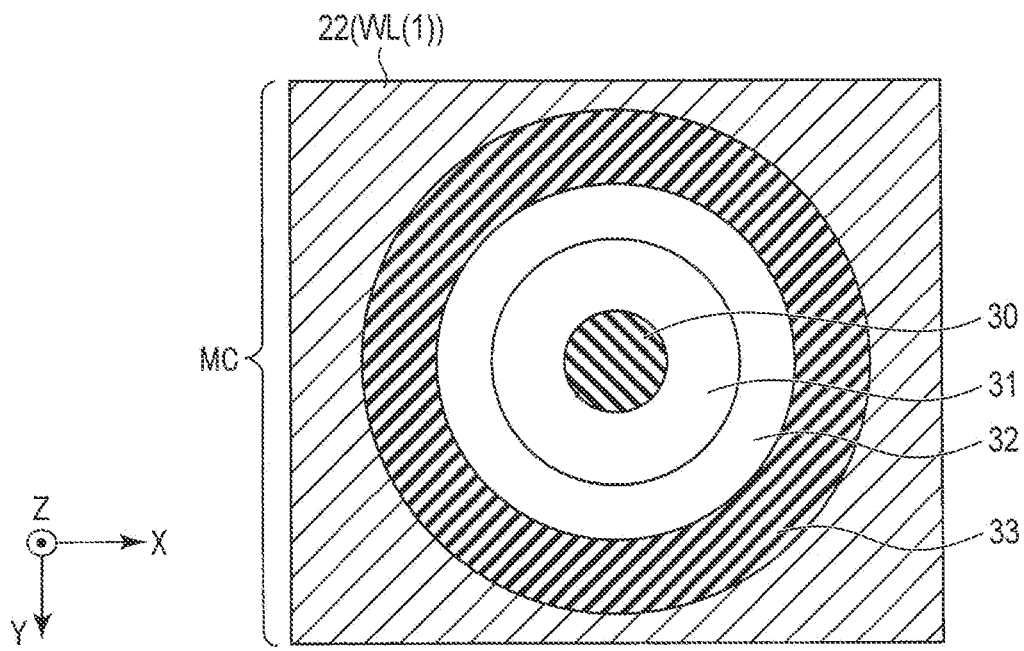
F I G. 9
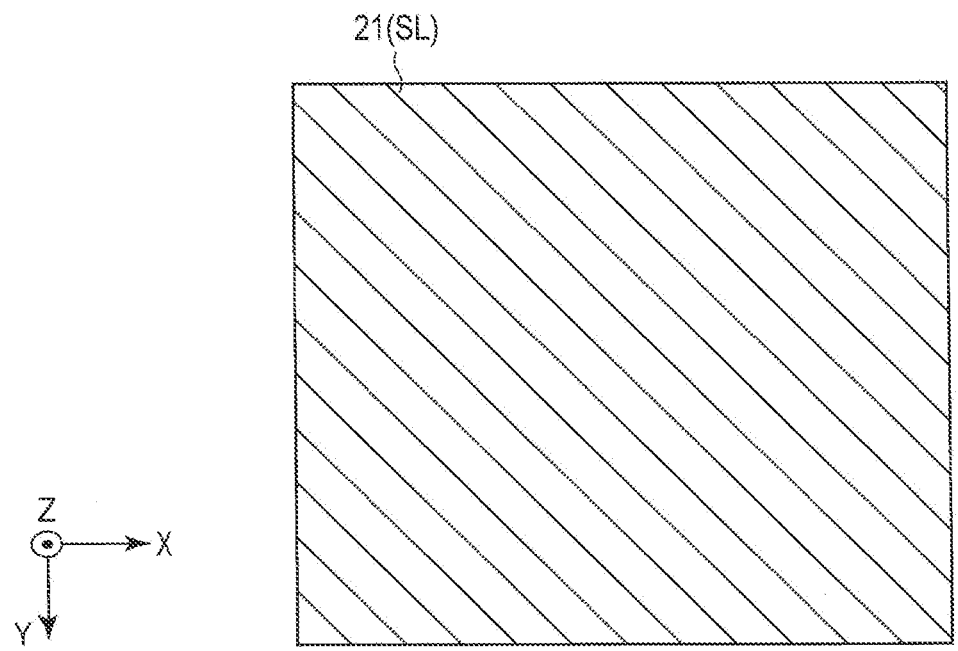
F I G. 10

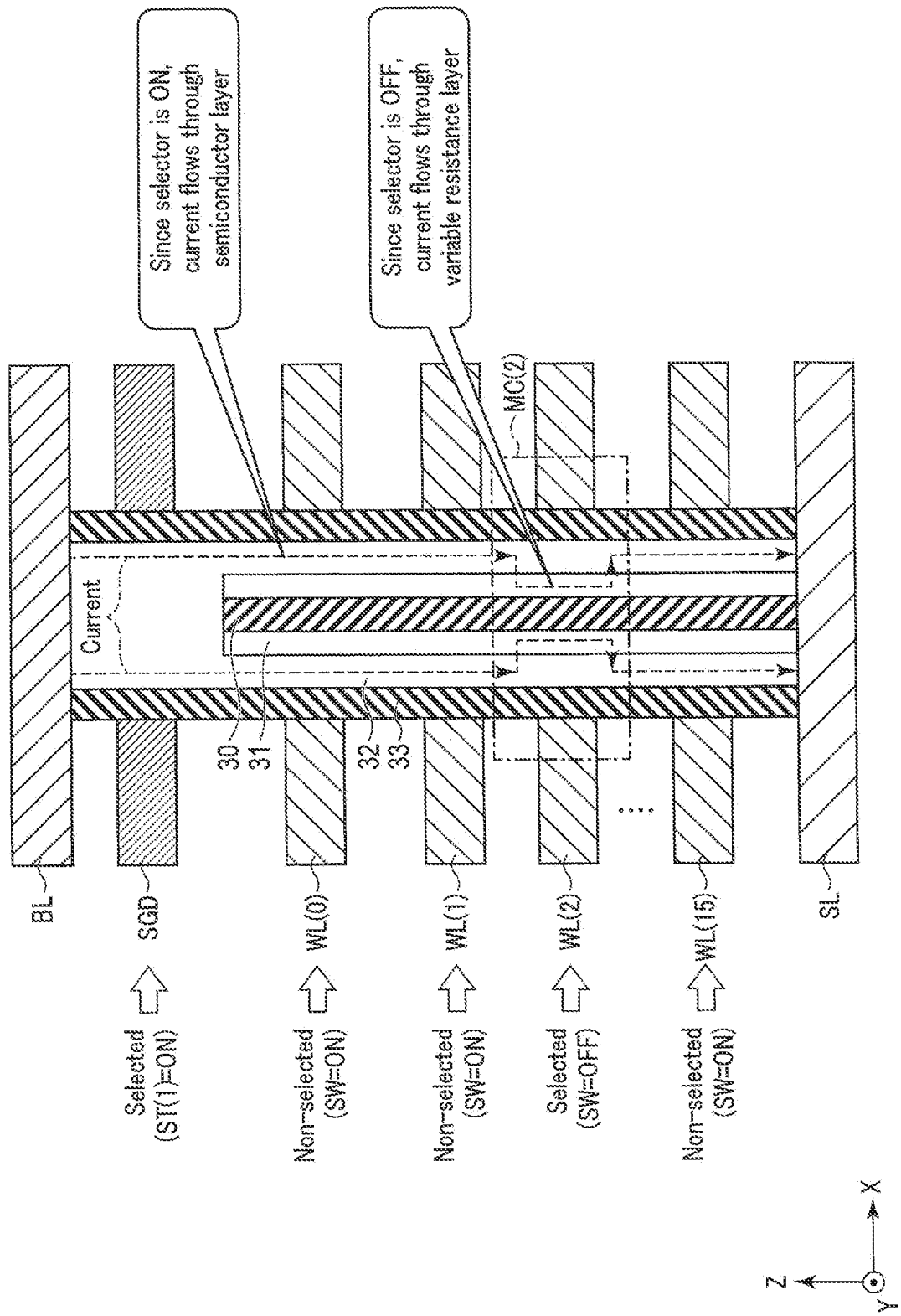
F I G. 13

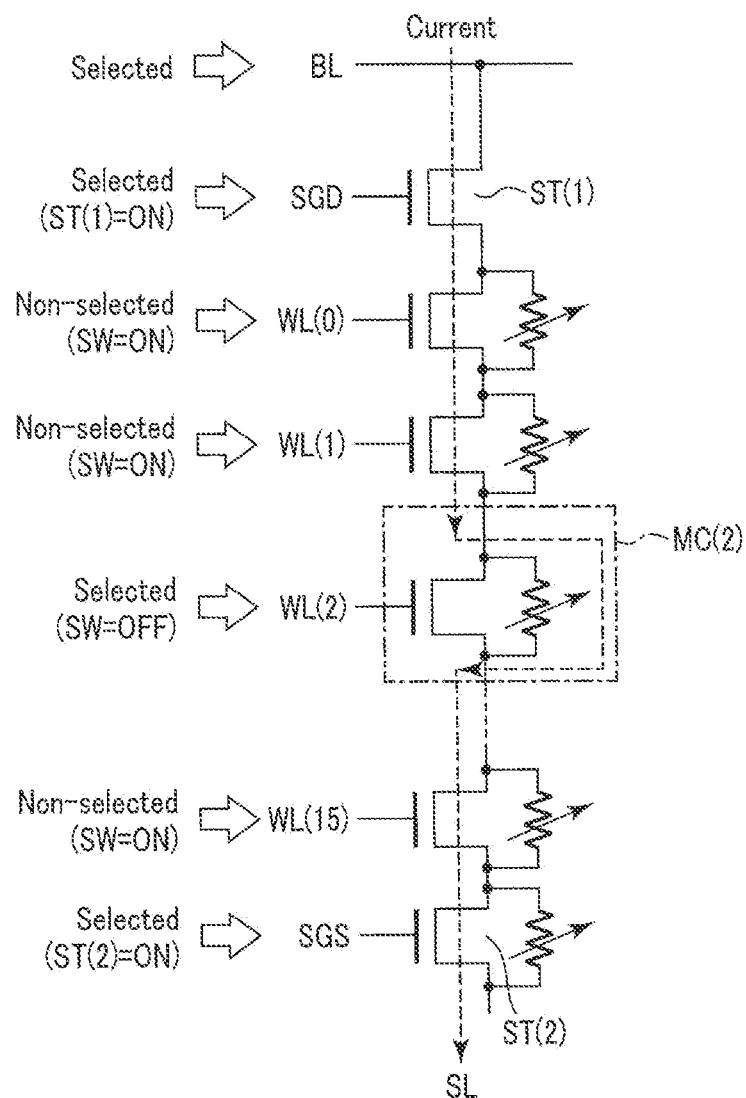
F I G. 28

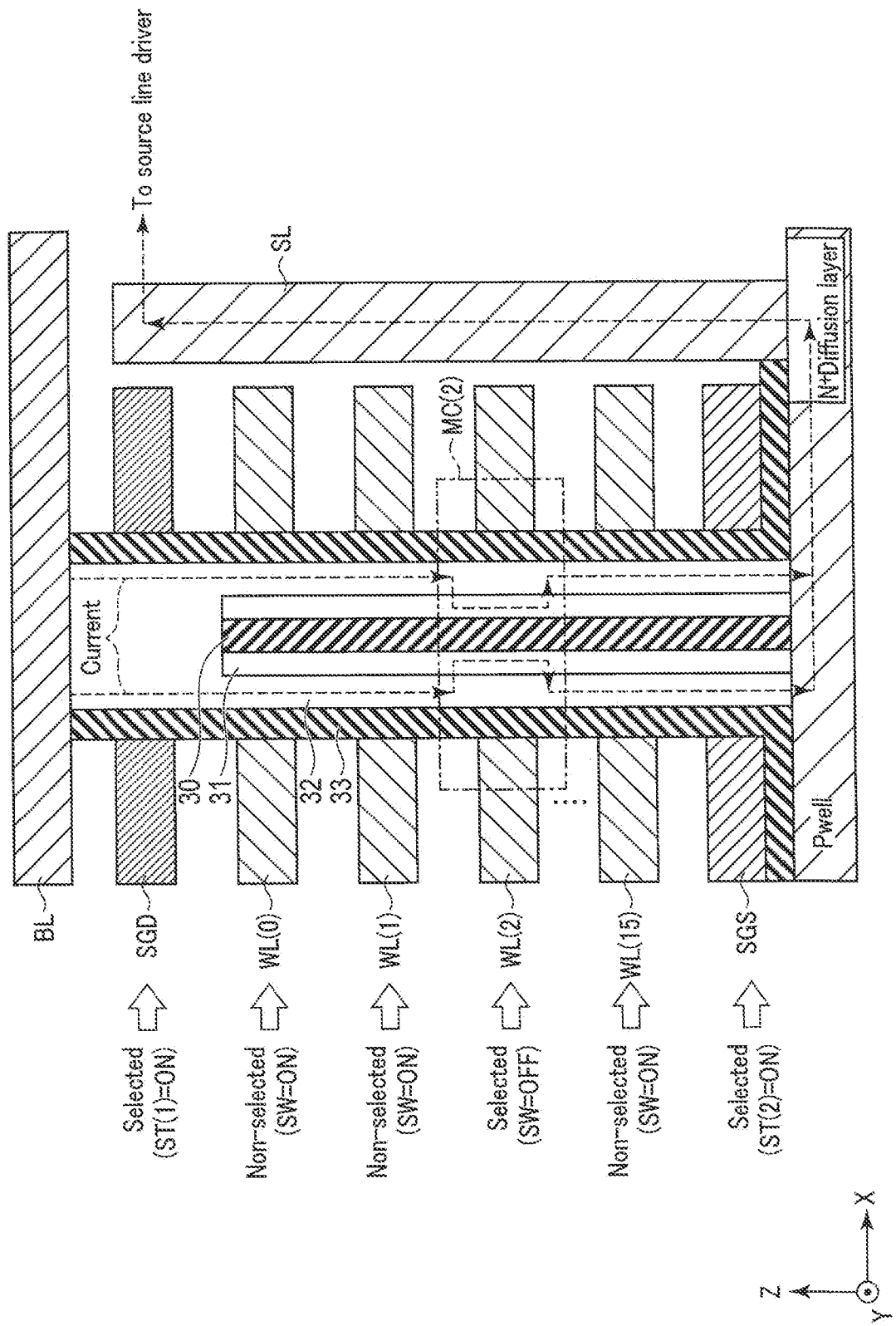
F I G. 29

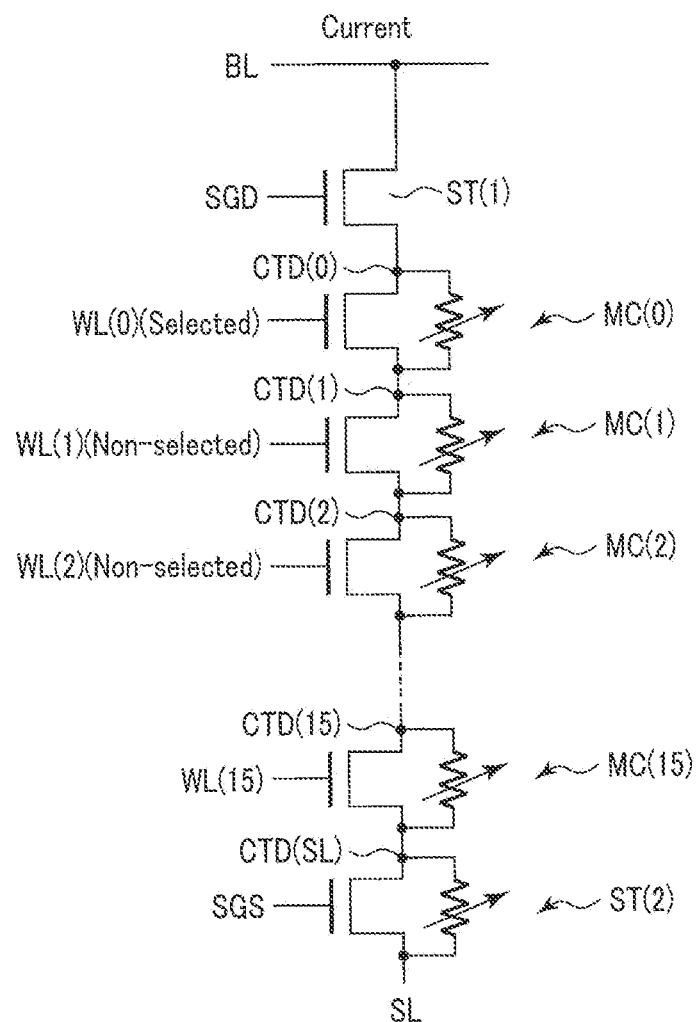
F I G. 31

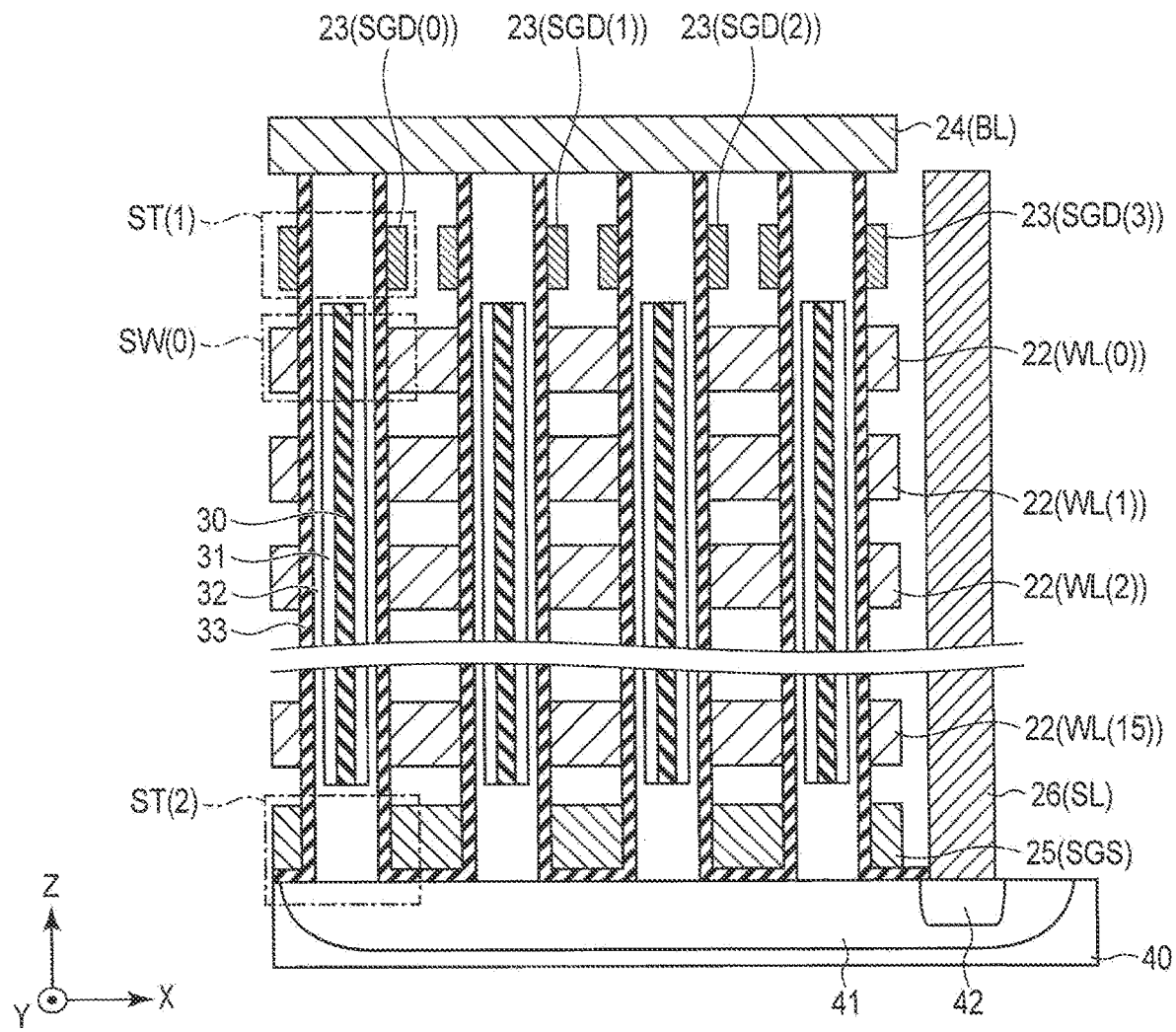
F I G. 34

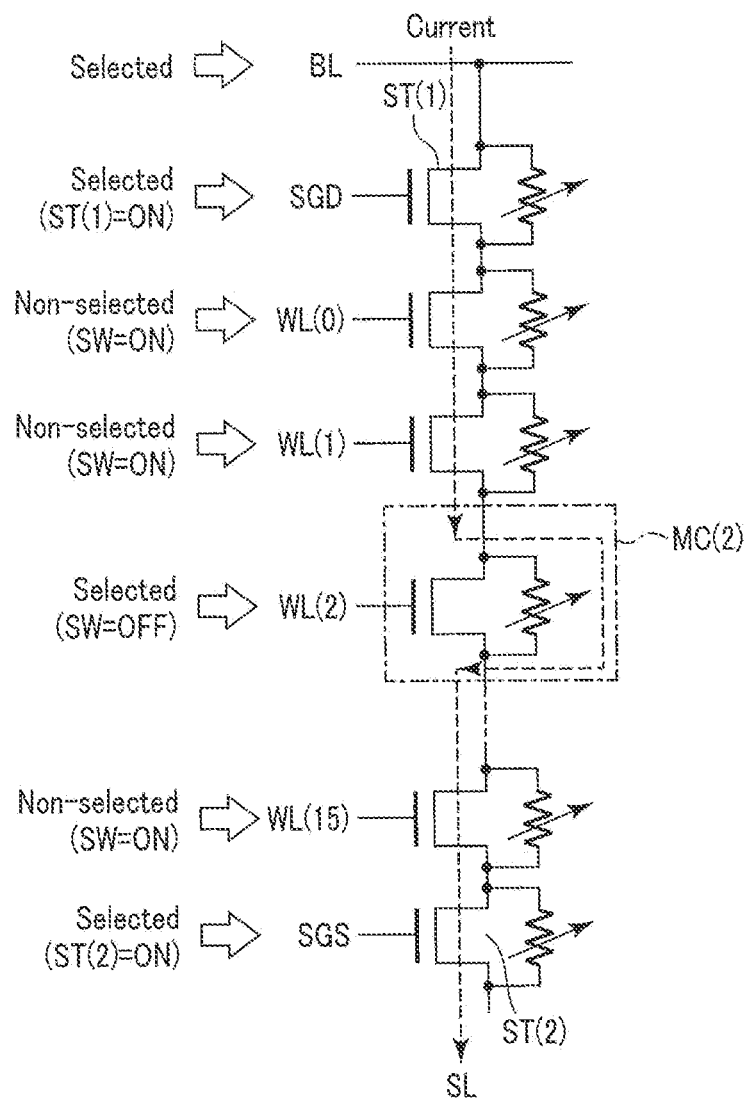
F I G. 39

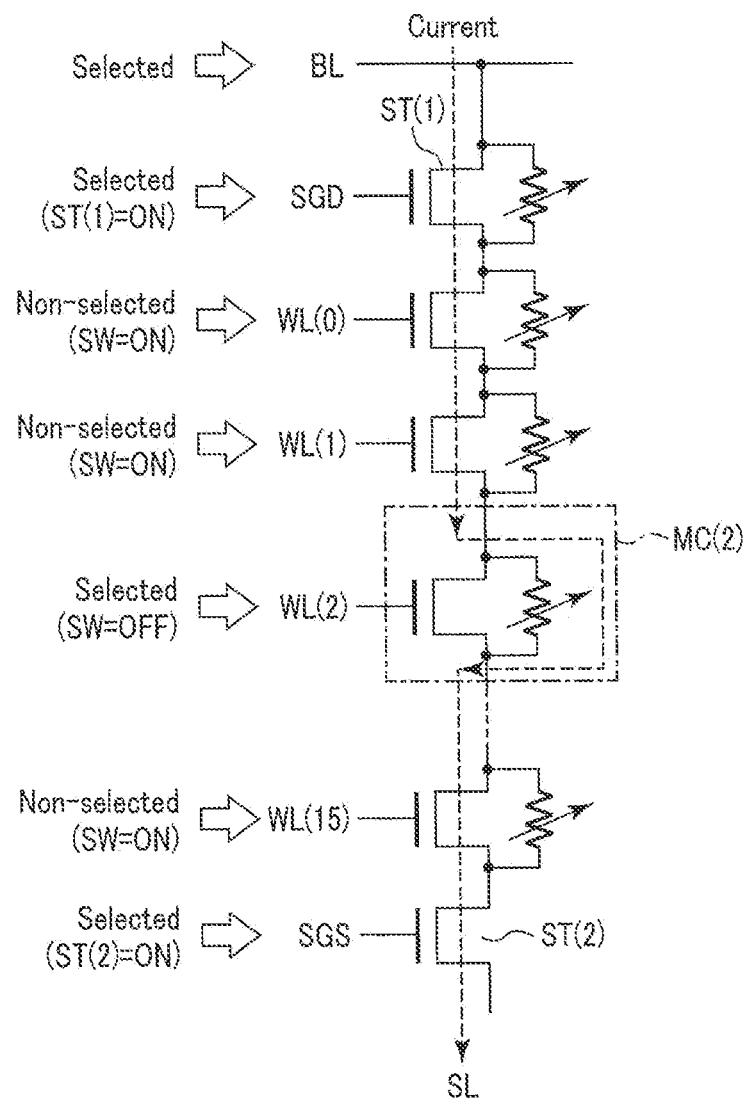
F I G. 42

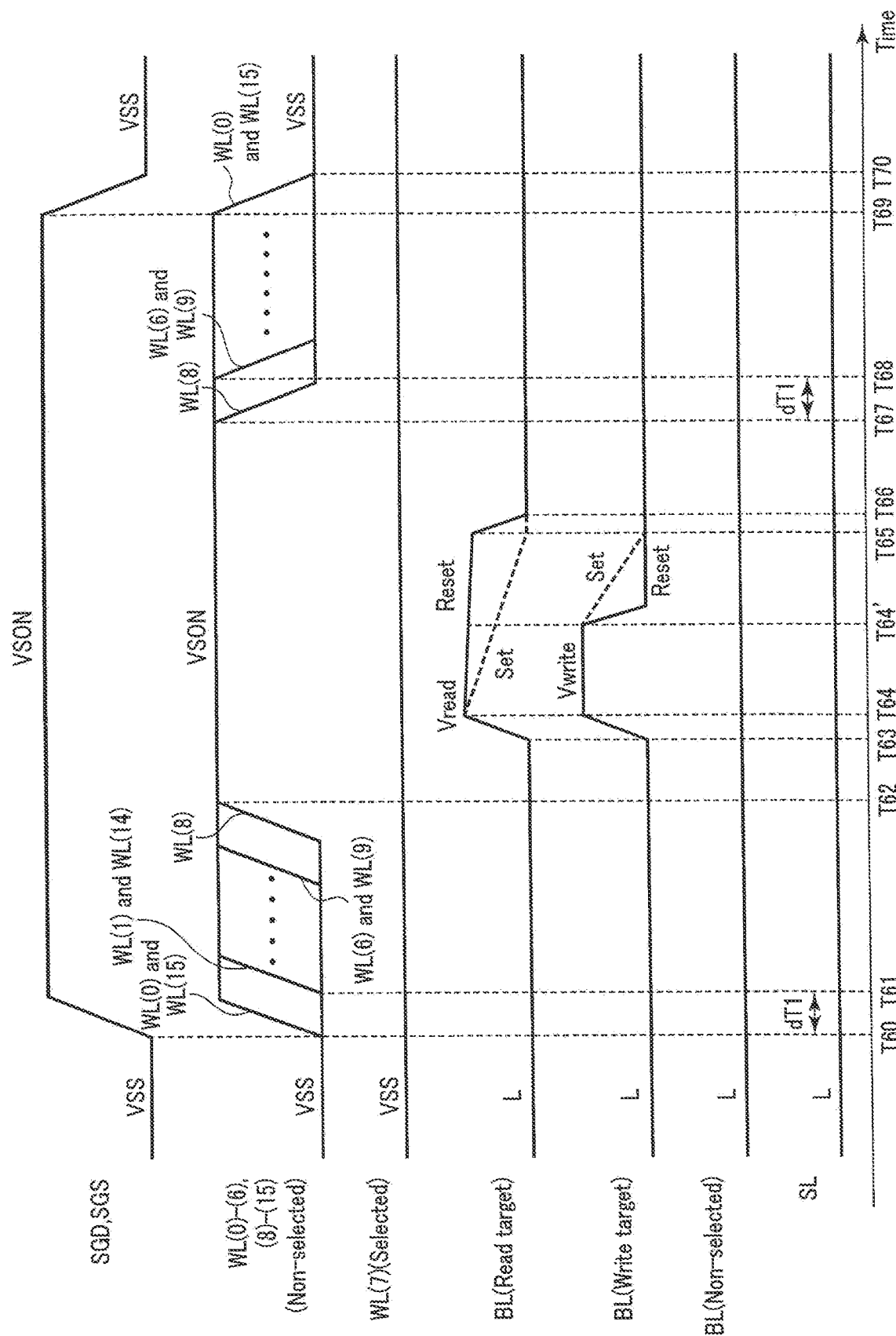
F I G. 47

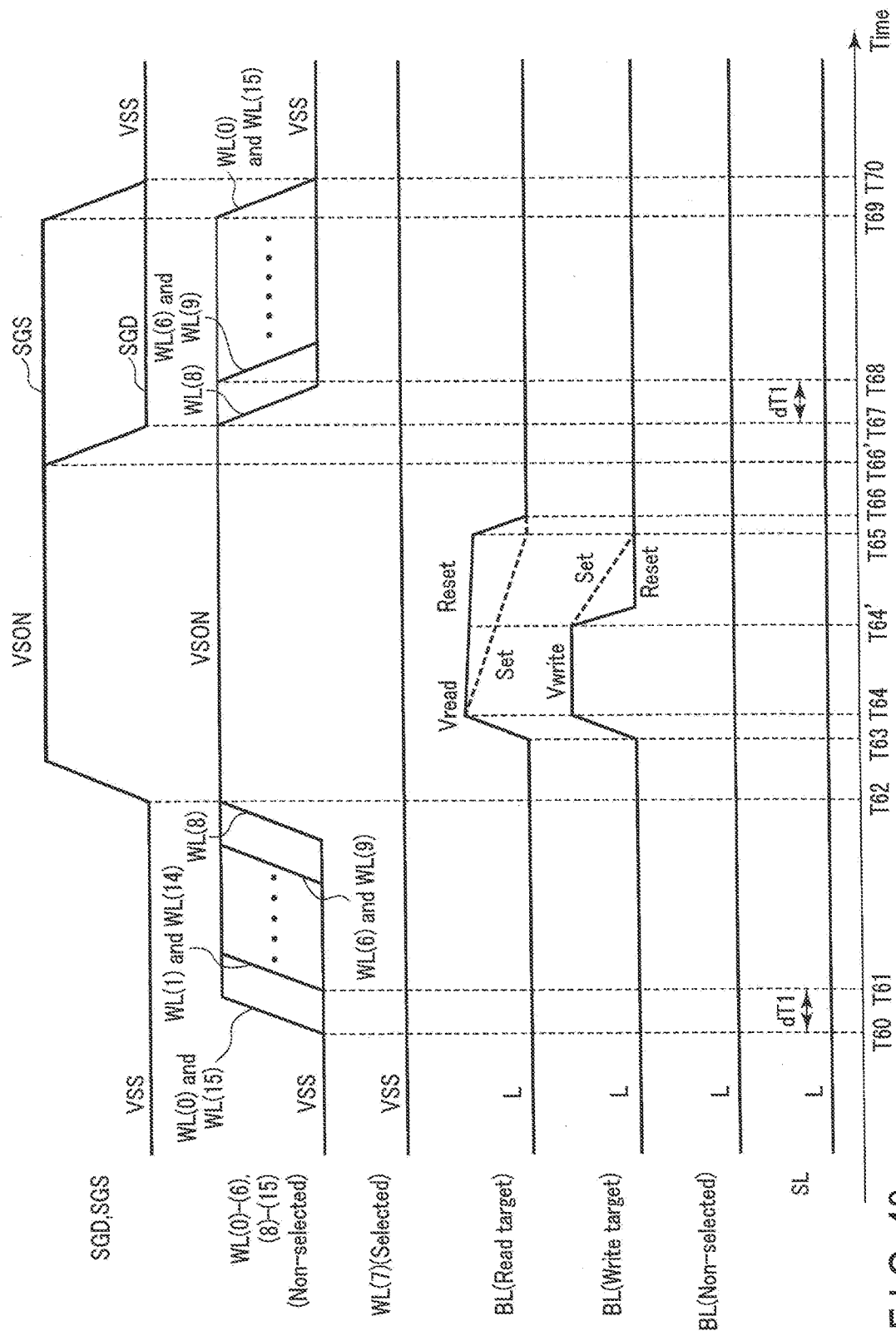
F I G. 48

MEMORY DEVICE

CROSS-REFERENCE TO RELATED APPLICATIONS

This application is based upon and claims the benefit of priority from Japanese Patent Application No. 2020-126450, filed Jul. 27, 2020, the entire contents of which are incorporated herein by reference.

FIELD

Embodiments described herein relate generally to a memory device.

BACKGROUND

Memory devices (semiconductor integrated circuit devices) in which variable resistance memory elements, such as resistive random access memory (ReRAM) elements, alloy-based phase-change memory (PCM) elements, interfacial phase-change memory (iPCM) elements, and conduction bridge RAM (CBRAM) elements, are integrated on a semiconductor substrate have been proposed.

For a memory device using such a variable resistance memory element, a three-dimensional structure that can be easily manufactured, reduces the time required for development, and allows for high integration that reduces the processing cost has not been proposed.

BRIEF DESCRIPTION OF THE DRAWINGS

FIG. 7 is a plan view taken along line B-B of FIG. 5.

FIG. 8 is a plan view taken along line C-C of FIG. 5.

FIG. 9 is a plan view of a memory cell of the memory cell array included in the memory chip according to the first embodiment.

FIG. 10 is a plan view taken along line D-D of FIG. 5.

FIG. 13 is a memory cell array cross-sectional view in which a memory pillar corresponding to a single memory cell string in the memory cell array included in the memory chip according to the first embodiment is extracted.

FIG. 28 is a circuit diagram in which a single memory cell string in the memory cell array included in the memory chip according to the second embodiment is extracted.

FIG. 29 is a memory cell array cross-sectional view in which a memory pillar corresponding to a single memory cell string in the memory cell array included in the memory chip according to the second embodiment is extracted.

FIG. 31 is a circuit diagram in which a single memory cell string in the memory cell array included in the memory chip according to the second embodiment is extracted.

FIG. 34 is a cross-sectional view showing an example of a cross-sectional structure of the memory cell array included in the memory chip according to the second modification of the second embodiment.

FIG. 39 is a circuit diagram in which a single memory cell string in the memory cell array included in the memory chip according to the third modification of the second embodiment is extracted.

FIG. 42 is a circuit diagram in which a single memory cell string in the memory cell array included in the memory chip according to the fourth modification of the second embodiment is extracted.

FIG. 47 is a timing chart showing an operation waveform in a memory chip according to a second modification of the fourth embodiment.

FIG. 48 is a timing chart showing an operation waveform in a memory chip according to a third modification of the fourth embodiment.

DETAILED DESCRIPTION

In general, according to one embodiment, a memory device includes: a variable resistance memory region extending in a first direction that is orthogonal to a semiconductor substrate; a semiconductor layer extending in the first direction and being in contact with the variable resistance memory region; an insulating layer extending in the first direction and being in contact with the semiconductor layer; a first word line extending in a second direction that is orthogonal to the first direction and being in contact with the insulating layer; a second word line extending in the second direction, being in contact with the insulating layer, and being located at a position different from the first word line in the first direction; a first select gate line extending in the second direction and being in contact with the insulating layer; and a bit line extending in a third direction that is orthogonal to the first direction and the second direction and being in contact with the semiconductor layer. In a first plane defined by the second direction and the third direction, a portion where the variable resistance memory region, the semiconductor layer, and the insulating layer intersect the first word line functions as a first memory cell. In the first plane, a portion where the variable resistance memory region, the semiconductor layer, and the insulating layer intersect the second word line functions as a second memory cell. In the first plane, a portion where the semiconductor layer and the insulating layer intersect the first select gate, line functions as a first select transistor. When information stored in the first memory cell is read, or when information is written into the first memory cell, after a voltage of the first select gate line is set to a first voltage, and a voltage of the first word line and a voltage of the second word line are set to a second voltage higher than the first voltage, the voltage of the first select gate line is increased from the first voltage to a third voltage higher than the second voltage, and after the voltage of the first select gate line is increased to at least the second voltage, the voltage of the first word line is decreased from the second voltage to the first voltage, and the voltage of the second word line is increased from the second voltage to a fourth voltage.

Hereinafter, the embodiments will be described with reference to the drawings. In the description below, structural elements having the same functions and configurations will be denoted by a common reference symbol.

<1> First Embodiment

A memory device according to the first embodiment will be described.

<1-1> Configuration

<1-1-1> Overall Configuration of Memory System

First, a basic overall configuration of a memory system including the memory device (hereinafter also referred to as a "memory chip") according to the present embodiment will be described with reference to FIG. 1.

Figure 1:
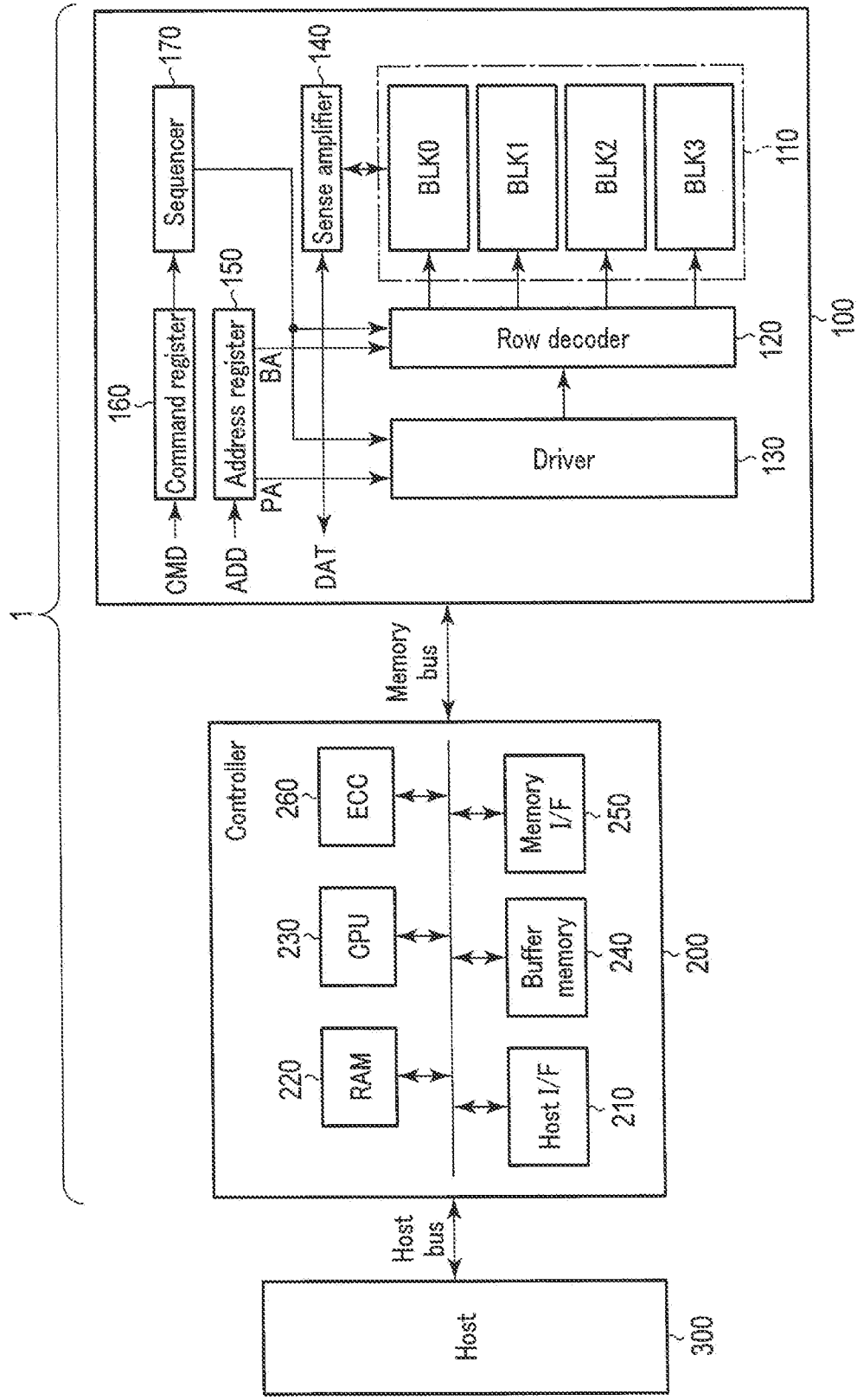
FIG. 1 is a block diagram showing a basic overall configuration of a memory system including a memory chip according to a first embodiment.

As shown in FIG. 1, a memory system 1 comprises a memory chip 100 and a controller 200. The memory chip 100 and the controller 200 in combination, for example, may configure a single semiconductor device; examples of such a configuration include a memory card such as an SD™ card and a solid state drive (SSD).

The memory chip 100 includes a plurality of memory cells, and stores data non-volatilely. The controller 200 is coupled to the memory chip 100 via a memory bus, and is coupled to a host 300 via a host bus. The controller 200 controls the memory chip 100, and accesses the memory chip 100 in response to a host command received from the host 300. The host 300 is, for example, a digital camera, a personal computer, etc., and the host bus is a bus that is compatible with, for example, an SD™ interface. The memory bus transmits and receives a signal that is compatible with a memory interface.

<1-1-2> Configuration of Controller 200

Details of the configuration of the controller 200 will be described with continued reference to FIG. 1.

As shown in FIG. 1, the controller 200 includes a host interface circuit (host I/F) 210, an internal memory (random access memory: RAM) 220, a processor (central processing unit: CPU) 230, a buffer memory 240, a memory interface circuit (memory I/F) 250, and an error checking and correcting (SCC) circuit 260.

The host interface circuit 210 is coupled to the host 300 via the host bus, and transfers a host command and data received from the host 300 to the processor 230 and the buffer memory 240, respectively. In response to an instruction from the processor 230, the host interface circuit 210 transfers data in the buffer memory 240 to the host 300.

The processor 230 controls the operation of the entire controller 200. Upon receiving, for example, a host command relating to a read operation from the host 300, the processor 230 causes, in response thereto, the memory interface circuit 250 to issue a read command (memory command) to the memory chip 100. Upon receiving a host command relating to a write operation from the host 300, the processor 230 performs a similar operation. Also, the processor 230 performs various processes (e.g., wear leveling) for managing the memory chip 100.

The memory interface circuit 250 is coupled to the memory chip 100 via a memory bus, and controls communications with the memory chip 100. Based on an instruction received from the processor 230, the memory interface circuit 250 transmits a variety of signals to the memory chip 100, and receives a variety of signals from the memory chip 100.

The buffer memory 240 temporarily stores write data to the memory chip 100 and read data from the memory chip 100.

The internal memory 220 may be, for example, a semiconductor memory such as a DRAM or an SRAM, provided for use as a workspace for the processor 230. The integral memory 220 stores firmware for managing the memory chip 100, and various types of management tables such as a shift table, a history table, and a flag table, which will be described later.

The ECC circuit 260 performs error detection and correction processes on data stored in the memory chip 100. That is, the ECC circuit 260 generates an error correction code and appends it to write data when in data writing, and decodes it when in data reading.

<1-1-3> Configuration of Memory Chip 100

Next, a configuration of the memory chip 100 will be described.

As shown in FIG. 1, the memory chip 100 includes a memory cell array 110, a row decoder 120, a driver circuit 130, a sense amplifier 140, an address register 150, a command register 160, and a sequencer 170.

The memory cell array 110 includes a plurality of blocks BLK each including a plurality of non-volatile memory cells respectively associated with rows (words lines) and columns (bit lines). FIG. 1 shows four blocks BLK0 to BLK3, as an example. The memory cell array 110 stores data supplied from the controller 200.

The row decoder 120 selects one of the blocks BLK0 to BLK3 based on a block address BA in the address register 150, and selects a word line direction in the selected block BLK.

The driver circuit 130 supplies voltages to the selected block BLK via the row decoder 120 based on a page address PA in the address register 150. The driver circuit 130 includes, for example, a source line driver, etc.

When in data reading, the sense amplifier 140, which includes sense amplifier modules provided for respective bit lines BL, senses data read from the memory cell array 110, and performs a necessary computation thereon. The sense amplifier 140 outputs this data DAT to the controller 200. When in data writing, the sense amplifier 140 transfers write data DAT received from the controller 200 to the memory cell array 110.

The address register 150 stores an address ADD received from the controller 200. The address ADD includes the above-described block address BA and page address PA. The command register 160 stores a command CMD received from the controller 200.

The sequencer 170 controls the operation of the entire memory chip 10C based on the command CMD stored in the command register 160.

<1-1-4> Circuit Configuration of Memory Cell Array 110

Next, a circuit (equivalent circuit) configuration of the memory cell array 110 will be described with reference to FIG. 2.

Figure 2:
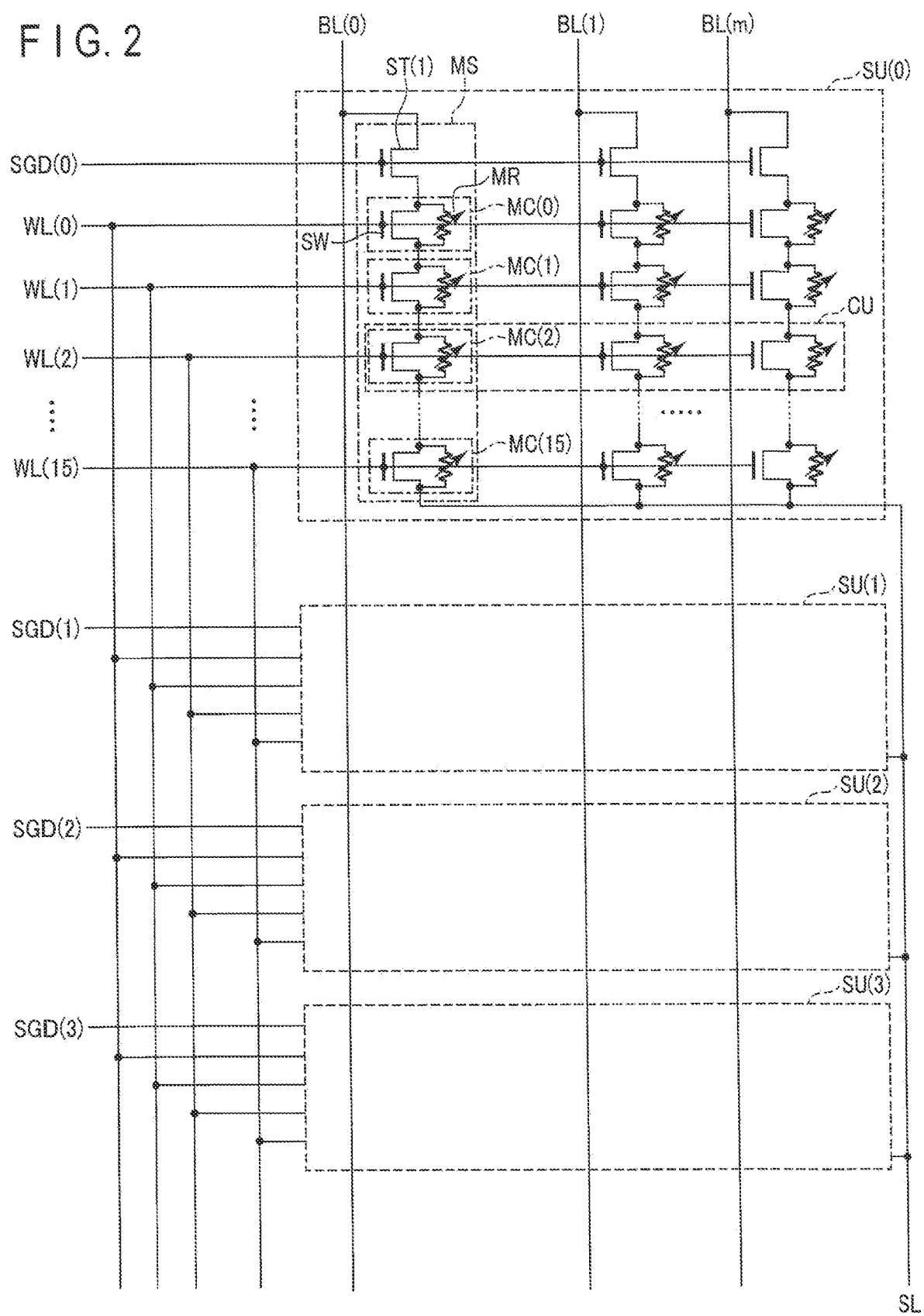
FIG. 2 is a circuit diagram showing a circuit (equivalent circuit) of a memory cell array including in the memory chip according to the first embodiment.

As shown in FIG. 2, each block BLK of the memory cell array 110 includes, for example, four string units SU (SU(0) to SU(3)). The number of string units SU in each block BLK may be designed to be any number. Each string unit SU includes a plurality of memory cell strings MS.

Each memory cell string MS includes, for example, 16 memory cells MC (MC(0) to MC(15)) and a select transistor ST(1) Hereinafter, when the memory cells MC(0) to MC(15) are not distinguished from one another, they will be referred to as "memory cells MC". The number of select transistors ST(1) included in each memory cell string MS may be designed to be any number greater than one.

The memory cell MC includes a memory element (variable resistance memory region/variable resistance layer/variable resistance element) MR and a selector SW. Examples of the memory element MR include an alloy-based phase-change memory ($Ge_2Sb_2Te_5$). The memory element MR according to the present embodiment enters either a low resistance state or a high resistance state according to a change in crystallization state. Hereinafter, a change in the crystallization state of the memory element MR will be referred to as a "phase change", a low resistance state (LRS) of the memory element MR will be referred to as a "set state", and a high resistance state (HRS) of the memory element MR will be referred to as a "reset state". In the present embodiment, the selector SW includes a semiconductor layer, a gate insulating film, and a gate electrode. In the memory cell MC, the memory element MR and the selector SW are coupled in parallel. Also, the number of memory cells MC included in each memory cell string MS is not limited to a particular number, and may be 8, 32, 48, 64, 96, or 128, etc.

Figure 3:
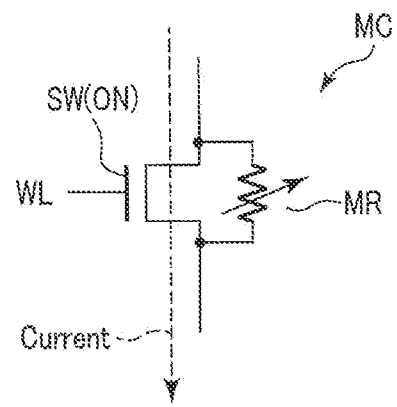
FIG. 3 is a circuit diagram showing a path of a current flowing through a memory cell when a selector is on, in the memory cell array included in the memory chip according to the first embodiment.

When the memory cell MC is not selected, the selector SW is switched to an on state (a conductive state). When the selector SW is in the on state, as shown in FIG. 3, an inversion layer (channel layer) is formed in the semiconductor layer of the selector SW, and therefore a current flows through the inversion layer. A resistance value of the memory element MR in the low resistance state is 10 times (an order of magnitude) or more higher than a resistance value of the semiconductor layer of the selector SW in the on state. Consequently, no current flows through the memory element MR that is coupled in parallel. It is a memory element MR that stores data in a memory cell MC. Thus, if no current flows through the memory element MR, it means that the memory cell MC is not selected.

Figure 4:
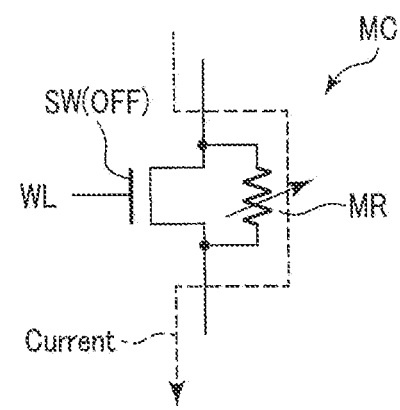
FIG. 4 is a circuit diagram showing a path of a current flowing through a memory cell when a selector is off, in the memory cell array included in the memory chip according to the first embodiment.

When the memory cell MC is selected, the selector SW is switched to an off state (non-conductive state). When the selector SW is in the off state, as shown in FIG. 4, an inversion layer (channel layer) is not formed in the semiconductor layer of the selector SW. A resistance value of the memory element MR in the high resistance state is 10 times (an order of magnitude) or more lower than a resistance value of the semiconductor layer of the selector SW in the off state. Consequently, a current does not flow through the semiconductor layer, and flows through the memory element MR that is coupled in parallel. If a current flows through the memory element MR, it means that the memory cell MC is selected.

Referring back to FIG. 2, a further description will be given of the memory cell array 110. The memory cells MC(0) to MC(15) included in each memory cell string MS are coupled in series between the select transistor ST(1) and a source line SL. Control gates of the memory cells MC(0) of a plurality of memory cell strings MS included in the same block BLK are commonly coupled to a word line WL(0). Similarly, control gates of the memory cells MC(1) to MC(15) of a plurality of memory cell strings MS included in the same block BLK are commonly coupled to word lines WL(1) to WL(15).

Hereinafter, when word lines WL(0) to (15) are not distinguished from one another, they will be referred to as "word lines WL".

In the description that follows, a group of memory cells MC that are coupled to a common word line WL in each string unit SU will be referred to as a "page".

Gates of select transistors ST(1) in each string unit SU are commonly coupled to a select gate line SGD. More specifically, gates of select transistors ST(1) in a string unit SU(0) are commonly coupled to a select gate line SGD(0). Similarly, gates of select transistors ST(1) in a string unit SU(1) are commonly coupled to a select gate line SGD(1). The same is true of string units SU(2) and SU(3).

Hereinafter, when select gate lines SGD (SGD(0), SGD(1), . . . ) are not distinguished from one another, they will be referred to as "select gate lines SGD".

The select gate lines SGD and the word lines WL are each independently controlled by the row decoder 120.

Drains of select transistors ST(1) of memory cell strings MS in the same column in the memory cell array 110 are commonly coupled to bit lines BL (BL(0) to BL(m), where m is a natural number equal to or greater than 1). That is, the bit lines BL commonly couple memory cell strings MS of different blocks BLK. In addition, sources of memory cells MC (15) are commonly coupled to the source line SL.

That is, each string unit SU includes a plurality of memory cell strings MS that are coupled to different bit lines BL and coupled to the same select gate line SGD. The block BLK includes a plurality of string units SU that share the word lines WL. The memory cell array 110 includes a plurality of blocks BLK that share the bit lines BL.

<1-1-5> Structure of Memory Cell Array 110

Hereinafter, an example of a structure of the memory cell array 110 according to the first embodiment will be described. In the drawings to which reference will be made below, an "X direction" refers to a direction in which the bit lines BL extend, a "Y direction" corresponds to a direction in which the word lines WL extend, and a "Z direction" corresponds to a direction vertical (orthogonal) to a surface of a semiconductor substrate 20 on which the memory cell array 110 is formed. In the drawings, structural elements such as insulating layers (interlayer insulating films), interconnects, contacts, etc. are omitted, where not necessary, for better viewability.

Figure 5:
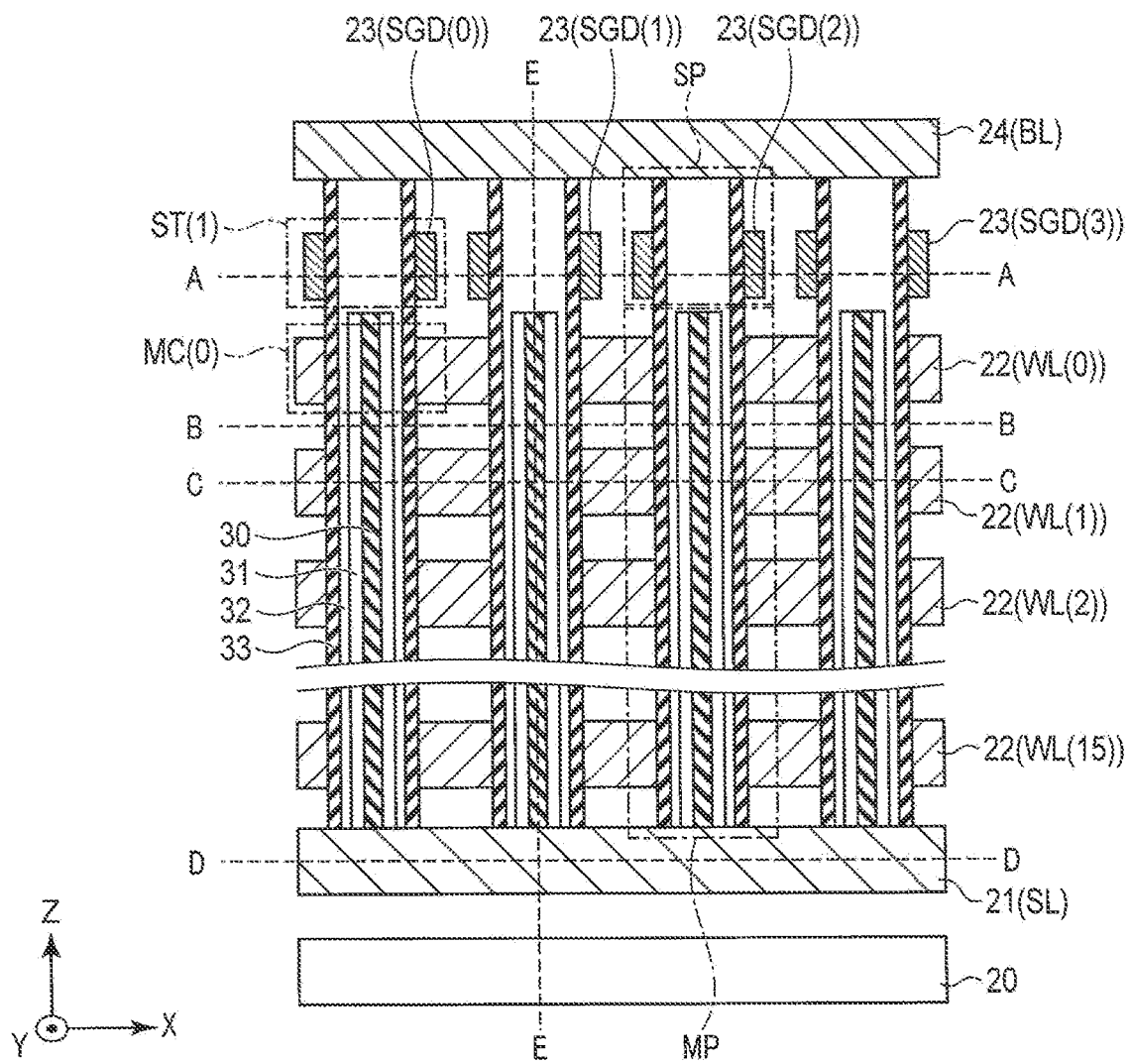
FIG. 5 is a cross-sectional view showing an example of a cross-sectional structure of the memory cell array included in the memory chip according to the first embodiment.

FIG. 5 shows an example of a cross-sectional structure of the memory cell array 110 included in the memory chip 100 according to the first embodiment. As shown in FIG. 5, the memory cell array 110 includes, for example, conductive layers 21 to 24. The conductive layers 21 to 24 are provided above the semiconductor substrate 20.

Specifically, a conductive layer (potential application electrode or voltage application electrode) 21 is provided above the semiconductor substrate 20, with an insulating layer interposed therebetween, as viewed in the Z direction. A circuit such as the sense amplifier 140 may be provided, for example, in the insulating layer between the semiconductor substrate 20 and the conductive layer 21. The conductive layer 21 is formed, for example, in a plate shape extending along an XY plane, and is used as a source line SL. The conductive layer 21 contains, for example, silicon (Si).

Insulating layers and conductive layers (potential application electrodes or voltage application electrodes) 22 are alternately stacked above the conductive layer 21 as viewed in the Z direction. The conductive layers 22 are formed, for example, in a plate shape extending along the XY plane. The stacked conductive layers 22 are respectively used as, in the order from the side of the semiconductor substrate 20, word lines WL(15) to WL(0). The conductive layers 22 contain, for example, tungsten (W).

A conductive layer (potential application electrode or voltage application electrode) 23, for example, is stacked above the topmost conductive layer 22 (WL(0)), with an insulating layer interposed therebetween, as viewed in the Z direction. The conductive layer 23 extends in the Y direction, and is divided into a plurality of conductive layers by select pillars SP (to be described later) in the X direction. The divided conductive layers 23 are respectively used as select gate lines SGD(0) to (3). The conductive layers 23 contain, for example, tungsten (W).

The conductive layers (potential application electrode or voltage application electrode) 24 are formed above the conductive layers 23 as viewed in the Z direction. The conductive layers 24 are formed, for example, in a line shape extending in the X direction, and are used as bit lines BL. The conductive layers 24 contain, for example, copper (Cu).

A memory pillar MP is in a columnar shape that extends in the Z direction, penetrates the conductive layers 22, and reaches, at its bottom portion, the conductive layer 21. The memory pillar MP includes, for example, a core member 30, a variable resistance layer 31, a semiconductor layer 32, and an insulating layer 33. Specifically, a memory hole MH that penetrates the stacked structure of the conductive layers 22 and insulating layers and reaches, at its bottom portion, the conductive layer 21 is provided. The memory hole MH is, for example, in a cylindrical form extending in the Z direction. Through the sequential formation of the insulating layer 33, the semiconductor layer 32, the variable resistance layer 31, and the core member 30 inside (on an inner wall of) the memory hole MH, a memory pillar MP is configured. Specifically, a memory pillar MP includes a cylindrical insulating layer 33 which covers the inner wall of the memory hole MH and extends in the Z direction, a cylindrical semiconductor layer 32 which covers an inner wall of the insulating layer 33 and extends in the Z direction, and a cylindrical or columnar-shaped variable resistance memory region 31 which covers an inner wall of the semiconductor layer 32 and extends in the Z direction.

A columnar-shaped select pillar SP that penetrates the conductive layers 23 is formed on the memory pillar MP. The select pillar SP includes, for example, the semiconductor layer 32 and the insulating layer 33. Specifically, the select pillar SP is configured by providing an SGD hole SH that penetrates the conductive layers 23 and reaches, at its bottom portion, the memory pillar MP, and sequentially forming an insulating layer 33 and a semiconductor layer 32 inside the SGD hole SH.

The layer including an interface between the memory hole MH and the SGD hole SH is included in a layer between the topmost conductive layer 22 and the conductive layers 23.

The core member 30 contains, for example, an insulator such as a silicon nitride (SiN). The core member 30 has, for example, a columnar shape that extends in the Z direction.

The variable resistance layer 31 covers a side surface (outer periphery) of the core member 30 (is in contact with the core member 30). The variable resistance layer 31 is, for example, formed in a cylindrical shape that extends in the Z direction. A bottom portion of the variable resistance layer 31 is, for example, in contact with the conductive layer 21.

The semiconductor layer 32 in the memory pillar MP covers a side surface (outer periphery) of the variable resistance layer 31 (is in contact with the variable resistance layer 31). The semiconductor layer 32 in the memory pillar MP is, for example, formed in a cylindrical shape extending in the Z direction. The bottom portion of the semiconductor layer 32 is, for example, in contact with the conductive layer 21.

The semiconductor layer 32 in the select pillar SP is, for example, in a columnar shape. The bottom of the semiconductor layer 32 of the select pillar SP is in contact with the semiconductor layer 32, the variable resistance layer 31, and the core member 30 of the memory pillar MP.

The insulating layer 33 covers a side surface of the semiconductor layer 32. The insulating layer 33 includes, for example, a portion that is formed in a cylindrical shape. The insulating layer 33 includes an insulator such as silicon oxide ($SiO_2$).

The conductive layer 22 covers part of a side surface of the insulating layer 33 in the memory pillar MP (namely, is in contact with the insulating layer 33).

The conductive layer 23 covers part of a side surface of the insulating layer 33 in the select pillar SP (namely, is in contact with the insulating layer 33).

Figure 6:
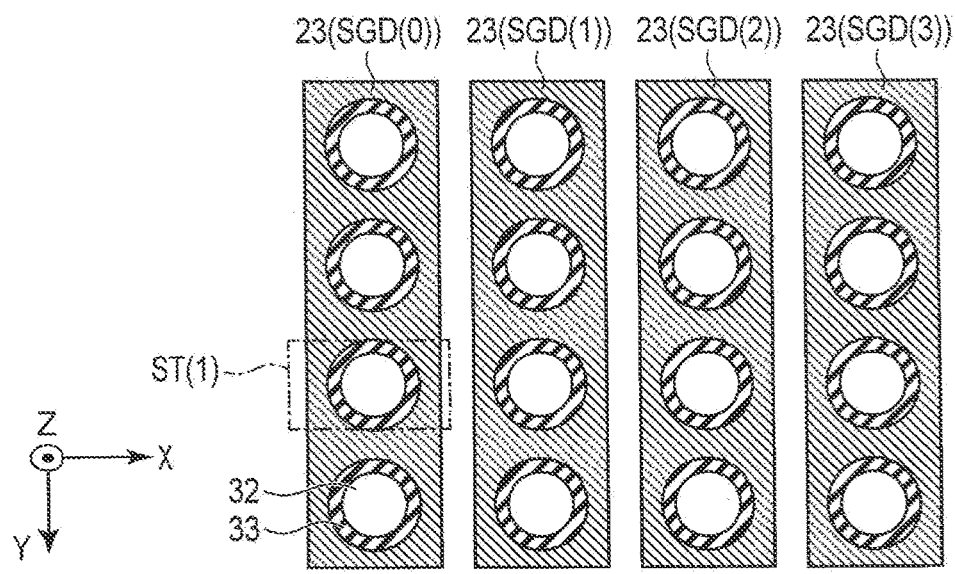
FIG. 6 is a plan view taken along line A-A of FIG. 5.

Next, a plan view of the conductive layers 23 with reference to FIG. 6 will be described. FIG. 6 is a plan view taken along line A-A of FIG. 5.

As shown in FIG. 6, an insulating layer 33 and a semiconductor layer 32 are formed in an SGD hole SH that penetrates the conductive layer 23. The conductive layers 23 function as select gate lines SGD(0) to SGD(3) of the select transistor ST(1), the insulating layer 33 functions as a gate insulating film of the select transistor ST(1), and the semiconductor layer 32 functions as a semiconductor layer of the select transistor ST(1). Through the use of the select transistor ST(1), it is possible to select a memory pillar MP for each word line WL. When the select transistor ST(1) is switched on, an inversion layer is formed in the semiconductor layer 32 that is in contact with the variable resistance layer 31 of the memory pillar MP, and the memory pillar MP can be selected by letting a current flow through the inversion layer.

Next, a plan view of portions between the memory cells MC in the Z direction will be described with reference to FIG. 7. FIG. 7 is a plan view taken along line B-B of FIG. 5. The core member 30, the variable resistance layer 31, the semiconductor layer 32, and the insulating layer 33 shown in FIG. 7 correspond to portions between the memory cells MC in the Z direction, and a current flows through the semiconductor layer 32.

Next, a plan view of the conductive layers 22 will be described with reference to FIGS. 8 and 9. FIG. 8 is a plan view taken along line C-C of FIG. 5. FIG. 9 is a plan view in which a single memory cell MC is shown.

As shown in FIG. 9, a memory cell MC is provided at an intersection between a plate-shaped word line WL and a memory pillar MP. Specifically, an insulating layer 33, a semiconductor layer 32, a variable resistance layer 31, and a core member 30 are provided in a memory hole MH that penetrates the conductive layers 22, as shown in FIG. 9. The conductive layer 22 functions as a word line WL of a selector SW of a memory cell MC, the insulating layer 33 functions as a gate insulating film of the selector SW of the memory cell MC, and the semiconductor layer 32 functions as a semiconductor layer of the selector SW of the memory cell MC. The variable resistance layer 31 functions as a memory element MR of the memory cell MC.

Next, a plan view of the conductive layer 21 will be described with reference to FIG. 10. FIG. 10 is a plan view taken along line D-D of FIG. 5.

The conductive layer 21 is in a plate shape, and is set to a constant low potential to let a current flow therethrough from the bit line BL. As shown in FIG. 10, the conductive layer 21 (source line SL) is in a plate shape, similarly to the conductive layer 22 (word line WL).

Figure 11:
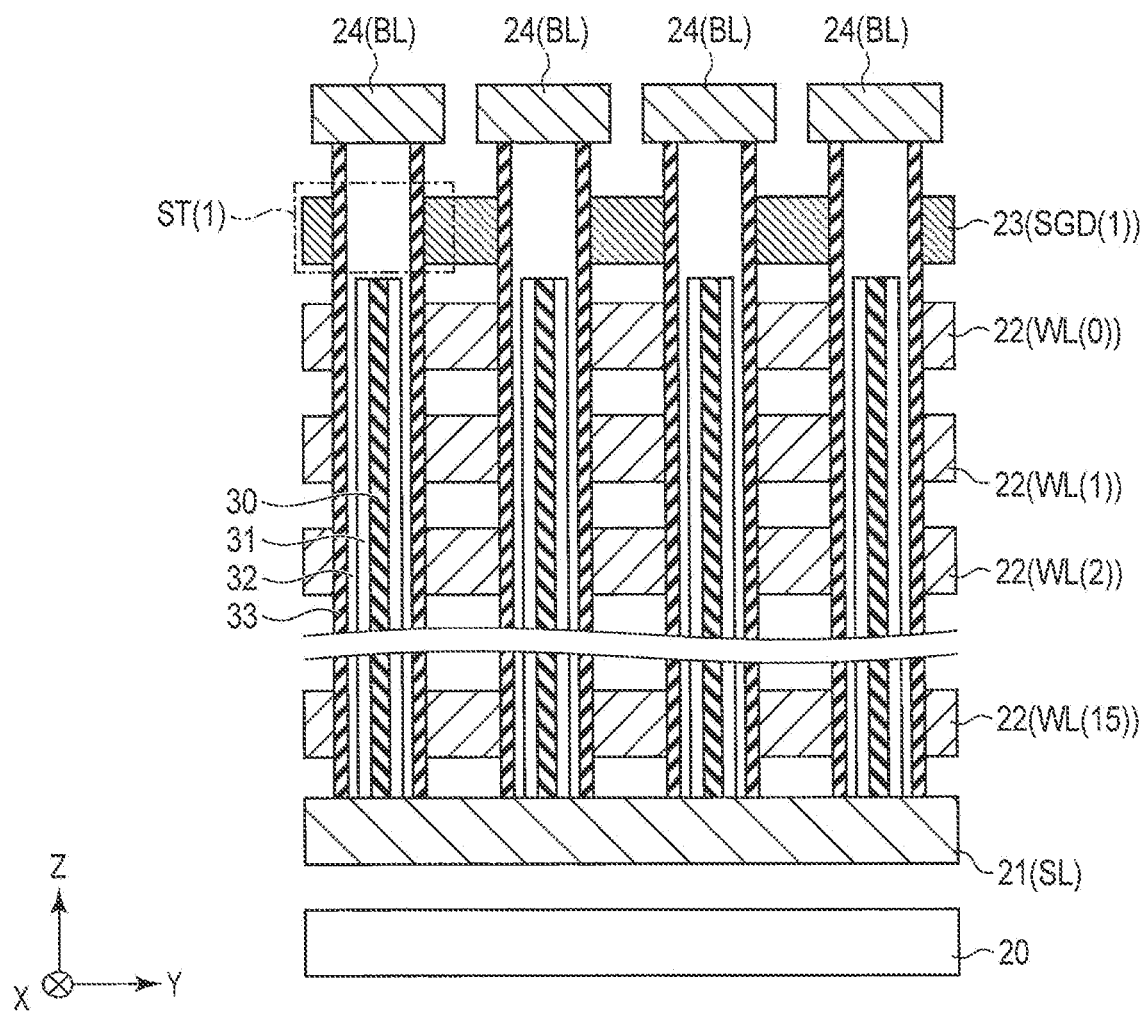
FIG. 11 is a cross-sectional view of the memory cell array in a direction orthogonal to the cross section shown in FIG. 5.

Next, an example of a cross-sectional structure of the memory cell array 110 will be described with reference to FIG. 11. FIG. 11 is a cross-sectional view taken along line E-E of FIG. 5. FIG. 11 shows a cross section cut in a direction orthogonal to the cross section shown in FIG. 5. Referring to FIGS. 5 and 11 in combination, it can be seen that the memory pillar MP is in a concentric shape about the core member 30.

<1-2> Operation

<1-2-1> Overview

Next, an overview of an operation of the memory chip 100 according to the present embodiment will be described.

Read and write operations in the memory chip 100 according to the present embodiment are performed by letting a current flow between the bit line BL and the source line SL.

Figure 12:
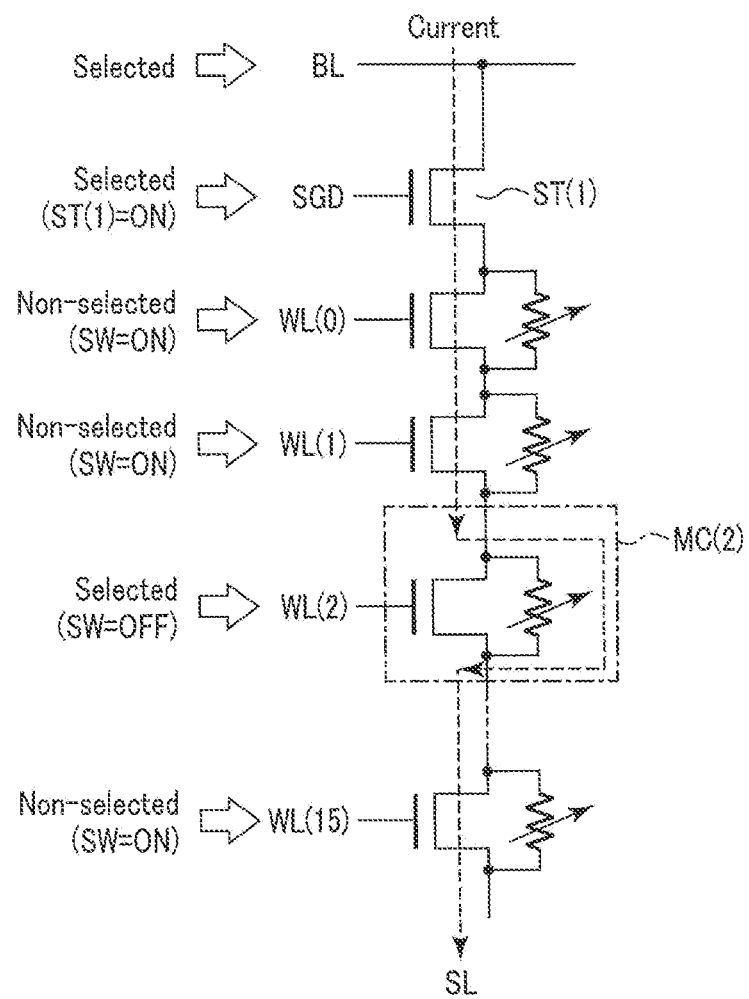
FIG. 12 is a circuit diagram in which a single memory cell string in the memory cell array included in the memory chip according to the first embodiment is extracted.

A brief description will be given of a method of selecting a memory cell MC with reference to FIGS. 12 and 13. FIG. 12 is a circuit diagram in which a single memory cell string MS is extracted. FIG. 13 is a cross-sectional view in which a memory pillar MP corresponding to a single memory cell string MS is extracted.

As shown in FIGS. 12 and 13, a predetermined voltage (positive voltage) is applied to a select gate line SGD of a select transistor ST(1) that is in contact with a memory pillar MP to which a memory cell MC (e.g., MC(2)) to be selected belongs. Thereby, an inversion layer is formed in the semiconductor layer 32 of the select transistor ST(1), allowing a current to flow therethrough (the on state). This causes the bit line BL, the select transistor ST(1), and the semiconductor layer 32 of the memory pillar MP that is in contact with the select transistor ST(1) to be brought into conduction. Also, for example 0 [V] or a voltage VSS is applied to a word line WL(2) corresponding to the selected memory cell MC(2), and a predetermined voltage (positive voltage) is applied to word lines WL(0), (1), and (3) to (15) corresponding to the non-selected memory cells MC. Thereby, a current path between the bit line BL and the source line SL flows through a memory element MR in the memory cell MC(2) to be selected, and flows through the semiconductor layer 32 of selectors SW in the non-selected memory cells MC(0), (1) and (3) to (15). Since the core member 30, which is an insulating layer, is provided at a central portion of the memory pillar MP, as shown in FIG. 13, a current flows through the variable resistance layer 31 that surrounds the core member 30 in the selected memory cell MC. Examples of the material of the variable resistance layer 31 include an alloy-based phase-change memory ($Ge_2Sb_2Te_5$).

With above-described configuration, it is possible to select the variable resistance layer 31 both in a read operation and a write operation. When the present scheme is compared with a three-dimensional NAND-type flash memory, it has the advantages that it can operate, at a lower voltage and at a higher speed, that there are less restrictions on the number of times of rewriting, and that the writing time is shorter.

The present embodiment relates to a variable resistance memory in which an erase operation does not exist, unlike a three-dimensional NAND flash memory.

Also, a write operation or a read operation is performed by letting a current flow between a bit line BL and a source line SL by turning on the select transistor ST(1). This eliminates the necessity to select all the memory cell strings MS, allowing selection to be performed for any bit line BL (column) that is coupled to a single select gate line.

To prevent a write operation or a read operation from being performed in a certain memory cell string MS, the voltage of the source line SL should be set to be equal to the voltage of the bit line BL; in this case, a write operation or a read operation will not be performed.

In addition, unlike a three-dimensional NAND flash memory, an erase operation need not be performed in units of blocks BLK, and a write operation can be set/reset in units of select transistors ST(1).

A word line WL functions to select a memory cell MC in the stacking direction (Z direction). A word line WL may be shared among gate electrodes of a plurality of memory cells MC along the same XY plane. Similarly, a source line SL may be shared among a plurality of memory cell strings MS. In particular, a word line WL and a source line SL may be shared among a plurality of memory cell strings MS that are adjacent to each other in the bit line BL extending direction (the X direction).

Let us assume, for example, that the word line WL and the source line SL are in a plate shape extending in both the bit line BL extending direction (the X direction) and the word line WL extending direction (the Y direction). Selection of the memory cell MC need to be performed by switching the select transistor ST(1) to the on state and then letting a current flow from the bit line BL to the source line SL. Accordingly, even if a common voltage is supplied to a plurality of memory cell strings MS through the plate-shaped word line WL and the plate-shaped source line SL, only the memory cell MC whose control gate is coupled to the selected word line WL, which is directly below the selected select transistor ST(1) and directly below the selected bit line BL is selected.

As described above, selection of the memory cell MC is performed by letting a current flow via the bit line BL. Accordingly, the sequencer 170 is configured to output a control signal in such a manner, for example, that a read operation and a write operation are simultaneously performed for each bit line BL. The sequencer 170 is also capable of outputting a control signal in such a manner that a reset write operation and a set write operation are simultaneously performed for each bit line BL.

<1-2-2> Operate Waveforms

As described above, in the memory chip 100 according to the present embodiment, a voltage that causes the selector SW of the selected memory cell MC to be turned off and causes the selector SW of the non-selected memory cell MC to be turned on is applied to the word line WL. Subsequently, the memory chip 100 applies a voltage that causes the select transistor ST to be turned on to the select gate line SGD, thus bringing the bit line BL and the memory pillar MP to which the selected memory cell MC belongs into conduction. In this manner, a current flows through a semiconductor layer of a selector SW in a non-selected memory cell MC, and flows through a memory element MR in a selected memory cell MC.

Figure 14:
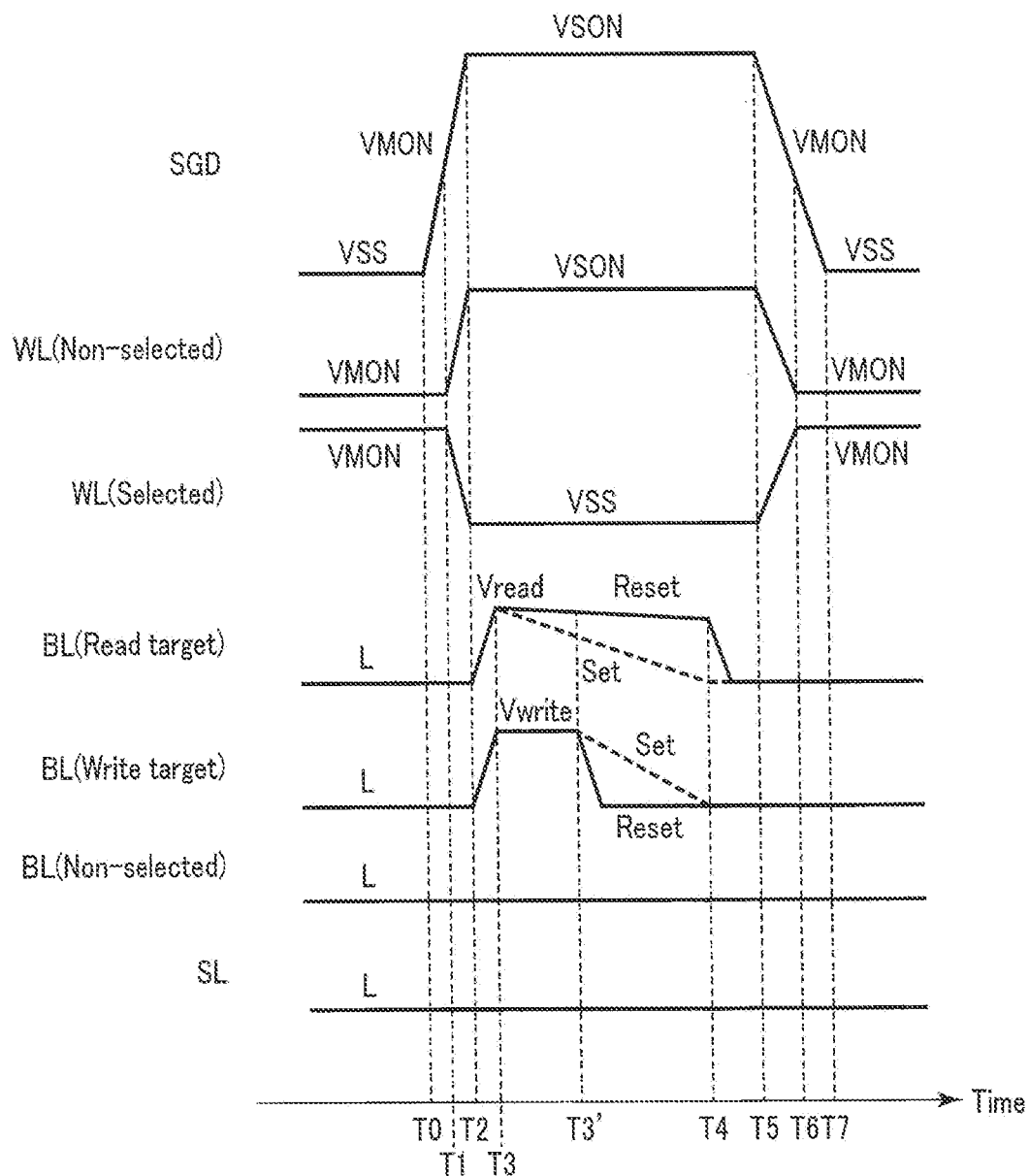
FIG. 14 is a timing chart of an operation waveform in the memory chip according to the first embodiment.

A description will be given of an operation waveform of the memory chip 100 according to the present embodiment, with reference to FIG. 14. FIG. 14 shows a timing chart of an operation waveform.

First, a read operation will be described. At time T0, the sequencer 170 maintains the voltage of the bit line BL (bit line voltage) and the voltage of the source line SL (source line voltage) at a low ("L") level, maintains the voltages of the word lines WL at VMON, and increases the voltage of the select gate line SGD from VSS (VSS>VMON) to VSON (VSS>VMON>VSON). The L-level voltage may be, for example, the voltage VSS. In the example of FIG. 14, before time T0, the voltage of the bit line BL and the voltage of the source line SL are set to the L level, the voltages of the word lines WL are set to VMON, and the voltage of the select gate line SGD is set to VSS, in advance. The voltages are not limited to those mentioned above; for example, upon application of the voltage VMON to the word lines WL and the voltage VSS to the select gate line SGD at time T0, the voltage of the select gate line SGD may be increased from VSS to VSON. The voltage VSS is a voltage that turns off the selector SW of the memory cell MC or the select transistor ST. In other words, the voltage VSS can stop transmission of the voltage in the bit line BL. The voltage VMON is a voltage at a level that can form a channel in the semiconductor layer 32 of the selector SW in the memory cell MC or the select transistor ST (that can strongly invert the semiconductor layer 32). For example, the voltage VMON is higher than a sum of a source voltage of a selector SW farthest from the source line SL and a threshold voltage of the selector SW when the selector SW is selected. In other word, the voltage VMON is a voltage that strongly inverts all the memory cells MC in the memory cell storing MS, when a source voltage is applied to the source line SL. The voltage VSON is a voltage at a level that can form a channel in the semiconductor layer 32 of the selector SW in the memory cell MC or the select transistor ST (that can strongly invert the semiconductor layer 32) In addition, the voltage VSON is a voltage at a level that allows the selector SW in the memory cell MC or the selector ST to fully transmit a bit line voltage. In other word, the voltage VSON is a voltage that strongly inverts the select transistor and all the memory cells MC in the memory cell storing MS, when a source voltage is applied to the source line SL. In addition, the voltage VSON is higher than the voltage applied to the bit line plus the threshold voltage of the selector SW. The voltage VMON is between the voltage VSS and the voltage VSON. For example, the voltage VSS is 0 V, the voltage VMON is 2 V, and the voltage VSON is 4 V. In the description below, a case is explained in which the same voltage VSON is applied to the word lines WL and the select gate line SGD (and a select gate line SGS to be described later). However, the voltage VSON applied to the word lines WL and the voltage VSON applied to the select gate line SGD (and the select gate line SGS) may be the same or different. In other words, the voltage at a level such that the selector SW of the memory cell MC can sufficiently transmit the bit line voltage may be the same as or different from the voltage at a level such that the select transistor ST can sufficiently transmit the bit line voltage.

At time T0, the selectors SW in all memory cells MC are in the on state.

At time T1, the voltage of the select gate line SGD becomes VMON. At this time, the select transistor ST(1) turns on, so that the bit line BL and the memory string MS are electrically coupled.

At least at time T1 when the voltage of the select gate line SGD has been increased to VMON, namely, at the same time as or after the voltage of the select gate line SGD is increased to VMON, the sequencer 170 increases the voltages of the non-selected word lines WL from VMON to VSON, and decreases the voltage of the select gate line WL from VMON to VSS.

At time T2, the voltage of the select gate line SGD and the voltages of the non-selected word lines WL become VSON, and the voltage of the selected word line WL becomes VSS. Accordingly, from time T2 to T4, the selector SW of the non-selected memory cell MC of the memory cells MC of the selected memory cell string MS is in the on state, and the selector SW of the selected memory cell MC is in the off state.

In a period from time T2 to time T3, the sequencer 170 increases the voltage of the selected bit line BL from the L level to a read voltage Vread. The voltage Vread is higher than the L level voltage (for example, the voltage VSS).

At time T3, the sequencer 170 applies the read voltage Vread to the bit line BL, and then brings the bit line BL to a floating state. Accordingly, the voltage of the bit line BL is gradually decreased (the voltage is substantially maintained until time T4) when the memory element MR of the selected memory cell MC is in the high-resistance (reset) state, and the voltage of the bit line BL is rapidly decreased when the memory cell element MR is in the low-resistance (set) state. As a sense operation, after a predetermined period of time has passed after the read voltage Vread is applied to the bit line BL at time T3, for example at time T4, the sense amplifier 140 senses the H level or L level by comparing the voltage of the bit line BL with a reference potential. The reference potential is set to satisfy the relationship Vread≥Bit line voltage (reset)>Reference voltage>Bit line voltage (set).

At time T5, the sequencer 170 decreases the voltage of the select gate line SGD from VSON to VSS, decreases the voltages of the non-selected word lines WL from VSON to VMON, and increases the voltage of the selected word line WL from VSS to VMON.

At time T6, the voltages of the select gate line SGD and the word lines WL become VMON. The selectors SW of all of the memory cells MC are turned on.

At time T7, the voltage of the select gate line SGD becomes VSS. As a result, the select transistor ST(1) is turned off.

Next, a write operation will be described below. The operation waveforms of the select gate line SGD, the word line WL, and the source line SL are the same in both the read operation and the write operation. On the other hand, the operation waveforms of the bit line BL are different between the read operation and the write operation. Hereinafter, the explanation will focus mainly on the matters which differ from the read operation, namely, the voltage of the bit line.

In the write operation, in a period from time T2 to time T3, the sequencer 170 increases the voltage of the bit line BL from the L level to the voltage Vwrite. The voltage Vwrite is a pulse voltage for writing, and is higher than the L level voltage (for example, the voltage VSS). For example, the voltage Vwrite is higher than the voltage Vread. In a period from time T3 to time T3', the sequencer 170 applies a pulse of the voltage Vwrite to the bit line BL.

For example, in a period from time T3' to time T4, when the voltage of the bit line BL is rapidly decreased from Vwrite to the L level, the memory element MR turns to a high-resistance reset state. In the period from time T3' to time T4, when the voltage of the bit line BL is gradually decreased from Vwrite to the L level, the memory element MR turns to a low-resistance set state. In a period from time T3 to time T4, namely in the write period, it is important to keep the voltage of the non-selected bit line BL equal to the voltage of the source line SL (for example, at the L level). A memory cell MC is selected by application of a voltage to a bit line BL. If the potential of a non-selected bit line BL is increased, the selection would be erroneous, resulting in erroneous writing. It suffices that a voltage is selectively applied to the bit line BL to be read or written.

<1-3> Advantages

According to the above-described embodiment, the memory chip 100 is configured in such a manner that a memory element capable of setting a data value of one or more bits according to a resistance value is disposed at the center of a memory pillar MP, with the periphery of the memory element covered with a semiconductor layer, and the periphery thereof further covered with an insulating layer and a word line WL, and the memory element is, at its upper end, coupled to a bit line BL via a select transistor ST, and is, at its lower end, coupled to a source line without intervention of a select transistor ST.

Bit-cost scalable (BiCS™) flash memories have been proposed and commercialized as non-volatile memories (three-dimensional NAND flash memories) in which memory cells MC are perpendicularly stacked on a semiconductor substrate for high integration. In such a three-dimensional NAND flash memory, NAND flash memories with a planar structure (two-dimensional NAND flash memories) are three-dimensionally arranged. Similarly to a two-dimensional NAND flash memory, a three-dimensional NAND flash memory has problems such as the constraints on the number of times of rewriting and the length of time required for programming.

Memory cells MC of a three-dimensional NAND flash memory contain silicon and an oxide-nitride-oxide (ONO) film. In a three-dimensional NAND flash memory, when a voltage is applied to a word line WL, electrons are trapped in SiN, corresponding to "N" of the ONO film of the memory cell MC via the silicon of the memory cell MC. Thereby, the threshold value of the memory cell MC is shifted, and information is stored in the memory cell MC.

On the other hand, in the embodiment described above, a channel (semiconductor layer 32) of a selector SW (transistor) is formed so as to cover a pillar of a memory element MR. Selection of a memory cell MC is performed by applying a voltage corresponding to selection or non-selection to a word line WL, and applying the voltage to a selected bit line BL.

When the selector SW of the selected memory cell MC is turned off and the selector SW of the non-selected memory cell MC is turned on, a current flows through the memory element MR in the selected memory cell MC, and a current flows through the semiconductor layer 32 in the non-selected memory cell MC.

In the embodiment described above, to read information stored in the selected memory cell MC, the memory chip 100 sets the voltage of the select gate line SGD to VSS and the voltages of the word lines WL to VMON as an initial state. The memory chip 100 then increases the voltage of the select gate line from VSS to VSON. After the voltage of the select gate line SGD is increased to at least VMON, the memory chip 100 decreases the voltage of the selected word line WL from VMON to VSS and the voltages of the non-selected word lines WL from VMON to VSON. As a result, in the read operation and the write operation, a disturbance in the memory string MS can be suppressed. Accordingly, the reliability of the memory device can be improved.

Furthermore, in the embodiment described above, the memory chip 100 decreases the voltage of the select gate line SGD from VSON to VSS, increases the voltage of the selected word line WL from VSS to VMON, and decreases the voltages of the non-selected word lines WL from VSON to VMON. As a result, in the read operation and the write operation, a disturbance in the memory string MS can be suppressed.

Figure 15:
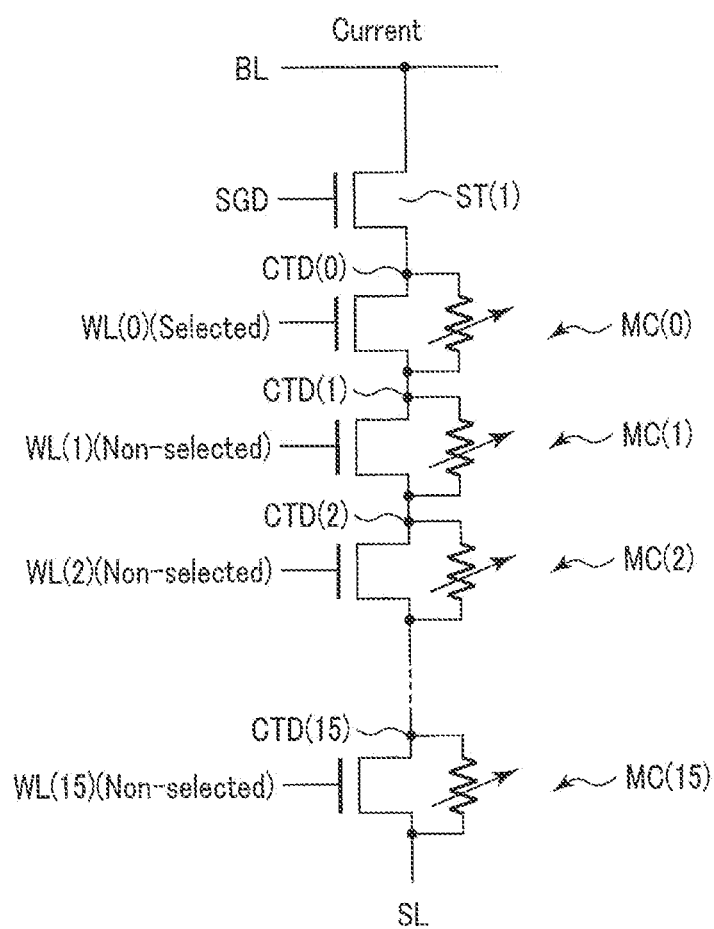
FIG. 15 is a circuit diagram in which a single memory cell string in the memory cell array included in the memory chip according to the first embodiment is extracted.
Figure 16:
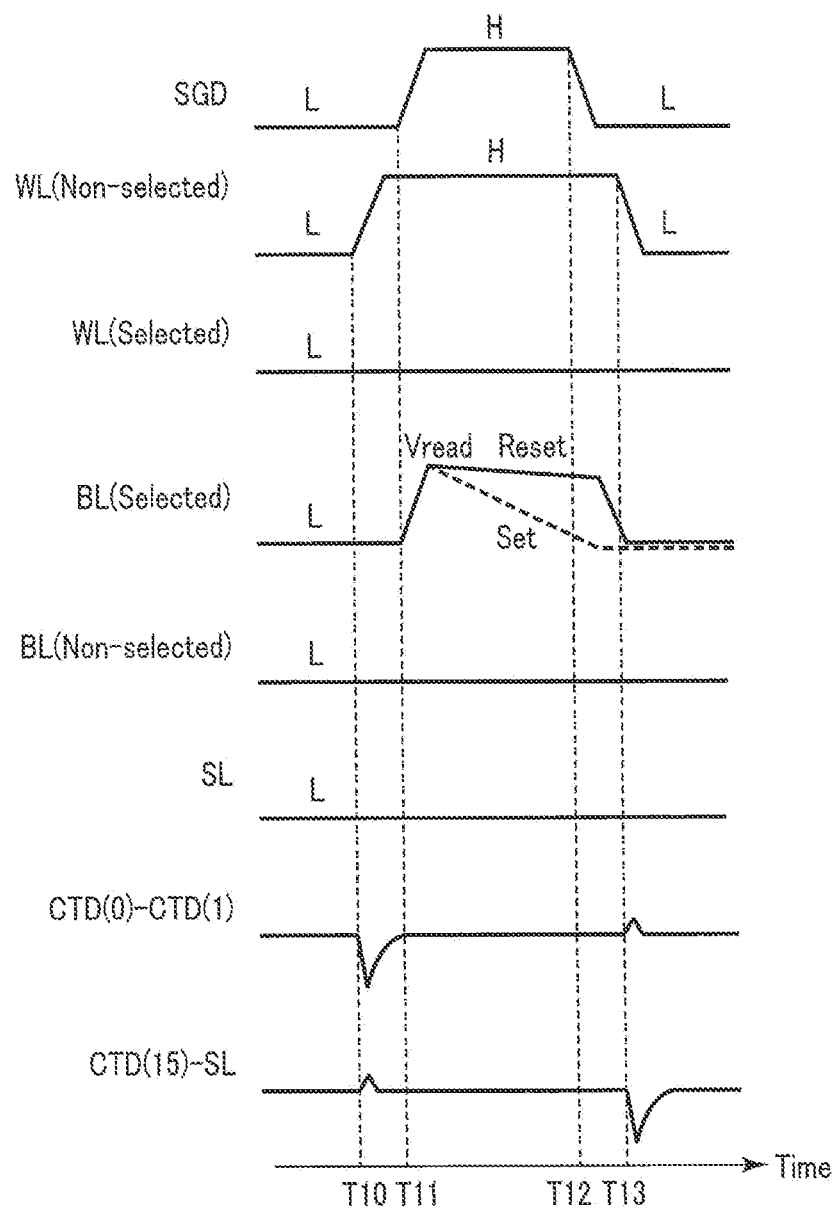
FIG. 16 is a timing chart showing a read operation waveform in a comparative example.

To explain a disturbance in the memory string MS, a comparative example will be described with reference to FIGS. 15 and 16. FIG. 15 is a circuit diagram in which a single memory cell string MS is extracted. In the example of FIG. 15, the memory cell MC(0) is selected. FIG. 16 shows a timing chart of a read operation waveform in a comparative example. The example of FIG. 16 shows a potential difference between a node CTD(0) and a node CTD(1), and a potential difference between a node CTD(15) and a source line SL.

In FIG. 15, the node between the select transistor ST(1) and the memory cell MC(0) is labeled as CTD(0). The node between the memory cell MC(0) and the memory cell MC(1) is labeled as CTD(1). Similarly, the node between the memory cell MC (n−1) and the memory cell MC(n) is labeled as CTD(n).

When the voltage of the bit line BL is transferred to the memory cell string MS, a disturbance may occur in the memory cell string MS.

Referring to FIG. 16, for example, at time T10, the voltages of the non-selected word lines WL are increased from the L level (for example, the voltage VSS) to the H level (for example, the voltage VSON). Thereafter, at time T11, the voltage of the select gate line SGD is increased from the L level to the H level. As shown in FIG. 15, for example, if the memory cell MC(0) is selected, the amount of change in the potential at the node CTD(0) due to a coupling capacitance between the node and a word line WL is smaller (the range of increase in voltage is smaller) than at the other nodes CTD(1) to CTD(15), since the word line WL0 is at the L level. On the other hand, for example, the potential at the node CTD(1) increases relatively greatly due to a coupling capacitance between a word line WL1 and the node. Therefore, a potential difference occurs between the node CTD(0) and the node CTD(1) (CTD(0)-CTD(1)), which may result in a large disturbance due to the potential difference between the node CTD(0) and the node CTD(1).

In the example of FIG. 16, furthermore, at time T12, the voltage of the select gate line SGD is decreased from the H level to the L level. Thereafter, at time T13, the voltages of the non-selected word lines WL are decreased from the H level to the L level. At this time, the potentials of the nodes CTD(0) to CTD(15) are decreased comparatively greatly due to a coupling capacitance between the node and the corresponding word line WL. On the other hand, the potential of the source line SL does not change. Therefore, the potential difference between the node CTD(15) and the source line SL (CTD(15)-SL) is greater than the potential difference between the other nodes CTD. For example, since the potential at the node CTD(15) is lowered, CTD(15)-SL changes to a negative voltage side. As a result, a relatively large disturbance may occur due to the potential difference between the node CTD(15) and the source line SL.

FIG. 16 shows an operation waveform in a read operation. As described above with reference to FIG. 14, the operation waveform of the select gate line SGD, the word line WL, and the source line SL are the same in both the read operation and the write operation. Therefore, a relatively large disturbance may also occur in the write operation similarly to the case of the read operation. The voltage at the bit line BL in the write operation is the same as that shown in FIG. 14. More specifically, a pulse of the voltage Vwrite is applied to the bit line BL in a period of T11 to T12. Thereafter, the voltage at the bit line BL is decreased from Vwrite to the L level. At this time, when the voltage of the bit line BL is rapidly decreased from Vwrite to the L level, the memory element MR turns to a high-resistance reset state. When the voltage of the bit line BL is gradually decreased from Vwrite to the L level, the memory element MR turns to a low-resistance set state.

Advantages of the present embodiment will now be described. As shown in FIG. 14, in the present embodiment, the selectors SW of all memory cells MC in the memory cell string MS relating to the selected memory cell MC are in the on state. Before the voltages of the word lines WL are changed, the voltage of the select gate line SGD is increased from VSS (time T0 to T1). Then, the voltage of the select gate line SGD is increased to at least VMON, and the select transistor ST(1) is turned on. After the node CTD(0) and the bit line BL are electrically coupled, the voltage of the selected word line WL is decreased to VSS and the voltages of the non-selected word lines WL are increased to VSON. Accordingly, before the selector SW of the selected memory cell MC(0) is turned off, the node CTD(1), the node CTD(0), and the bit line BL are electrically coupled. Therefore, the increase in the potential due to a coupling between the node CTD(0) and the node CTD(1) as in the case of the comparative example can be suppressed. As a result, the potential difference between the node CTD(0) and the node CTD(1) can be suppressed, so that a disturbance can be suppressed.

Furthermore, according to the present embodiment, when the voltage of the select gate line SGD is increased, the voltage of the selected word line WL is increased and the voltages of the non-selected word lines WL are decreased. Due to this operation, for most of the period while the potential of each word line WL is changing, the potential difference between the nodes can be suppressed by maintaining conduction between the nodes CTD, between the node CTD(0) and the bit line BL, and between the node CTD(15) and the source line SL. As a result, a disturbance that occurs in the comparative example can be suppressed in the present embodiment.

<1-4> First Modification

Figure 17:
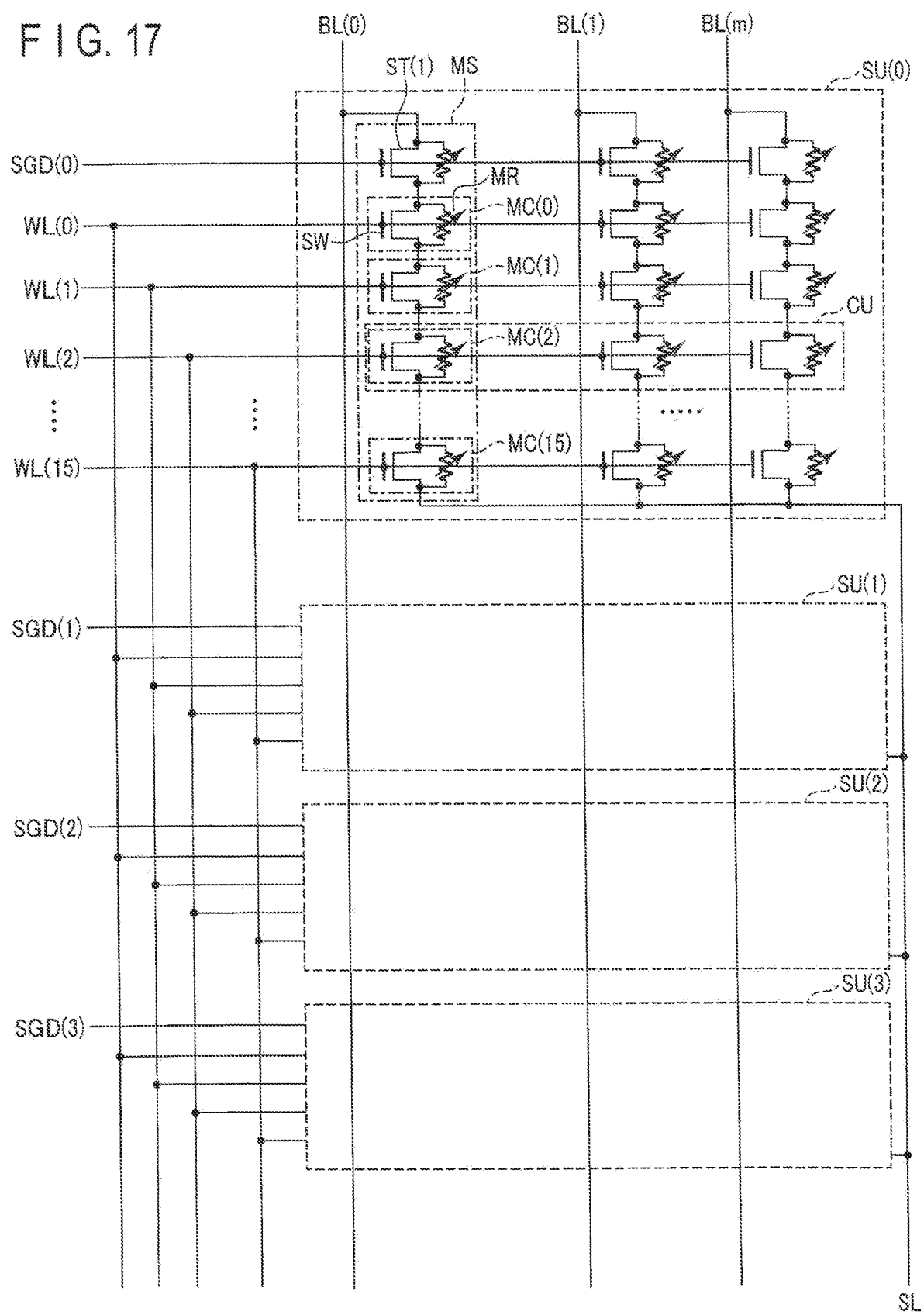
FIG. 17 is a circuit diagram showing a circuit (equivalent circuit) of a memory cell array included in the memory chip according to a first modification of the first embodiment.
Figure 18:
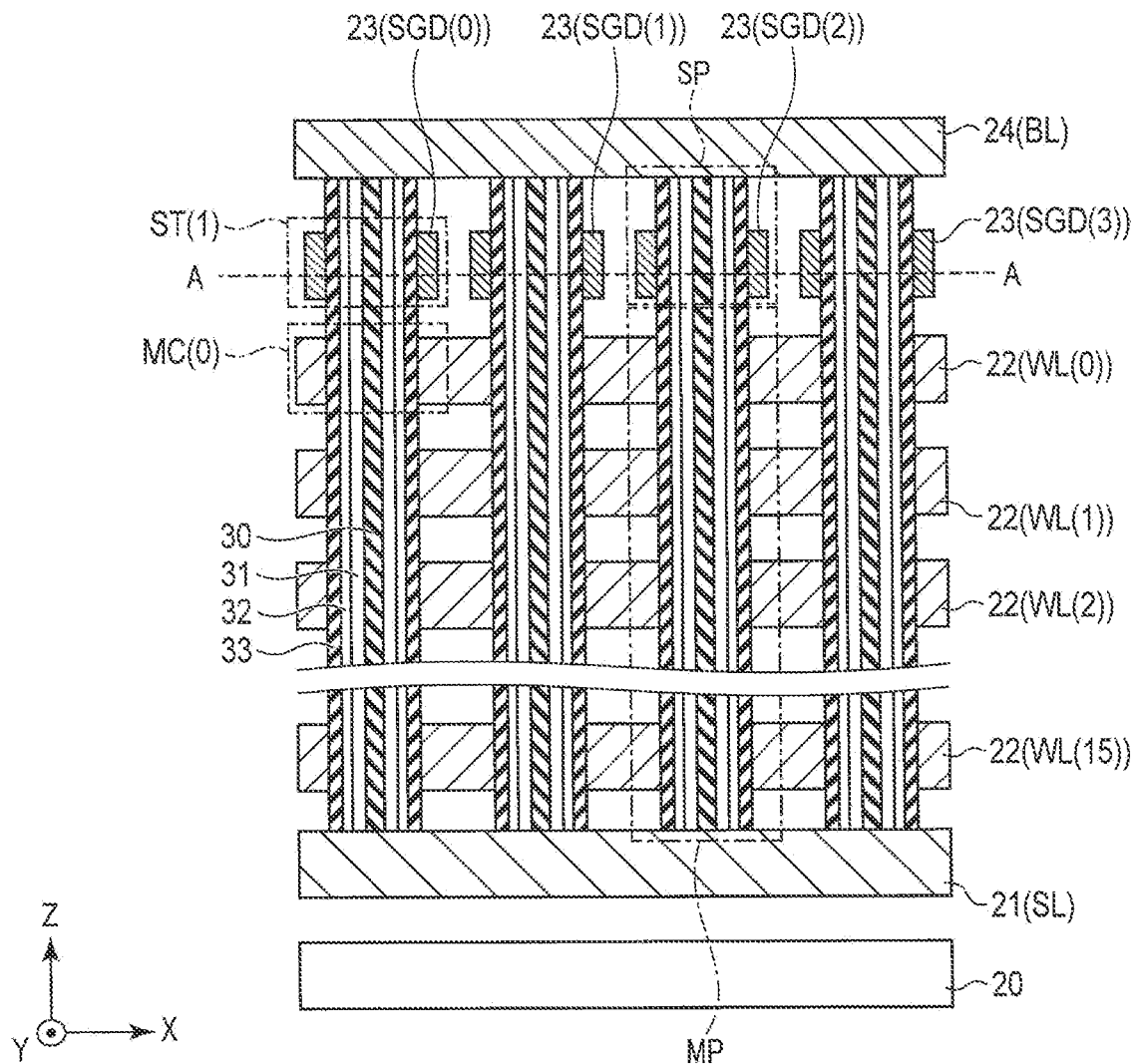
FIG. 18 is a cross-sectional view showing an example of a cross-sectional structure of the memory cell array included in the memory chip according to the first modification of the first embodiment.
Figure 19:
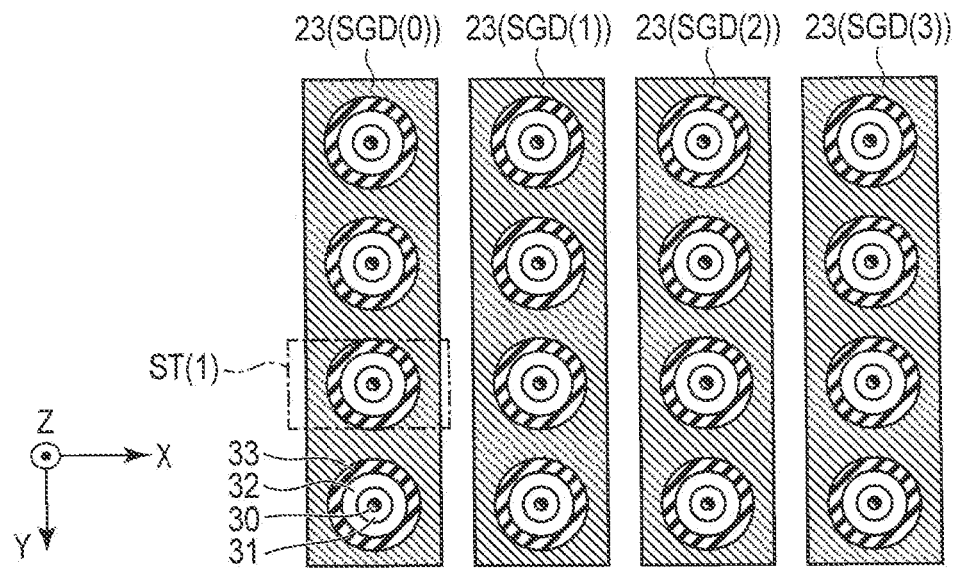
FIG. 19 is a plan view taken along line A-A of FIG. 18.
Figure 20:
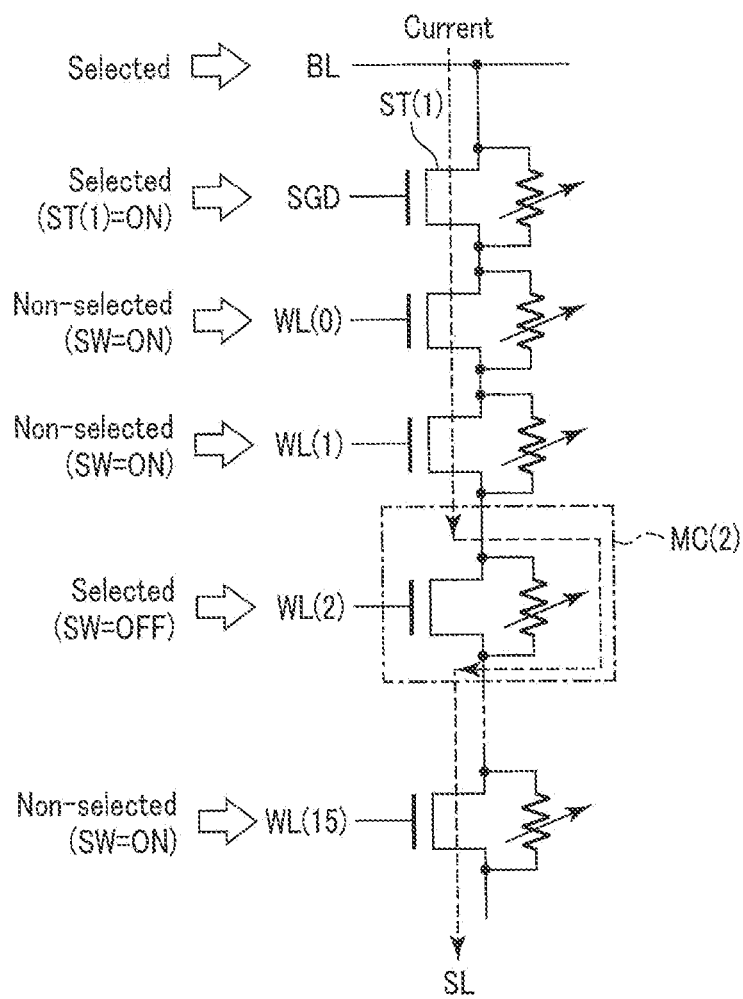
FIG. 20 is a circuit diagram in which a single memory cell string in the memory cell array included in the memory chip according to the first modification of the first embodiment is extracted.

A first modification of the first embodiment will be described with reference to FIGS. 17 to 20. FIG. 17 shows a circuit configuration of a memory cell array 310 according to the first modification of the first embodiment. FIG. 18 shows an example of a cross-sectional structure of the memory cell array 110 included in the memory chip 100 according to the first modification of the first embodiment. FIG. 19 is a plan view taken along line A-A of FIG. 18. FIG. 20 is a circuit diagram in which a single memory cell string MS of the memory cell array 110 is extracted.

As shown in FIG. 17, a memory element MR coupled in parallel with the select transistor ST(1) may be provided. The configuration in which the select transistor ST(1) and the memory element MR are coupled in parallel may be the same as the configuration of the memory cell MC. More specifically, for example, as shown in FIGS. 18 and 19, a core member 30 and a variable resistance layer 31 may be provided in the region of a memory pillar MP corresponding to the first select transistor ST(1). In other words, the core member 30 and the variable resistance layer 31 may be provided so that the upper ends of the core member 30 and the variable resistance layer 31 are located (on the side of the bit line) above the conductive layer 23 (the select gate line SGD). The other configuration is similar to that of the first embodiment.

Next, an overview of the operation will be described.

As shown in FIG. 20, in the same manner as described above with reference to FIG. 12, a predetermined voltage (positive voltage) is applied to a select gate line SGI) of a select transistor ST(1) that is in contact with a memory pillar MP to which a memory cell MC (e.g., MC(2)) to be selected belongs. Thereby, an inversion layer is formed in the semiconductor layer 32 of the select transistor ST(1), allowing a current to flow therethrough (the on state). This causes the bit line BL, the select transistor ST(1), and the semiconductor layer 32 of the memory pillar MP that is in contact with the select transistor ST(1) to be brought into conduction. Also, for example 0 [V] or a voltage VSS is applied to a word line WL(2) corresponding to the selected memory cell MC(2), and a predetermined voltage (positive voltage) is applied to word lines WL(0), (1), and (3) to (15) corresponding to the non-selected memory cells MC. Thereby, a current path between the bit line BL and the source line SL flows through a memory element MR in the memory cell MC(2) to be selected, and flows through the semiconductor layer 32 of selectors SW in the non-selected memory cells MC(0), (1) and (3) to (15).

The configuration of the present modification can attain the same advantages as those of the first embodiment.

<2> Second Embodiment

<2-1> Overview

Next, the second embodiment will be described. In the first embodiment described above, a conductive layer is disposed as a source line SL in parallel with a semiconductor substrate. However, in the second embodiment, a semiconductor layer (P-well region) functions as a conductive layer corresponding to the source line SL, and a select transistor ST(2) is provided between the source line SL and a memory cell. Hereinafter, differences from the first embodiment will be mainly explained.

<2-2> Circuit Configuration of Memory Cell Array 110

A circuit configuration (equivalent circuit) of a memory cell array 110 according to the second embodiment will be described with reference to FIG. 21.

Figure 21:
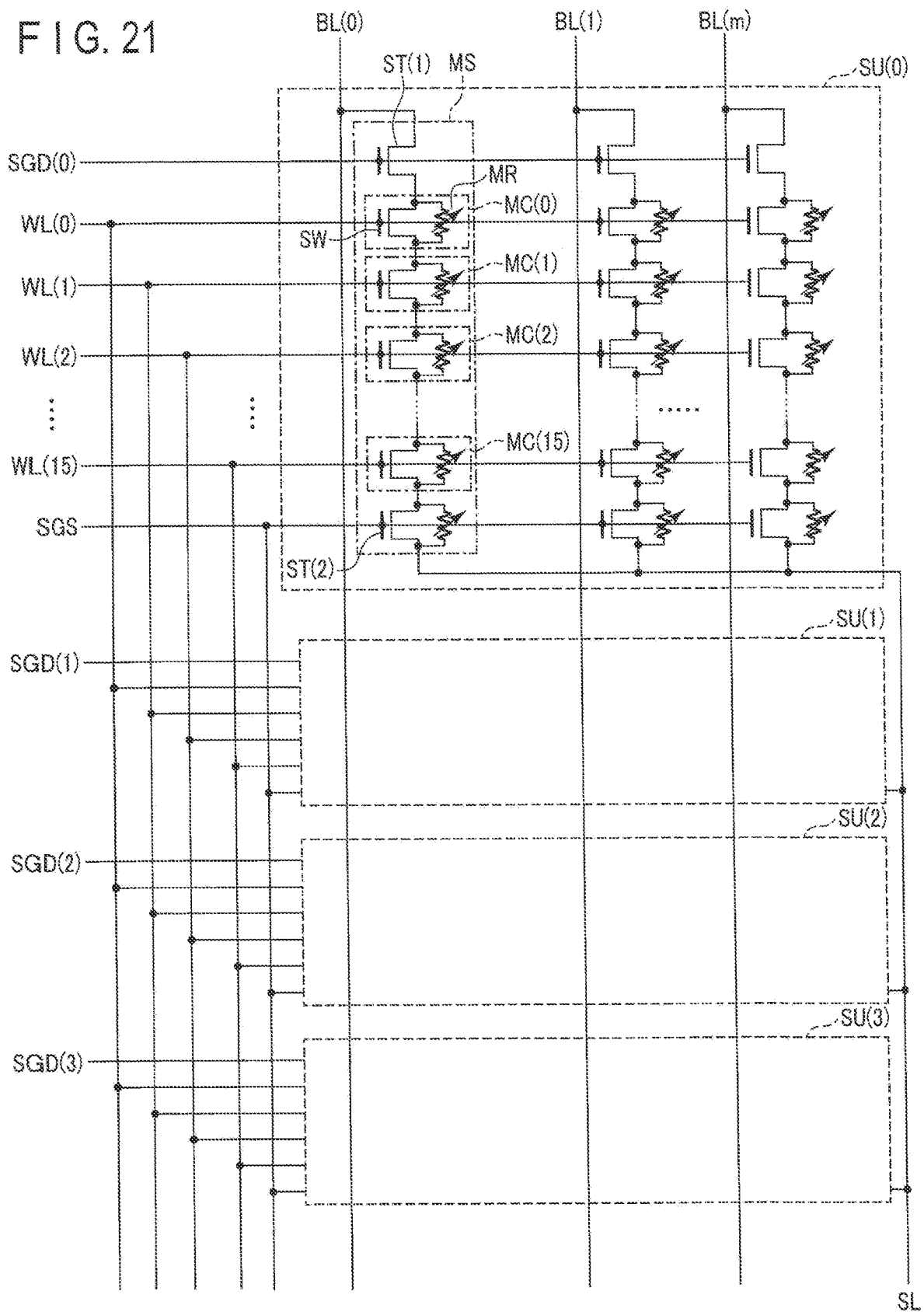
FIG. 21 is a circuit diagram showing a circuit (equivalent circuit) of a memory cell array included in a memory chip according to a second embodiment.

As shown in FIG. 21, in comparison with the circuit shown in FIG. 2, each of a plurality of memory cell strings MS further includes, for example, a select transistor ST(2) in which memory elements MR are coupled in parallel, in addition to 16 memory cells MC (MC(0) to MC(15)) and a select transistor ST(1). The configuration in which the select transistor ST(2) and the memory element MR are coupled in parallel may be the same as the configuration of the memory cell MC. In the description below, when the memory element MR coupled in parallel with the select transistor ST(2) is not specified, an explanation thereof will be omitted.

The memory cells MC(0) to MC(15) included in each memory string MS are coupled in series between the select transistor ST(1) and the select transistor ST(2) (and between the select transistor ST(2) and the memory element MR coupled in parallel).

Gates of select transistors ST(2) in each block BLK are coupled in common to a select gate line SGS. The select gate line SGS may be provided for each string unit SU.

Hereinafter, when select gate lines SGD (SGD(0), SGD (1), . . . ) are not distinguished from one another, they will be referred to as "select gate lines SGD".

The select gate lines SGD and SGS and the word lines WL are each independently controlled by the row decoder 120.

Drains of select transistors ST(2) of memory cell strings MS in the same column in the memory cell array 110 are coupled to sources of the memory cells MC(15), and sources of the select transistors ST(2) are commonly coupled to the source line SL. Similarly, one of the ends of each of the memory elements MR coupled in parallel with the select transistor ST(2) is coupled to the sources of the memory cells MC(15), and the other of the ends of each of the memory elements MR is commonly coupled to the source line SL.

By bringing the select gate line SGS of the select transistor ST(2) to the H level, an inversion layer is formed in the semiconductor layer 32 of the select transistor ST(2) and the semiconductor substrate, allowing a current to flow through the source line SL.

<2-3> Structure of Memory Cell Array 110

Hereinafter, an example of a structure of the memory cell array 110 according to the second embodiment will be described. In the second embodiment, the select transistor ST(2) is provided on the semiconductor substrate. When the select transistor ST(2) is turned on, an inversion layer is formed in a P-well region of the semiconductor substrate, and a current flows through a source line SL via an N-type diffusion layer provided in the semiconductor substrate. Similarly to the first embodiment, a conductive layer 21 that functions as the source line SL may be formed above the semiconductor substrate 20. In this case, similarly to the first embodiment, bottom surfaces of the core member 30, the variable resistance layer 31, the semiconductor layer 32, and the insulating layer 33 are in contact with the conductive layer 21.

Figure 22:
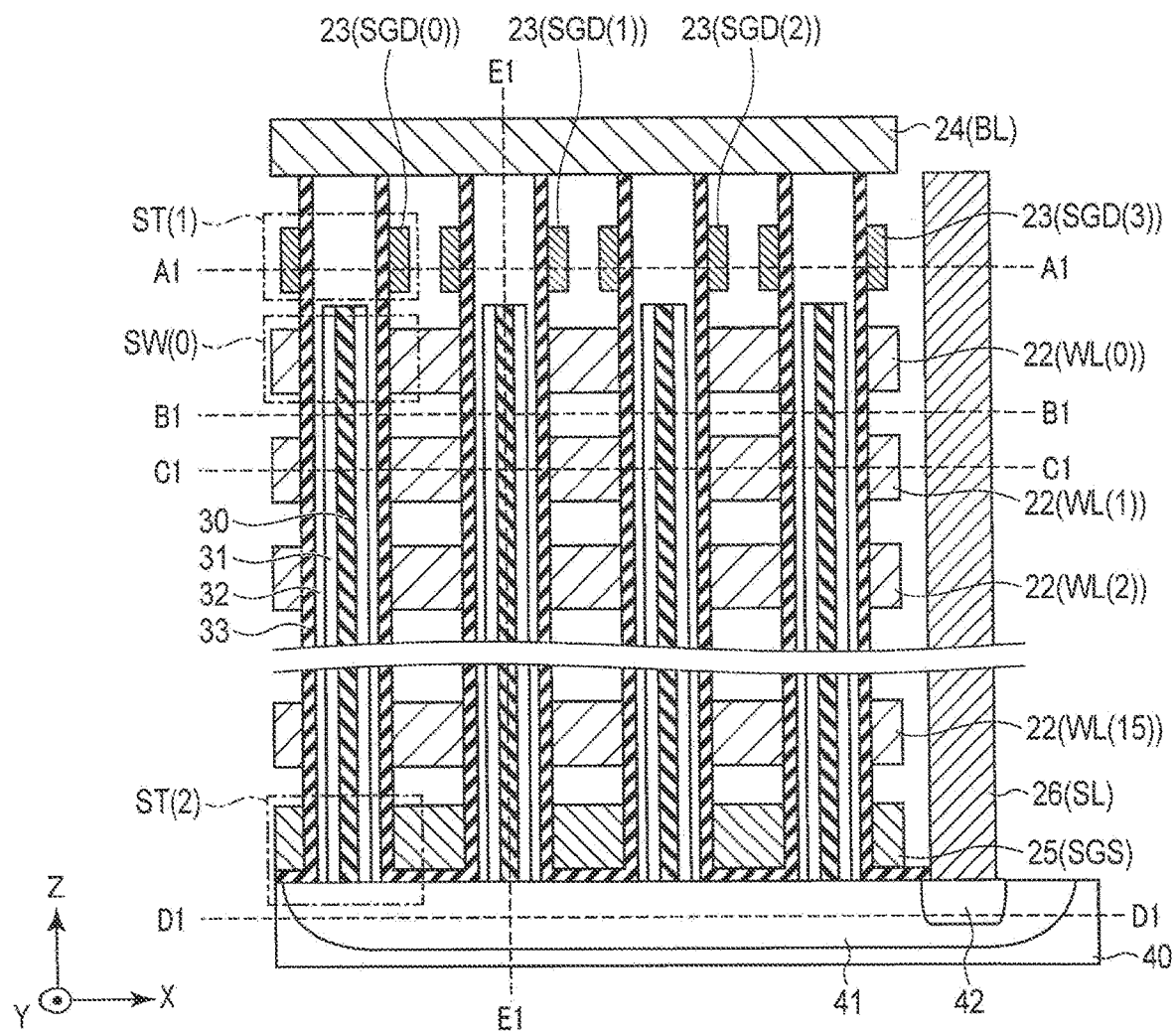
FIG. 22 is a cross-sectional view showing an example of a cross-sectional structure of the memory cell array included in the memory chip according to the second embodiment.

FIG. 22 shows an example of a cross-sectional structure of the memory cell array 110 included in the memory chip 100 according to the second embodiment. Specifically, a P-well region 41 is provided in a surface region of a semiconductor substrate 40, and an N-type diffusion layer (N$^+$ diffusion layer) 42 is provided in the P-well region 41, as shown in FIG. 22. The semiconductor substrate 40 is, for example, formed in a plate shape extending along the XY plane, and contains silicon (Si).

On the P-well region 41, a conductive layer (potential application electrode or voltage application electrode) 25 is provided, with an insulating layer interposed therebetween. The conductive layer 25 is, for example, formed in a plate shape extending in the XY plane, and functions as a select gate line SGS. The conductive layer 25 contains, for example, tungsten (W).

On the N-type diffusion layer 42, a conductive layer 26 is provided. The conductive layer 26 is, for example, formed in a plate shape extending along the ZY plane, and functions as a source line SL. The conductive layer 26 contains, for example, tungsten (W).

The select transistor ST(2) includes the conductive layer 25, the semiconductor layer 32, and the P-well region 41. When the conductive layer 25 is brought to the H level, an inversion layer is formed in the semiconductor layer 32 and the P-well region 41, allowing a current to flow therethrough.

The insulating layers and the conductive layers 22 are alternately stacked above the conductive layer 25. The conductive layers 22 are formed, for example, in a plate shape extending along the XY plane. The conductive layers 22 are respectively used as, in the order from the side of the semiconductor substrate 40, word lines WL(15) to WL(0). The conductive layers 22 contain, for example, tungsten (W).

A conductive layer 23, for example, is stacked above the topmost conductive layer 22 (WL(0)), with an insulating layer interposed therebetween. The conductive layer 23 extends in the Y direction, and is divided into a plurality of conductive layers 23 by select pillars SP (to be described later) in the X direction. The conductive layers 23 are respectively used as select gate lines SGD(0) to (3). The conductive layers 23 contain, for example, tungsten (W).

Conductive layers 24 are provided above the conductive layers 23. The conductive layers 24 are formed, for example, in a line, shape extending in the X direction, and are used as bit lines BL. The conductive layers 24 contain, for example, copper (Cu).

Figure 23:
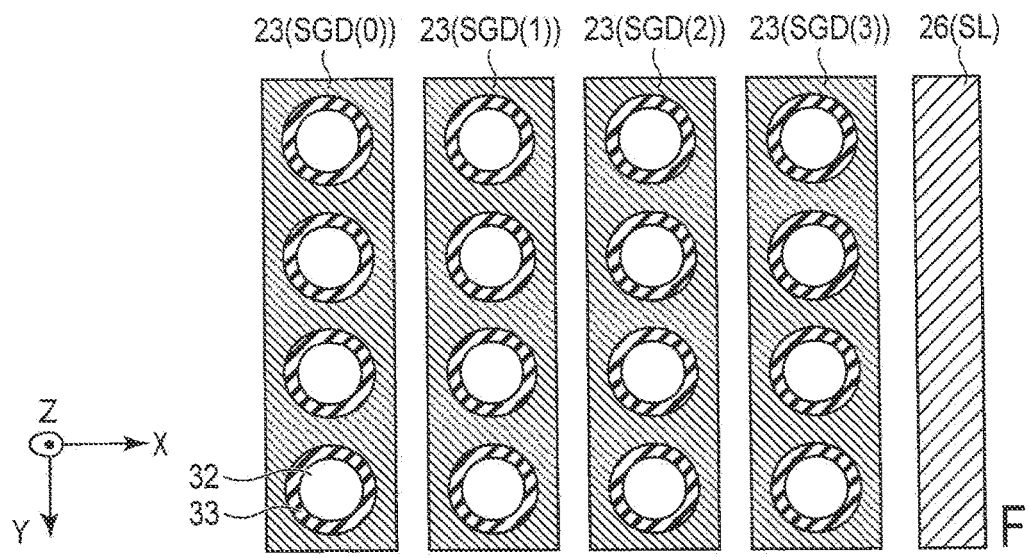
FIG. 23 is a plan view taken along line A1-A1 of FIG. 22.

Next, a plan view of the conductive layers 23 will be described with reference to FIG. 23. FIG. 23 is a plan view taken along line A1-A1 of FIG. 22. FIG. 23 shows that a current collected in the diffusion layer in the P-well region 41 is collected into a plate-shaped source line SL, flows up to the topmost layer, and then flows to a source line driver (not illustrated).

Figure 24:
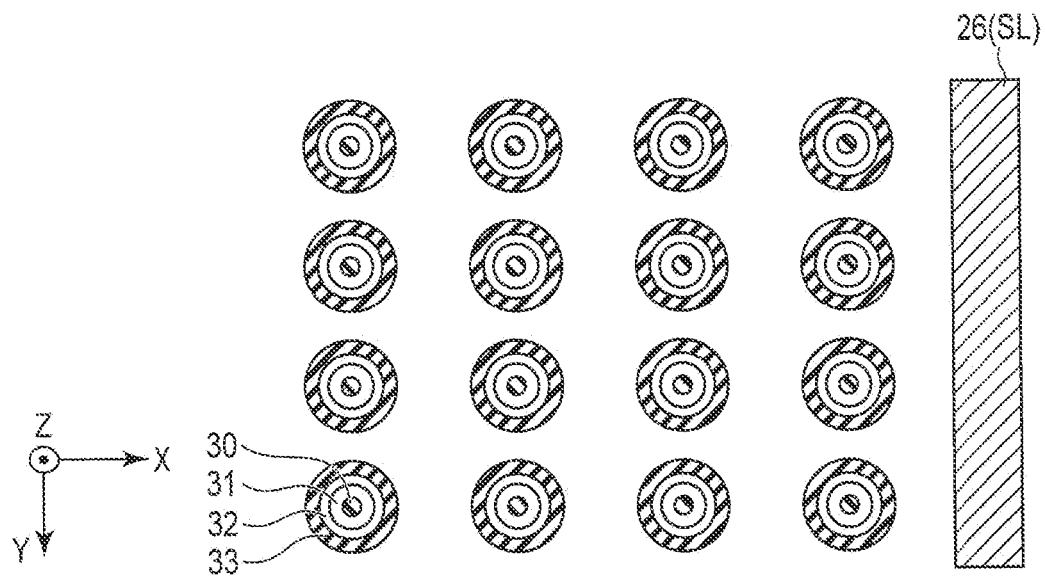
FIG. 24 is a plan view taken along line B1-B1 of FIG. 22.

Next, a plan view of portions between the memory cells MC in the Z direction will be described with reference to FIG. 24. FIG. 24 is a plan view taken along line B1-B1 of FIG. 22. FIG. 24 shows memory pillars of portions between memory cells MC, and the difference from the first embodiment is that a plate-shaped source line SL that is orthogonal to the semiconductor substrate 40 is provided. The source line SL shown in FIG. 24 is a midway path that allows the current collected by the diffusion layer in the P-well region 41 to flow up to upper layers.

Figure 25:
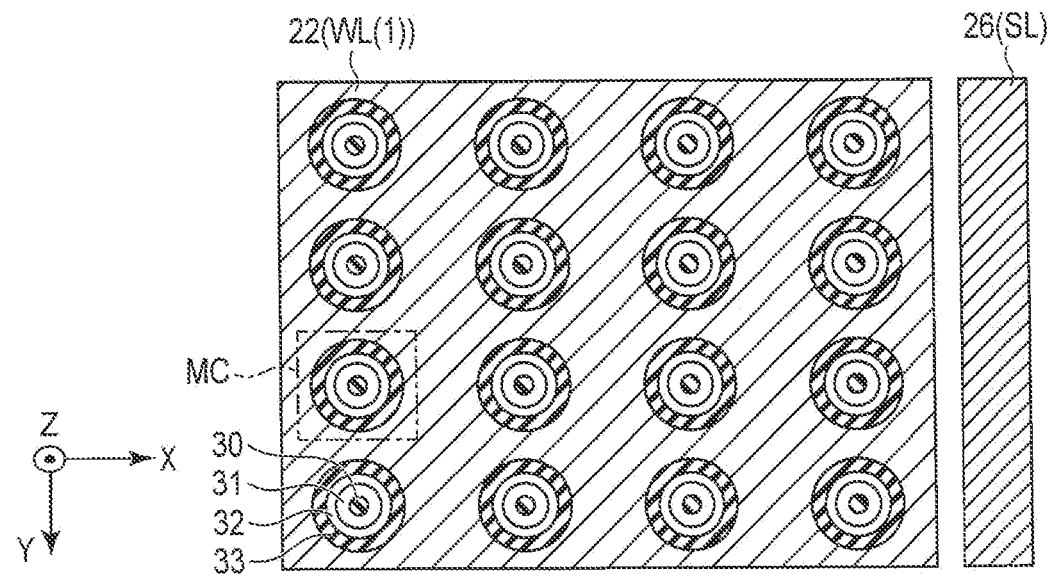
FIG. 25 is a plan view taken along line C1-C1 of FIG. 22.

Next, a plan view of the conductive layers 22 will be described with reference to FIG. 25. FIG. 25 is a plan view taken along line C1-C1 of FIG. 22. The configuration shown in FIG. 25 is different from the first embodiment in that a plate-shaped source line SL orthogonal to the semiconductor substrate 40 is provided. The source line SL shown in FIG. 25 is a midway path that allows the current collected by the diffusion layer in the P-well region 41 to flow up to upper layers.

Figure 26:
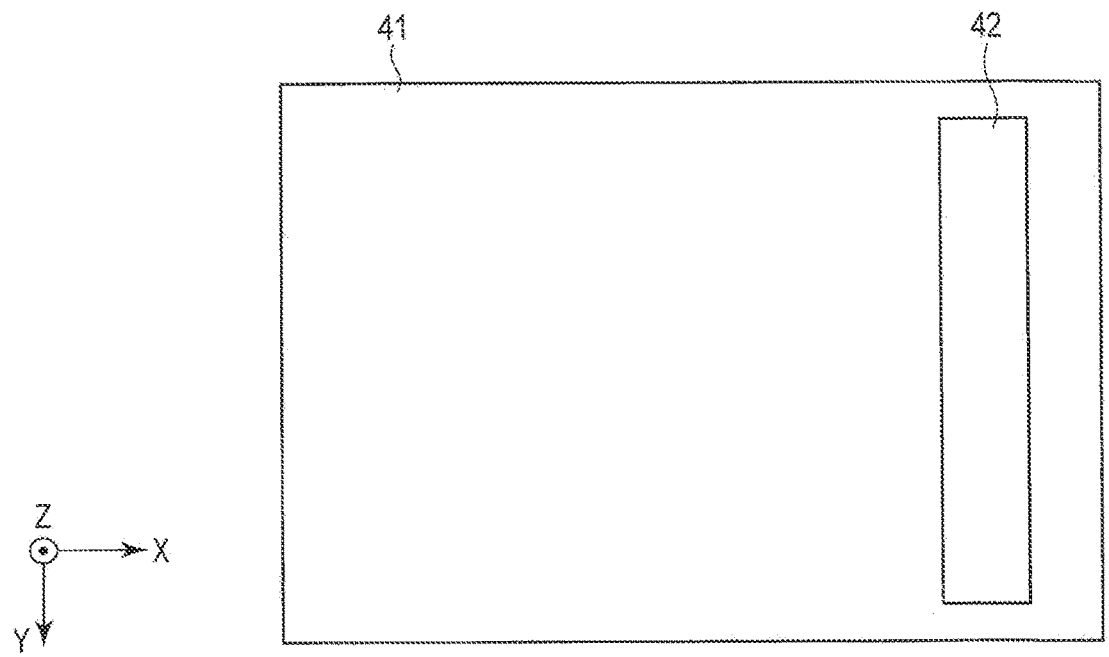
FIG. 26 is a plan view taken along line D1-D1 of FIG. 22.

Next, a plan view of the P-well region 41 will be described with reference to FIG. 26. FIG. 26 is a plan view taken along line D1-D1 of FIG. 22. As shown in FIG. 26, a current that flows down from the bit line BL through the memory pillar MP reaches the P-well region 41, then flows through an inversion layer which is formed in the P-well region 41 by the select transistor ST(2) in the on state, and reaches the diffusion layer 42. Thereafter, the current enters the source line SL, flows to the top, and then flows to a source line driver (not shown).

Figure 27:
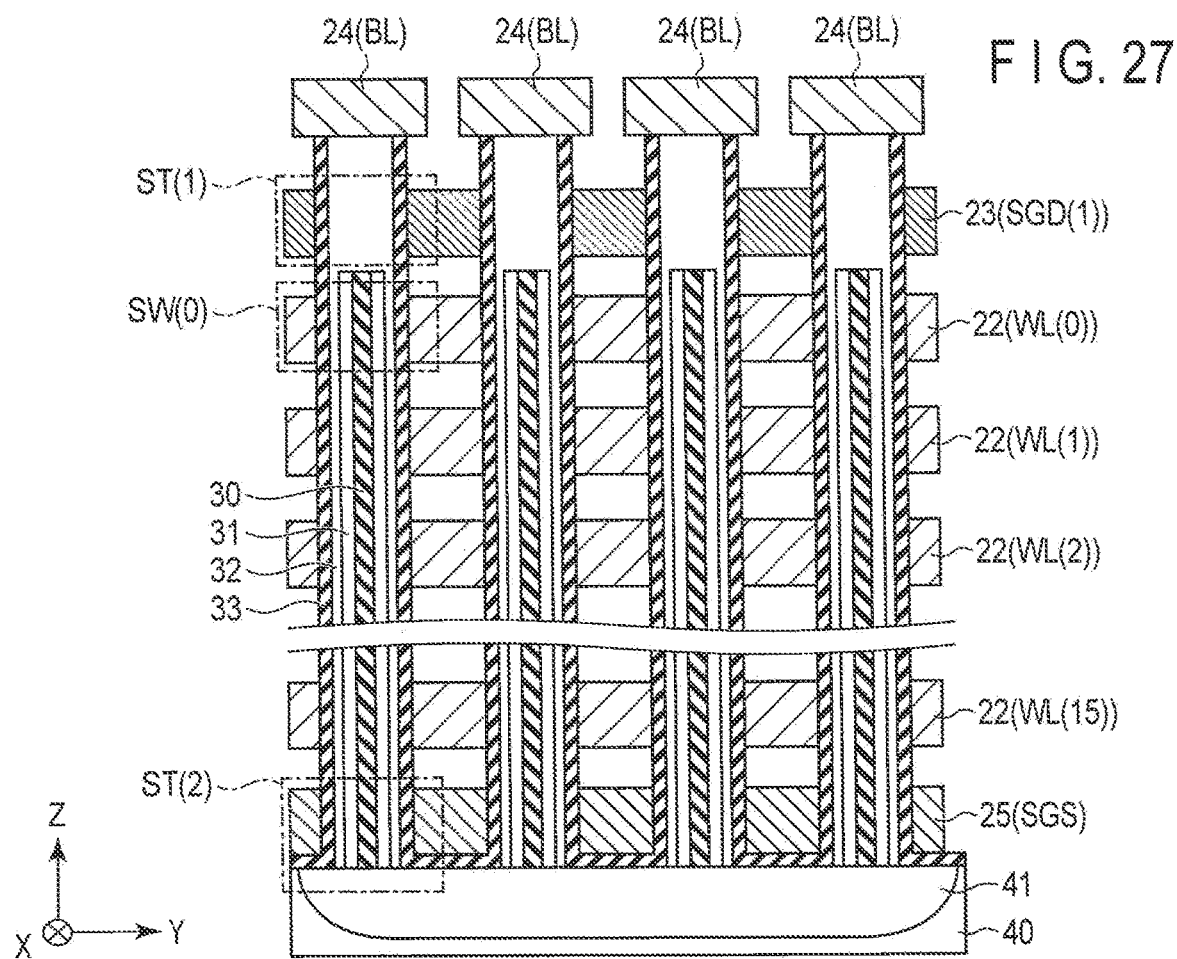
FIG. 27 is a cross-sectional view taken along line E1-E1 of FIG. 22.

Next, an example of a cross-sectional structure of the memory cell array 110 will be described with reference to FIG. 27. FIG. 27 is a cross-sectional view taken along line E1-E1 of FIG. 22. FIG. 27 shows a cross section cut in a direction orthogonal to the cross section shown in FIG. 22. Referring to FIG. 27 in combination with FIG. 22, it can be seen that the memory pillar MP is in a concentric shape about the core member 30.

An advantageous effect of the second embodiment, compared with the first embodiment, is that the processing can be facilitated by omitting a step of providing a conductive layer as a source line SL in the bottommost layer, and by forming the select gate line SGS in the bottommost layer in the same step as the step of forming the word lines WL.

<2-4> Operation

<2-4-1> Overview

Next, an overview of an operation of the memory chip 100 according to the second embodiment will be described.

In the memory chip 100 according to the second embodiment, read and write operations are performed by letting a current flow between the bit line BL and the source line SL.

A brief description will be given of a method of selecting a memory cell MC that performs a read or write operation with reference to FIGS. 28 and 29. FIG. 28 is a circuit diagram in which a single memory cell string MS is extracted. FIG, 29 is a cross sectional view in which a memory pillar MP corresponding to a single memory cell string MS is extracted.

As shown in FIGS. 28 and 29, a predetermined voltage (positive voltage) is applied to a select gate line SGD of a select transistor ST(1) and a select gate line SGS of a select transistor ST(2) that are in contact with a memory pillar MP to which a memory cell MC (e.g., MC(2)) to be selected belongs. Thereby, inversion layers are formed in the semiconductor layer 32 corresponding to the select transistors ST(1) and ST(2), allowing a current to flow therethrough (the on state). This causes the hit line BL, the select transistor ST(1), the semiconductor layer 32 of the memory pillar MP that is in contact with the select transistor ST(1) the select transistor ST(2), and the source line SL to be brought into conduction. Also, for example 0 [V] or a voltage VSS is applied to a word line WL(2) corresponding to the selected memory cell MC(2), and a predetermined voltage (positive voltage) is applied to word lines WL(0), (1) and (3) to (15) corresponding to the non-selected memory cells MC. Thereby, a current path between the bit line BL and the source line SL flows through a memory element MR in the memory cell MC(2) to be selected, and flows through the semiconductor layer 32 of selectors SW in the non-selected memory cells MC(0), (1) and (3) to (15). Since a core member 30, which is an insulating layer, is provided at a central portion of the memory pillar MP, as shown in FIG. 29, a current flows through the variable resistance layer 31 that surrounds the core member 30 in the selected memory cell MC. Also, a predetermined voltage is applied to the select gate line SGS of the select transistor ST(2). Thereby, an inversion layer is formed in the semiconductor layer 32 of the select transistor ST(2), allowing a current to flow therethrough (the on state). This causes the bit line BL, the select transistor ST(1), the semiconductor layer 32 of the memory pillar MP that is in contact with the select transistor ST(1), the select transistor ST(2), and the source line SL to be brought into conduction.

With the configuration described above, it is possible to select a variable resistance layer 31 both in a read operation and a write operation. When the present scheme is compared with a three-dimensional NAND-type flash memory, it has the advantages that it can operate at a lower voltage and at a higher speed, that there are less restrictions on the number of times of rewriting, and that the writing time is shorter.

<2-4-2> Operation Waveform

Figure 30:
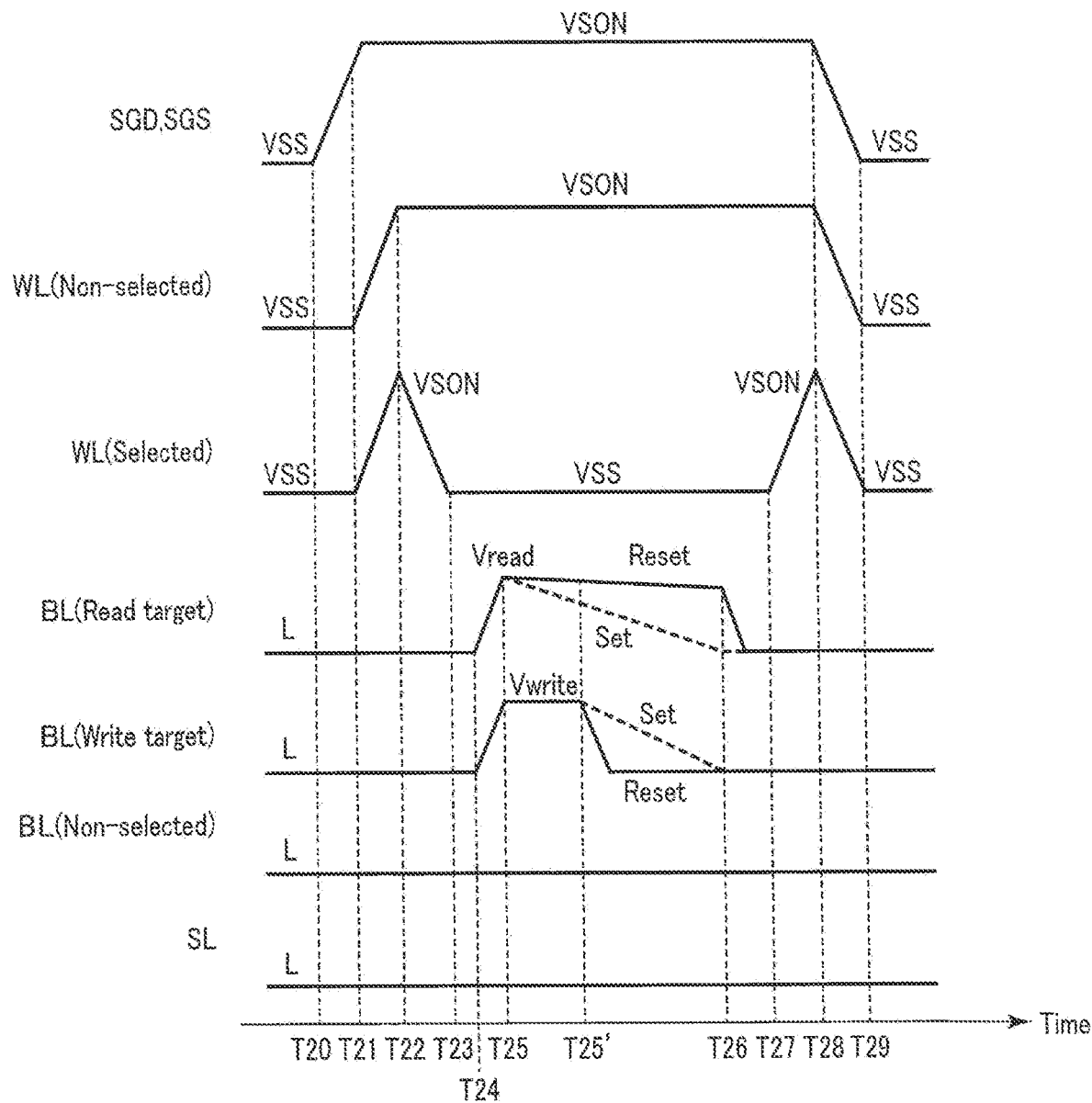
FIG. 30 is a timing chart showing an operation waveform in the memory chip according to the second embodiment.

A description will be given of an operation waveform of the memory chip 100 according to the second embodiment, with reference to FIG. 30. FIG. 30 shows a timing chart of an operation waveform.

First, an example of the read process will be described. At time T20, the sequencer 170 maintains the voltage of the bit line BL (bit line voltage) and the voltage of the source line SL (source line voltage) at the L level, and the voltages of the word lines WL at VSS, and increases the voltages of the select gate lines SGD and SGS from VSS to VSON. In other words, at time T20, the selectors SW of all memory cells MC are in the off state.

At time T21, the voltages of the select gate lines SGD and SGS become VMON. At this time, the transistors ST(1) and ST(2) are in the on state.

At time T21 when the voltages of the select gate lines SGD and SGS are increased to at least VMON. the sequencer 170 increases the voltages of the word lines WL from VSS to VSON.

At time T22 when the voltage of the word lines WL are increased to at least VMON, the sequencer 170 maintains the voltages of the non-selected word lines WL at VSON and decreases the voltage of the selected word line WL from VSON to VSS. The voltages of the word lines WL may be increased after the voltages of the select gate lines SGD and SGS are increased to VSON.

At time T23, the voltages of the select gate lines SGD and SGS and the non-selected word lines WL become VSON, and the voltage of the selected word line WL becomes VSS. Accordingly, from time T23 to time T27, the selectors SW of the non-selected memory cells MC among the memory cells MC in the selected memory cell string MS are in the off state.

In a period from time T21 to time T22, the voltage of the selected word line WL and the voltages of the non-selected word lines WL are simultaneously increased, so that the influence on the coupling by the selected word line WL is equivalent to the influence on the coupling by the non-selected word lines WL. As a result, a potential difference due to coupling does not substantially occur between electrodes (nodes).

Furthermore, in a period from time T22 to time T23, the voltage of the selected word line WL is decreased, while the voltages of the non-selected word lines WL are net decreased. At this time, the select, transistors ST(1) and ST(2) and the selectors SW of the non-selected memory cells MC are all brought into conduction. Therefore, voltage noise due to coupling (hereinafter also referred to as "coupling noise") is quickly absorbed by (discharged to) the bit line BL and the source line SL. Therefore, a potential difference due to coupling does not substantially occur between electrodes.

At time T24, the sequencer 170 increases the voltage of the selected bit line BL from the L level to the voltage Vread.

At time T25, the sequencer 170 applies the voltage Vread to the bit line BL, and then brings the bit line BL to a floating state. Thereby, the voltage of the bit line BL is gradually decreased when the selected memory cell MC is in the high-resistance (reset) state, and the voltage of the bit line BL is rapidly decreased when the selected memory cell MC is in the low-resistance (set) state. As a sense operation, after a predetermined period of time has passed after the voltage Vread is applied to the bit line BL, for example at time T26, the sense amplifier 140 senses the H level or L level by comparing the voltage of the bit line BL with a reference potential.

At time T27, the sequencer 170 increases the voltages of the selected word line WL from VSS to VSON.

At time T28 when the voltage of the selected word line WL is increased to VSON, the sequencer 170 decreases the voltages of the select gate lines SGD and SGS from VSON to VSS, and decreases the voltages of the word lines WL from VSON to VSS.

At time T29, the select transistors ST(1) and ST(2) and the selectors SW of all memory cells MC are in the off state.

In a period from time T27 to time T28, coupling noise that occurs due to the increase in the voltage of the selected word line WL is quickly absorbed by the bit line BL and the source line SL, since the select transistors ST(1) and ST(2) and the selectors SW of the non-selected memory calls MC are all brought into conduction. Therefore, the influence of the coupling noise is relatively small.

Furthermore, in a period from time T28 to time T29, the voltage of the selected word line WL is decreased together with the voltages of the select gate lines SGD and SGS and the voltages of the non-selected word lines WL. Therefore, the influences of the coupling noise on the respective electrodes are equal, and there is substantially no difference in potential between the electrodes of the memory element MR.

Next, a write operation will be described below. As described above with reference to FIG. 14, the operation waveforms of the select gate lines SGD and SGS, the word line WL, and the source line SL are the same in both the read operation and the write operation. In the case of the write operation, in a period from time T24 to time T25, the sequencer 170 increases the voltage of the bit line BL from the L level to the voltage Vwrite. Next, in a period from time T25 to time T25', the sequencer 170 applies a pulse of the voltage Vwrite to the bit line BL.

For example, in a period from time T25' to time T26, when the voltage of the bit line BL is rapidly decreased from Vwrite to the L level, the memory element MR turns to a high-resistance reset state. In the period from time T25' to time T26, when the voltage of the bit line BL is gradually decreased from Vwrite to the L level, the memory element MR is set to a low-resistance set state.

The examples of the read operation are not limited to the above. For example, the same voltage as the voltage of the select gate line SGD of the first embodiment in FIG. 14 may be applied to the select gate line SGS, and the same voltage as the voltage of the select gate line SGD in FIG. 16 may be applied to the select gate line SGS.

For example, at time T0 in FIG. 14, the sequencer 170 increases the voltages of the select gate lines SGD and SGS from VSS to VSON. At time T1, the voltages of the select gate lines SGD and SGS are increased to VMON, and thereafter the sequencer 170 increases the voltages of the non-selected word lines WL from VMON to VSON, and decreases the voltage of the selected word line WL from VMON to VSS. At time T2, the voltages of the select gate lines SGD and SGS and the non-selected word lines WL become VSON, and the voltage of the selected word line WL becomes VSS. At time T5, the sequencer 170 decreases the voltages of the select gate lines SGD and SGS from VSON to VSS, decreases the voltages of the non-selected word lines WL from VSON to VMON, and increases the voltage of the selected word line WL from VSS to VMON.

<2-5> Advantages

In the embodiment described above, to read information stored in the selected memory cell MC or to store information in the selected memory cell MC, the memory chip 100 increases the voltages of the select gate lines SGD and SGS from VSS to VSON. After the voltages of the select gate lines SGD and SGS are increased to at least VMON, the memory chip 100 increases the voltages of the word lines WL from VSS to VSON. The voltage of the selected word line WL starts to decrease, after ail of the select gate lines SGD and SGS and the non-selected word lines WL are turned on, and the select transistors ST(1) and ST(2) and the selectors SW of the non-selected memory cells MC are all brought into conduction. In most of the period while the voltage of the selected word line WL is decreasing, the select transistors S7(1) and ST(2) and the selectors SW of the non-selected memory cells MC are all brought into conduction. Therefore, the potential difference does not easily occur between the electrodes of the memory element MR, and the disturbance can be reduced. As a result, in the read operation and the write operation, the disturbance in the memory string MS can be suppressed.

To explain a disturbance in the memory string MS, a comparative example will be described with reference to FIG. 31. FIG. 31 is a circuit diagram in which a single memory cell string MS is extracted. In FIG. 31, the memory cell MC(0) is selected.

In FIG. 31, the node between the select transistor ST(2) and the memory cell MC(15) is labeled as CTD(SL).

When the voltage of the bit line BL is transferred to the memory cell string MG, a disturbance may occur in the memory cell string MS.

For example, in the circuit diagram of FIG. 31, as in the case of FIG. 16, let us assume that the voltages of the select gate lines SGD and SGS are decreased from the H level (for example VSON) to the L level (for example VSS), and thereafter the voltages of the non-selected word lines WL are decreased from the H level to the L level. For example, as shown in FIG. 31, when the memory cell MC(0) is selected, the potential of the node CTD(15) is decreased relatively greatly due to the coupling capacitance between the word line WL15 and the node. In contrast, since the voltage of the select gate line SGS is at the L level, the amount of change in the potential of the node CTD(SL) is relatively small. Therefore, a potential difference occurs between the node CTD(15) and the node CTD(SL). A large disturbance may occur due to the potential difference between the node CTD(15) and the node CTD(SL).

According to the present embodiment, at the same time as the voltages of the select gate lines SGD and SGS are decreased, the voltage of the selected word line WL is increased and the voltages of the non-selected word lines WL are decreased. Thus, the change in the potential of each node can be suppressed. As a result, the disturbance that, may occur in the comparative example can be suppressed.

As described above, in the present embodiment, the same advantages as those of the first embodiment can be attained.

<2-6> First Modification

Figure 32:
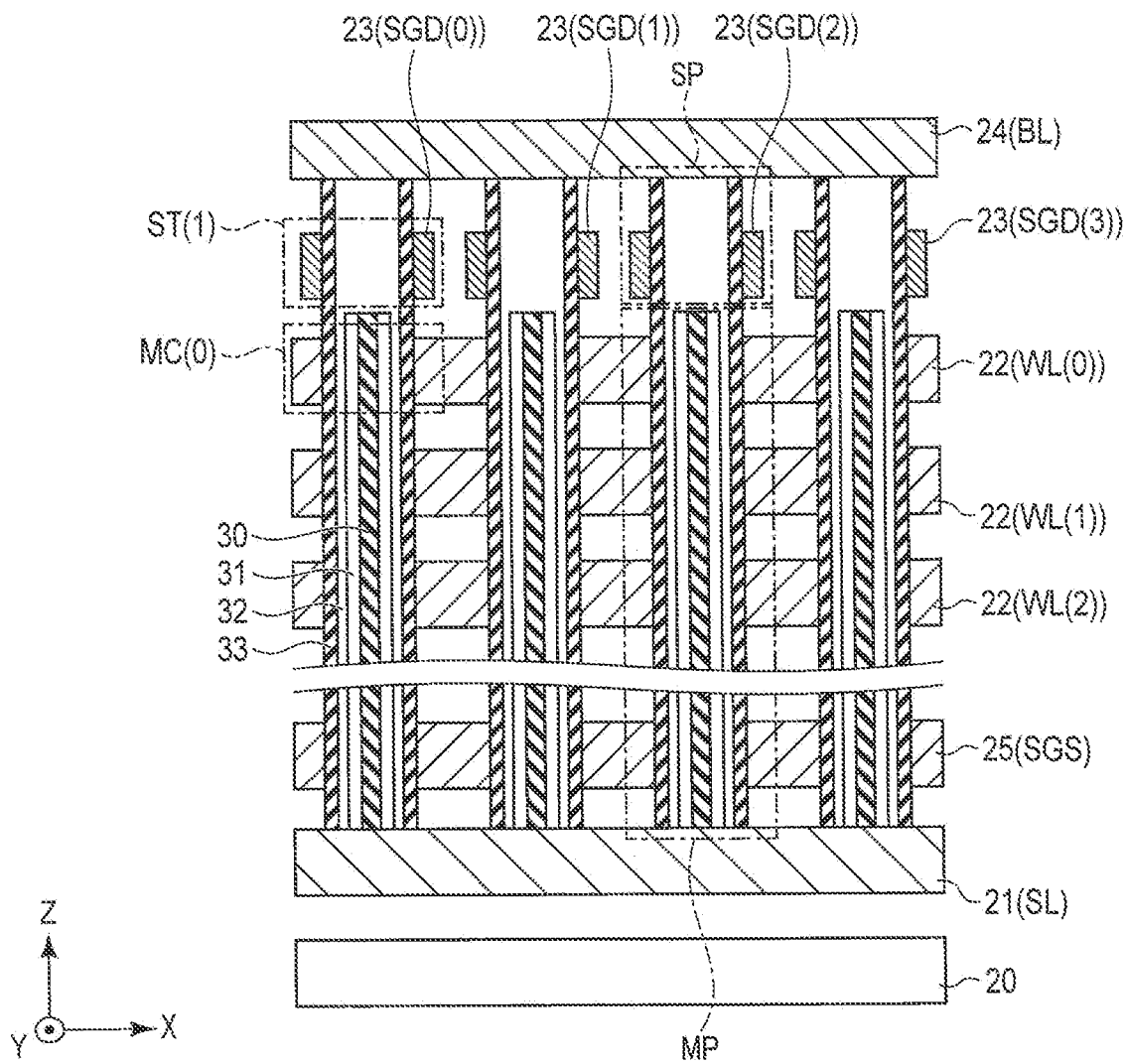
FIG. 32 is a cross-sectional view showing an example of a cross-sectional structure of a memory cell array included in a memory chip according to a first modification of the second embodiment.

A first modification of the second embodiment will be described with reference to FIG. 32. FIG. 32 shows an example of a cross-sectional structure of a memory cell array 110 according to the first modification of the second embodiment.

As shown in FIG. 32, as in the first embodiment shown in FIG. 5, a conductive layer 21 functioning as a source line SL may be provided above the semiconductor substrate 20 with an insulating layer interposed therebetween. In this case, a memory pillar MP is provided on the conductive layer 21. Above the conductive layer 21, a conductive layer 25 is provided with an insulating layer interposed therebetween, and insulating layers and conductive layers 22 are alternately stacked above the conductive layer 25.

The present modification can also attain the same advantages as those of the second embodiment.

<2-7> Second Modification

Figure 33:
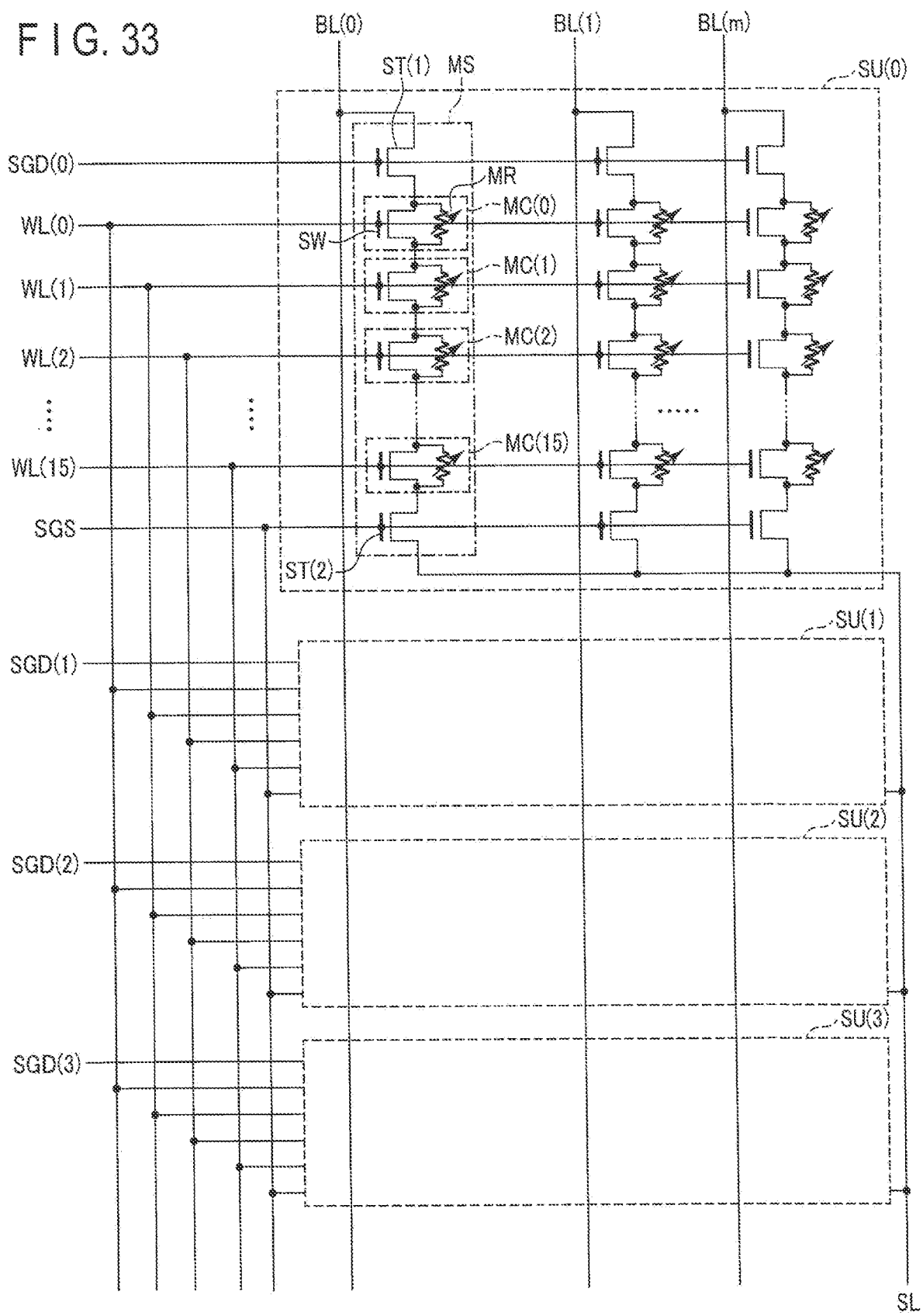
FIG. 33 is a circuit diagram showing a circuit (equivalent circuit) of a memory cell array included in a memory chip according a second modification of the second embodiment.
Figure 35:
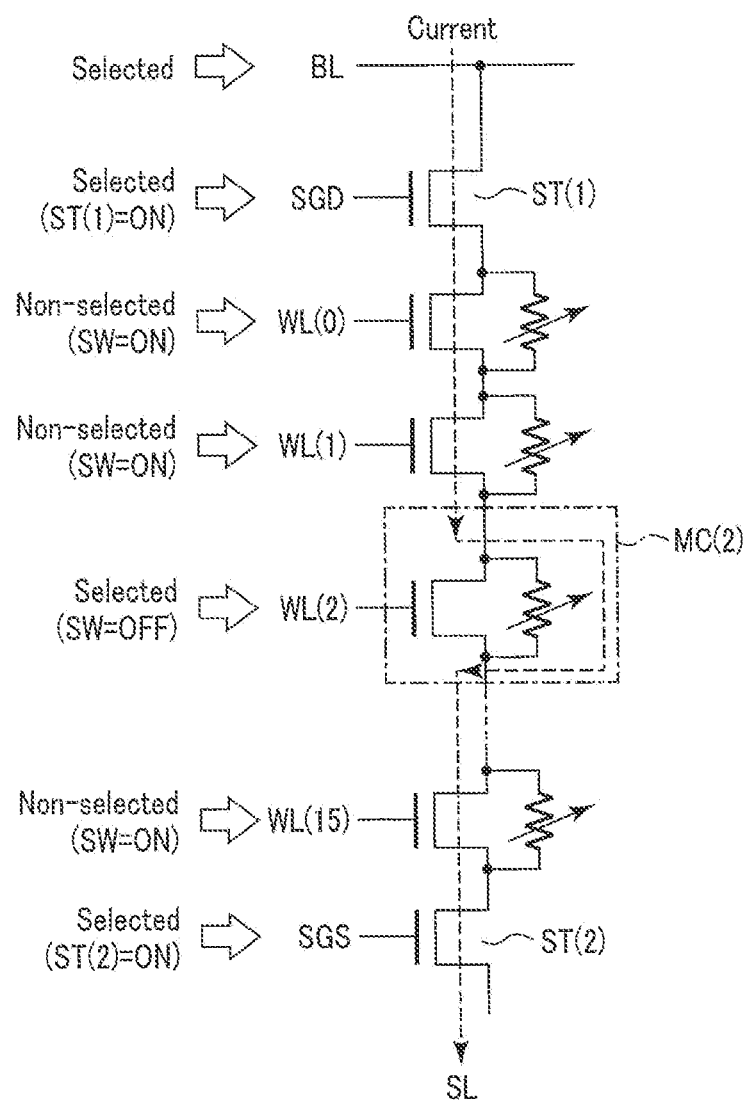
FIG. 35 is a circuit diagram in which a single memory cell string in the memory cell array included in the memory chip according to the second modification of the second embodiment is extracted.

A second modification of the second embodiment will be described with reference to FIGS. 33 to 35. FIG. 33 shows a circuit configuration of a memory cell array 110 according to the second modification of the second embodiment. FIG. 34 shows an example of a cross-sectional structure of the memory cell array 110 according to the second modification of the second embodiment. FIG. 35 is a circuit diagram in which a single memory cell string MS of the memory cell array 110 is extracted.

As shown in FIG. 33, the memory element MR coupled in parallel to the select transistor ST(2) described with reference to FIG. 21 of the second embodiment may be omitted. More specifically, for example, as shown in FIG. 34, a core member 30 and a variable resistance layer 31 may be provided so that the lower ends of the core member 30 and the variable resistance layer 31 are located above the conductive layer 25 (the select gate line SGS). The other configuration is similar to that of the second embodiment.

Similarly to the first modification of the second embodiment, a memory pillar MP may be provided on a conductive layer 21 that functions as the source line SL.

Next, an overview of an operation will be described.

As shown in FIG. 35, in the same manner as described above with reference to FIG. 28, a predetermined voltage (for example, the voltage VSON) is applied to select gate lines SGD and SGS that are in contact with a memory pillar MP to which a memory cell MC (for example, MC(2)) to be selected belongs. Thereby, inversion layers are formed in the semiconductor layer 32 corresponding to the select transistors ST(1) and ST(2), allowing a current to flow therethrough (the on state). This brings the bit line BL, the select transistors ST(1) and ST(2), and the semiconductor layer 32 of the memory pillar MP, ends of which are respectively in contact with the select transistors ST(1) and ST(2), into conduction. Furthermore, for example 0 [V] or a voltage VSS is applied to a word line WL(2) corresponding to the selected memory cell MC(2), and a predetermined voltage (for example, a voltage VSON) is applied to word lines WL(0), (1), and (3) to (15) corresponding to the non-selected memory cells MC. Thereby, a current path between the bit line BL and the source line SL flows through a memory element MR in the memory cell MC(2) to be selected, and flows through the semiconductor layer 32 of the selectors SW in the non-selected memory cells MC(0), (1) and (3) to (15).

The present modification can also attain the same advantages as those of the second embodiment.

<2-8> Third Modification

Figure 36:
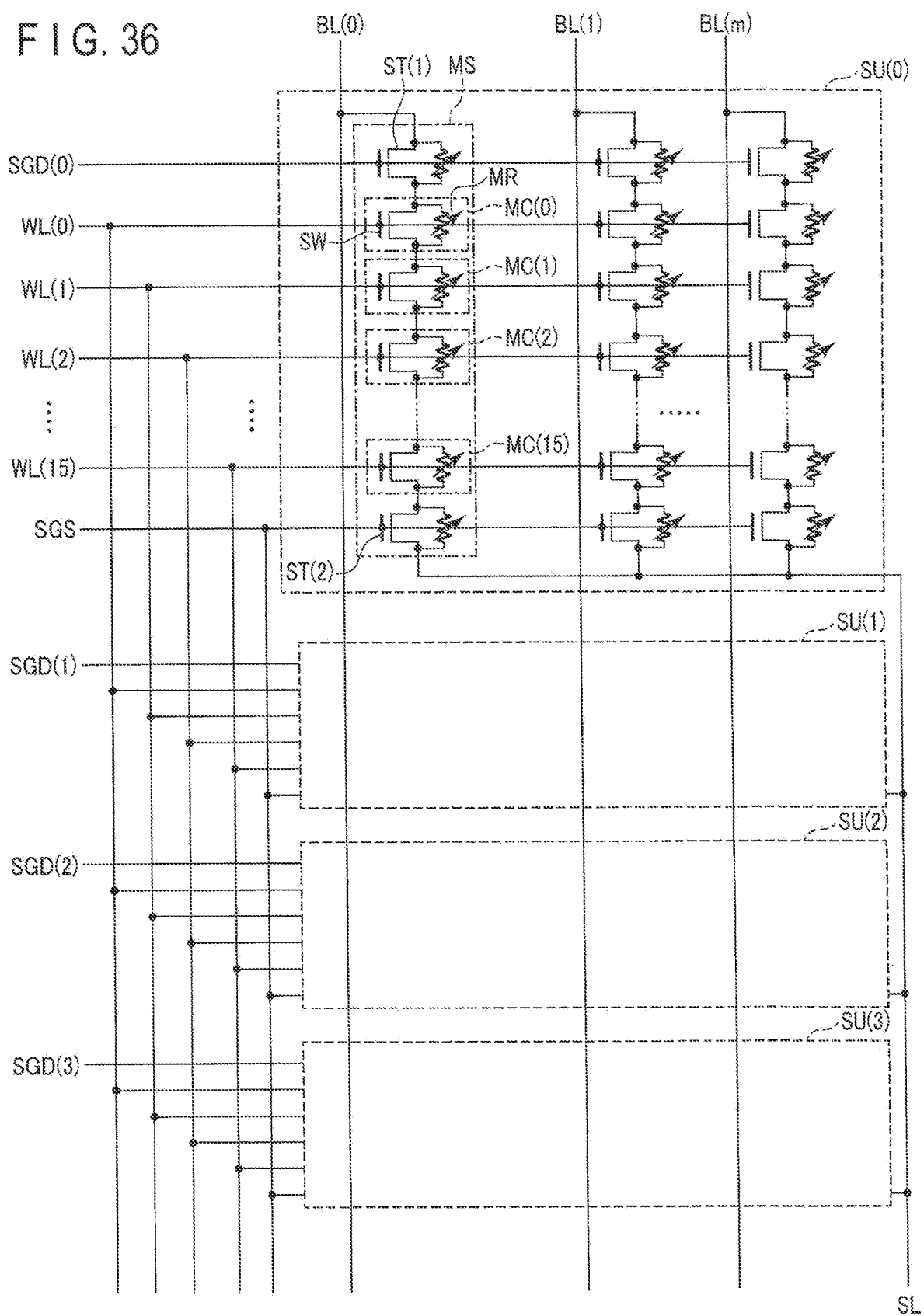
FIG. 36 is a circuit diagram showing a circuit (equivalent circuit) of a memory cell array included in a memory chip according a third modification of the second embodiment.
Figure 37:
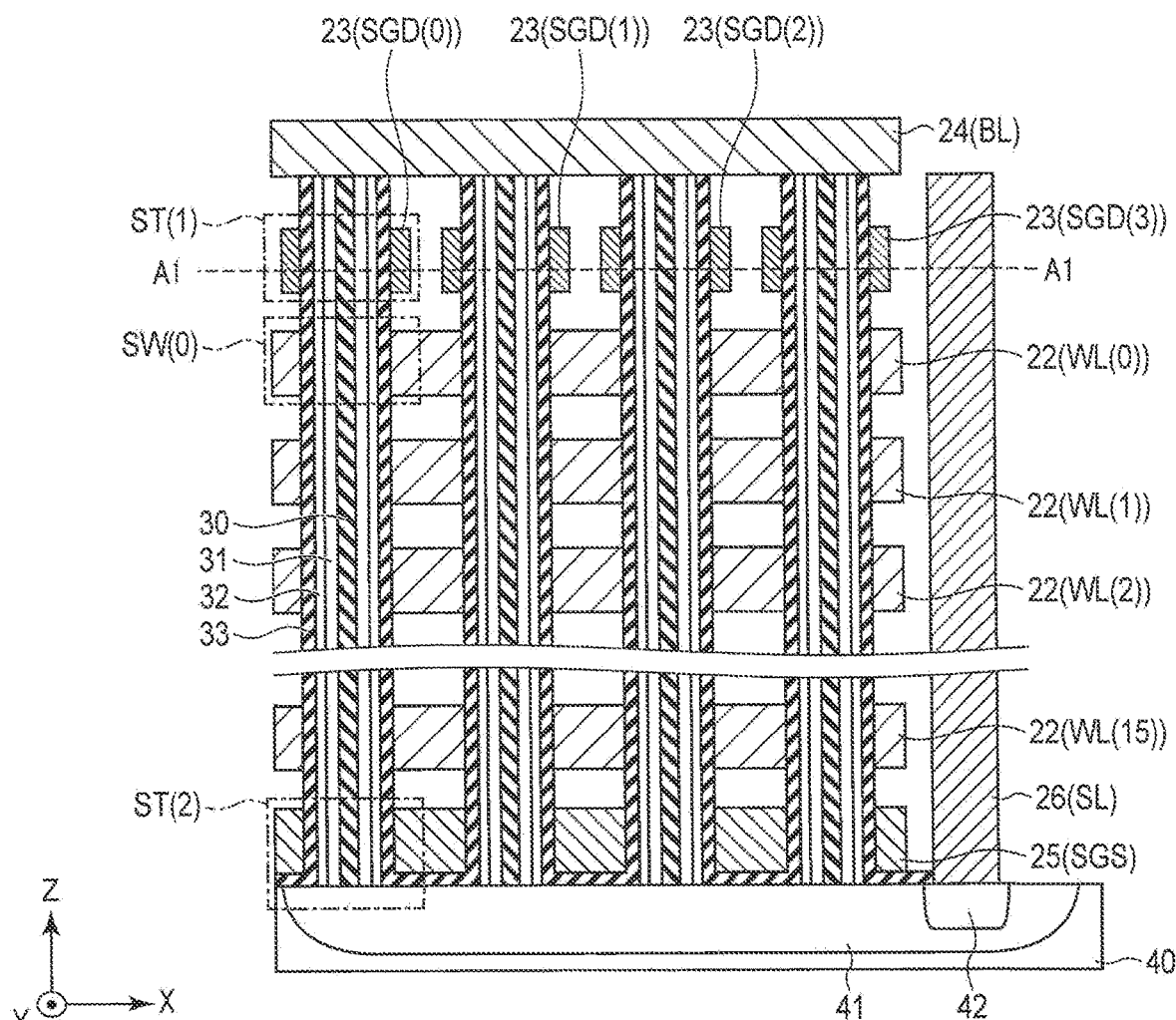
FIG. 37 is a cross-sectional view showing an example of a cross-sectional structure of the memory cell array included in the memory chip according to the third modification of the second embodiment.
Figure 38:
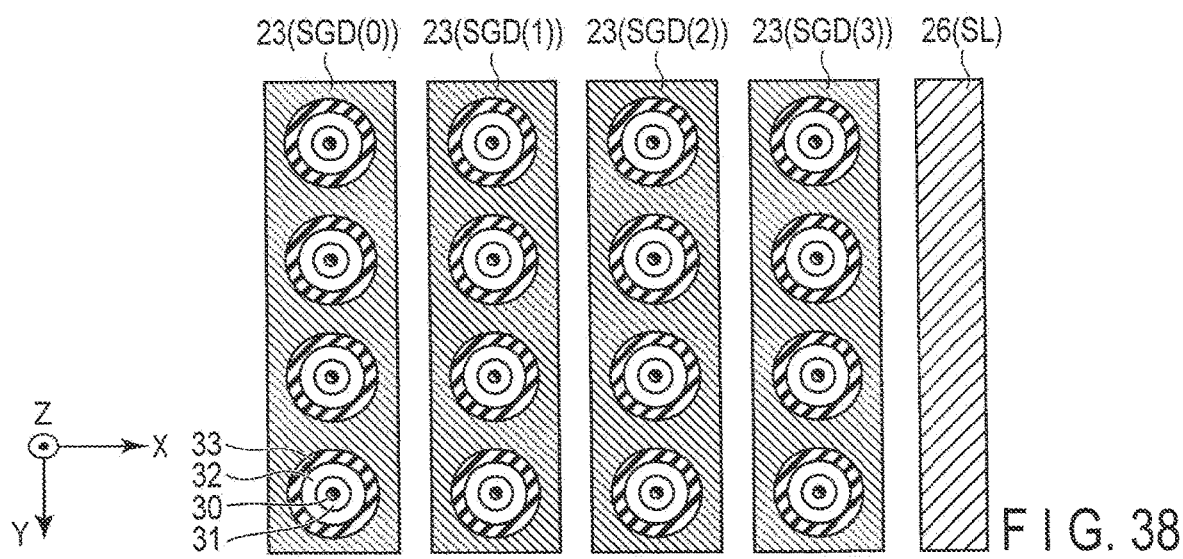
FIG. 38 is a plan view taken along line A1-A1 of FIG. 37.

A third modification of the second embodiment will be described with reference to FIGS. 36 to 39. FIG. 36 shows a circuit configuration of a memory cell array 110 according to the third modification of the second embodiment. FIG. 37 shows an example of a cross-sectional structure of the memory cell array 110 according to the third modification of the second embodiment. FIG. 38 is a plan view taken along line A1-A1 of FIG. 37. FIG. 39 is a circuit diagram in which a single memory cell string MS of the memory cell array 110 is extracted.

As shown in FIG. 36, a memory element MR coupled in parallel to a select transistor ST(1) may be provided. The configuration in which the select transistor ST(1) and the memory element MR are coupled in parallel may be the same as the configuration of the memory cell MC. More specifically, for example, as shown in FIGS. 37 and 38, a core member 30 and a variable resistance layer 31 may be provided in a region of a memory pillar MP corresponding to the first select transistor ST(1). In other words, the core member 30 and the variable resistance layer 31 may be provided so that the upper ends of the core member 30 and the variable resistance layer 31 are located above the conductive layer 23 (the select gate line SGD). The other configuration is similar to that of the second embodiment.

Similarly to the first modification of the second embodiment, a memory pillar MP may be provided on a conductive layer 21 that functions as the source line SL.

Next, an overview of an operation will be described.

As shown in FIG. 39, in the same manner as described above with reference to FIG. 28, a predetermined voltage (for example, the voltage VSON) is applied to select gate lines SGD and SGS that are in contact with a memory pillar MP to which a memory cell MC (for example, MC(2)) to be selected belongs. Thereby, inversion layers are formed in the semiconductor layer 32 corresponding to the select transistors ST(1) and ST(2), allowing a current, to flow therethrough (the on state). This brings the bit line BL, the select transistors ST(1) and ST(2), and the semiconductor layer 32 of the memory pillar MP, ends of which are respectively in contact with the select transistors ST(1) and ST(2), into conduction. Furthermore, for example 0 [V] or a voltage VSS is applied to a word line WL(2) corresponding to the selected memory cell MC(2), and a predetermined voltage (for example, a voltage VSON) is applied to word lines WL(0), (1), and (3) to (15) corresponding to the non-selected memory cells MC. Thereby, a current path between the bit line BL and the source line SL flows through a memory element MR in the memory cell MC(2) to be selected, and flows through the semiconductor layer 32 of selectors SW in the non-selected memory cells MC(0), (1) and (3) to (15).

The present modification can also attain the same advantages as those of the second embodiment.

<2-9> Fourth Modification

Figure 40:
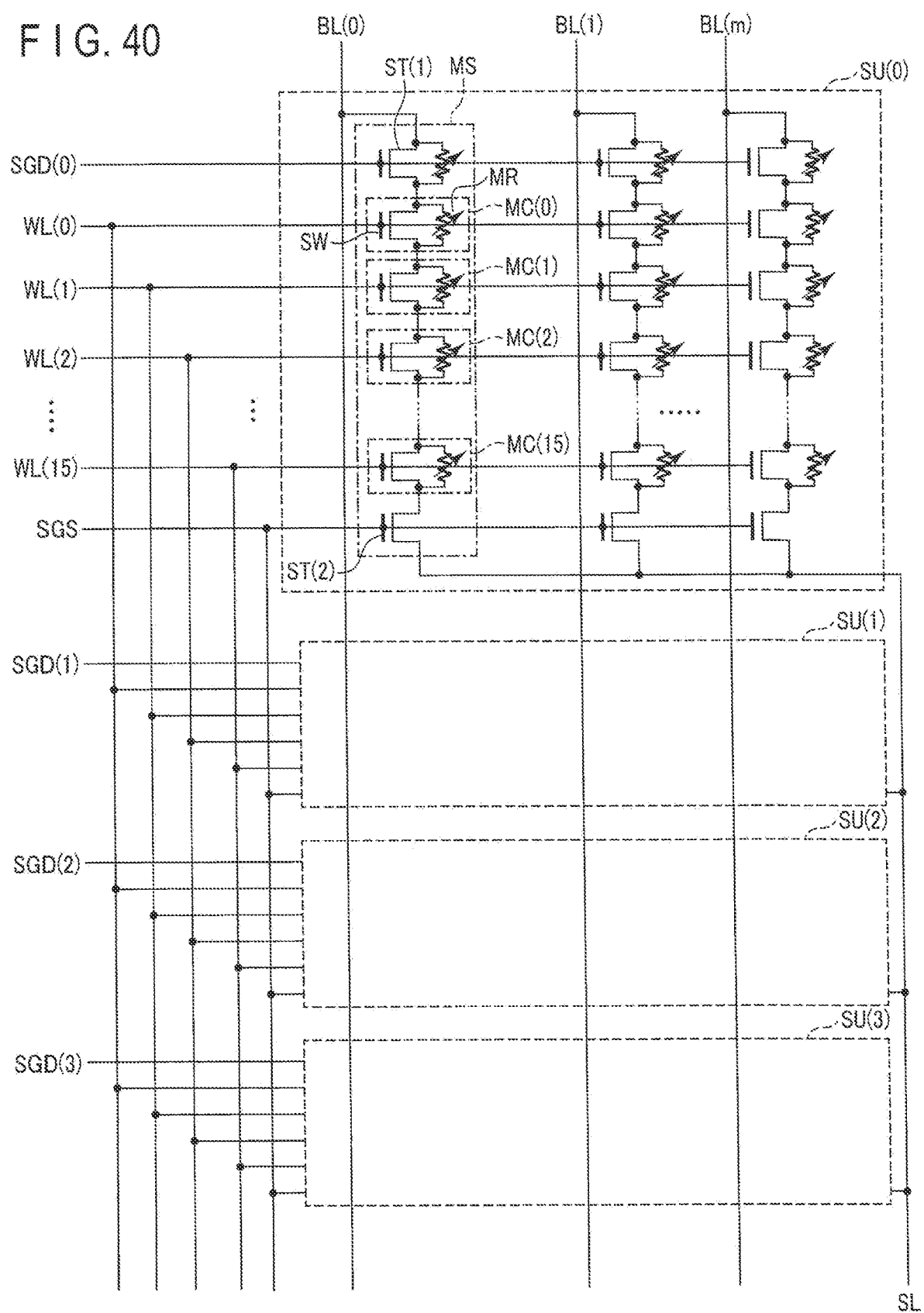
FIG. 40 is a circuit diagram showing a circuit (equivalent circuit) of a memory cell array included in a memory chip according a fourth modification of the second embodiment.
Figure 41:
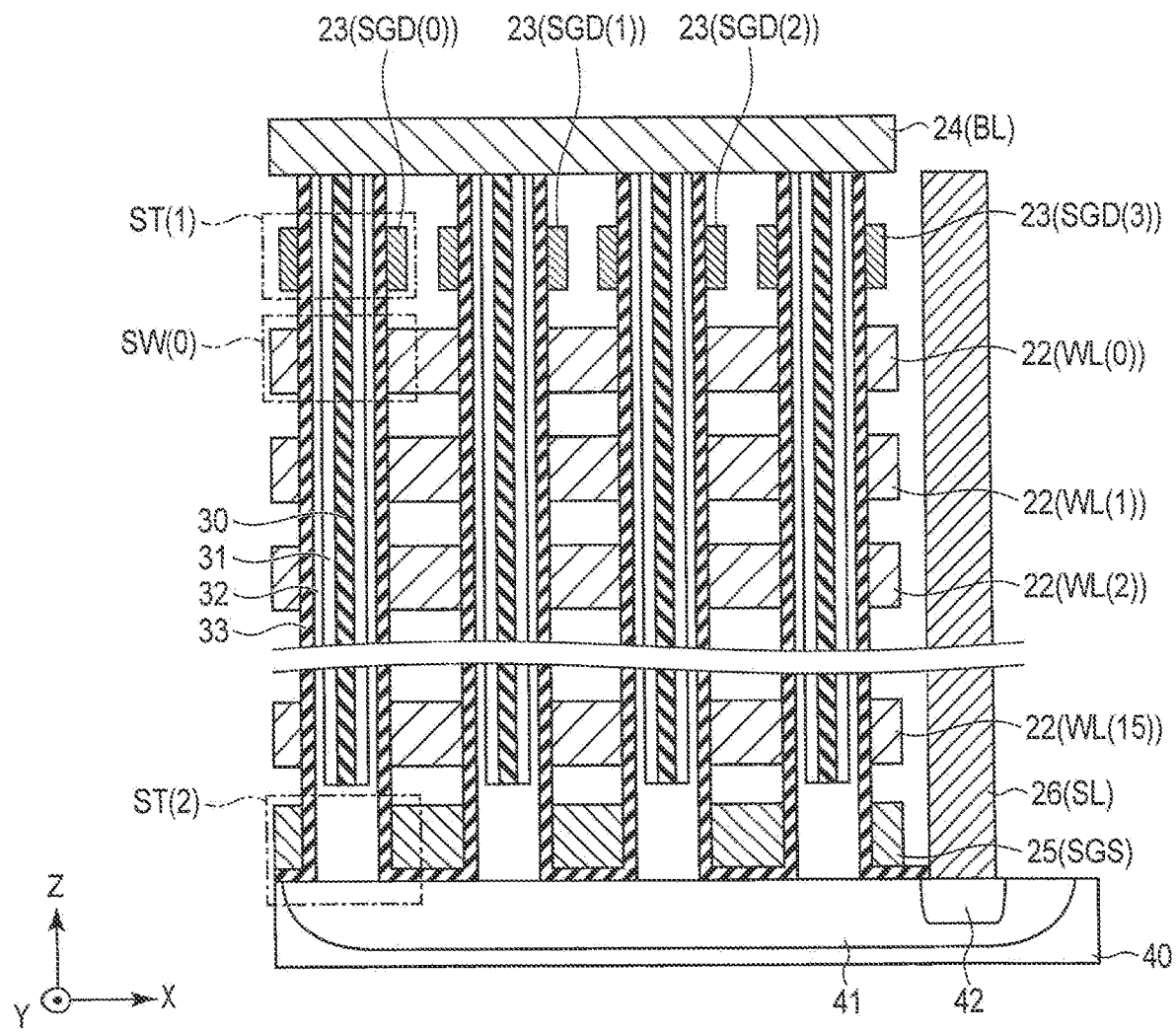
FIG. 41 is a cross-sectional view showing an example of a cross-sectional structure of the memory cell array included in the memory chip according to the fourth modification of the second embodiment.

A fourth modification of the second embodiment will be described with reference to FIGS. 40 to 42. FIG. 40 shows a circuit configuration of a memory cell array 110 according to the fourth modification of the second embodiment. FIG. 41 shows an example of a cross-sectional structure of the memory cell array 110 according to the fourth modification of the second embodiment. FIG. 42 is a circuit diagram in which a single memory cell string MS of the memory cell array 110 is extracted.

As shown in FIG. 40, a memory element MR coupled in parallel to the select transistor ST(1) may be provided, and a memory element MR coupled in parallel to the select transistor ST(2) may be omitted. More specifically, for example, as shown in FIG. 41, the core member 30 and the variable resistance layer 31 may be provided so chat the upper ends of the core member 30 and the variable resistance layer 31 are located above the conductive layer 23 (the select gate line SGD), and the lower ends of the core member 30 and the variable resistance layer 31 are located above the conductive layer 25 (the select gate line SGS). The other configuration is similar to that of the second embodiment.

Similarly to the first modification of the second embodiment, a memory pillar MP may be provided on a conductive layer 21 that functions as the source line SL.

Next, an overview of an operation will be described.

As shown in FIG. 42, in the same manner as described above with reference to FIG. 28 of the second embodiment, a predetermined voltage (for example, the voltage VSON) is applied to select gate lines SGD and SGS that are in contact with a memory pillar MP to which a memory cell MC (for example, MC(2)) to be selected belongs. Thereby, inversion layers are formed in the semiconductor layer 32 corresponding to the select transistors ST(1) and ST(2), allowing a current to flow therethrough (the on state). This brings the bit line BL, the select transistors ST(1) and ST(2), and the semiconductor layer 32 of the memory pillar MP, ends of which are respectively in contact with the select transistors ST(1) and ST(2), into conduction. Furthermore, for example 0 [V] or a voltage VSS is applied to a word line WL(2) corresponding to the selected memory cell MC(2), and a predetermined voltage (for example, a voltage VSON) is applied to word lines WL(0), (1), and (3) to (15) corresponding to the non-selected memory cells MC. Thereby, a current path between the bit line BL and the source line SL flows through a memory element MR in the memory cell MC(2) to be selected, and flows through the semiconductor layer 32 of selectors SW in the non-selected memory cells MC(0), (1) and (3) to (15).

The present modification can also attain the same advantages as those of the second embodiment.

<2-10> Fifth Modification

Figure 43:
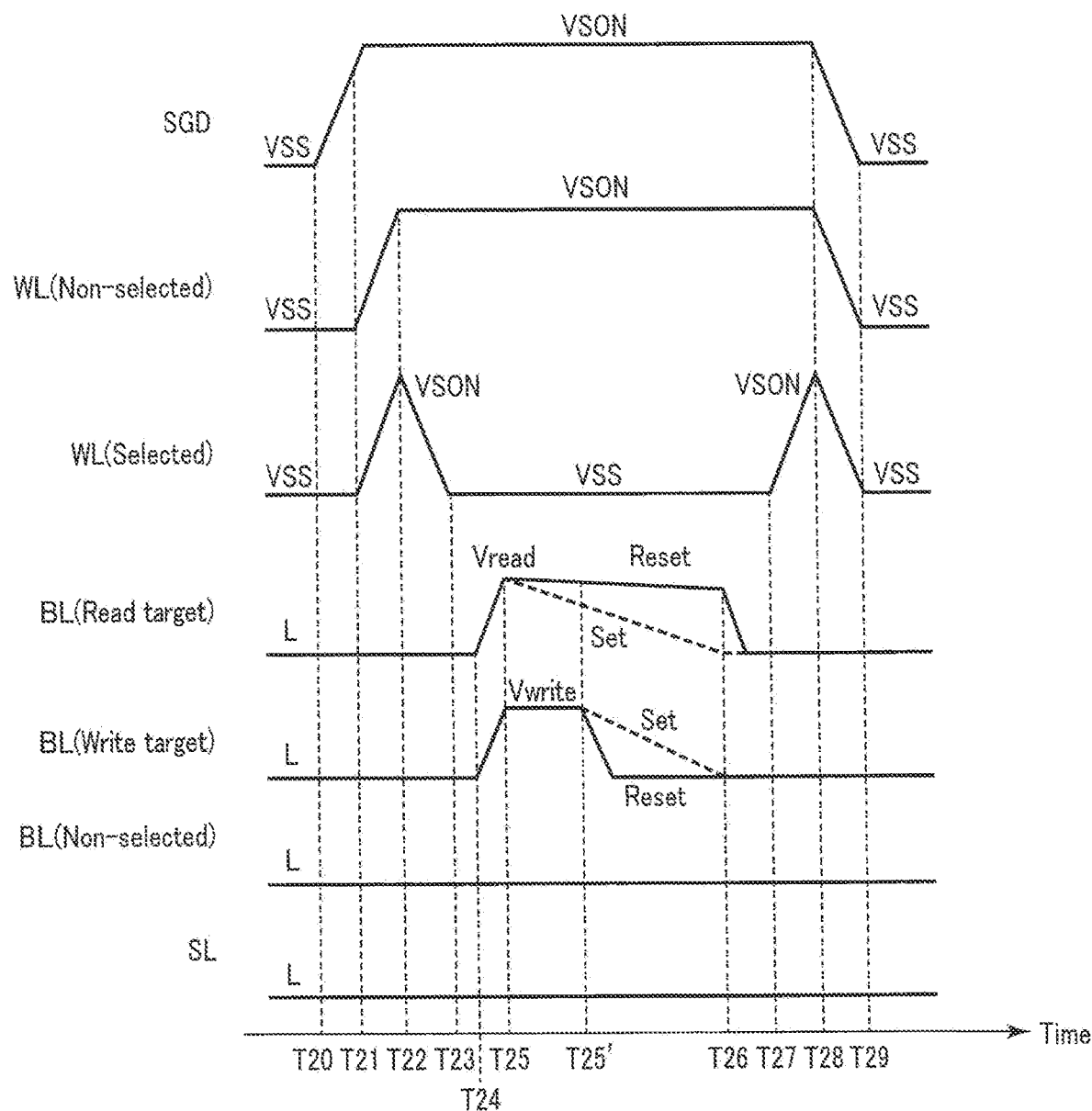
FIG. 43 is a timing chart, showing an operation waveform in a memory chip according to a fifth modification, of the second embodiment.

A fifth modification of the second embodiment will be described with reference to FIG. 43. FIG. 43 is a timing chart showing an operation waveform according to the fifth modification of the second embodiment. FIG. 43 shows a case in which the timing chart of the read operation of the second embodiment described with reference to FIG. 30 is applied to a memory string MS that is not provided with the select transistor ST(2) described for the first embodiment.

As shown in FIG. 43, even if the select transistor ST(2) is not provided in the memory string MS, the same operation as that of the second embodiment shown in FIG. 30 can be performed by omitting the select gate line SGS in the second embodiment of FIG. 30.

The present modification can also attain the same advantages as those of the second embodiment.

<2-11> Sixth Modification

A sixth modification of the second embodiment will be described.

The operation waveform of the first embodiment described with reference to FIG. 14 may be applied to a configuration of the memory string MS of the second embodiment and the first to fourth modifications of the second embodiment. In other words, the operation waveform shown in FIG. 14 may be applied to the memory string MS having the select transistor ST(2). In this case, the operation waveform of the select gate line SGD described with reference to FIG. 14 is the same as the operation waveform of the select gate line SGS of the memory cell string MS according to the second embodiment and the second to fourth modifications of the second embodiment. More specifically, in FIG. 14, the voltages of the select gate lines SGD and SGS are first set to VSS. Next, in a period from time T0 to time T2, the voltages of the select gate lines SGD and SGS are increased from VSS to VSON. Then, the voltages of the select gate lines SGD and SGS are maintained at VSON in a period from time T2 to T5, and decreased from VSON to VSS in a period from time T5 to time T7.

The present embodiment can also attain the same advantages as those of the first embodiment.

<3> Third Embodiment

<3-1> Operation Waveform

Figure 44:
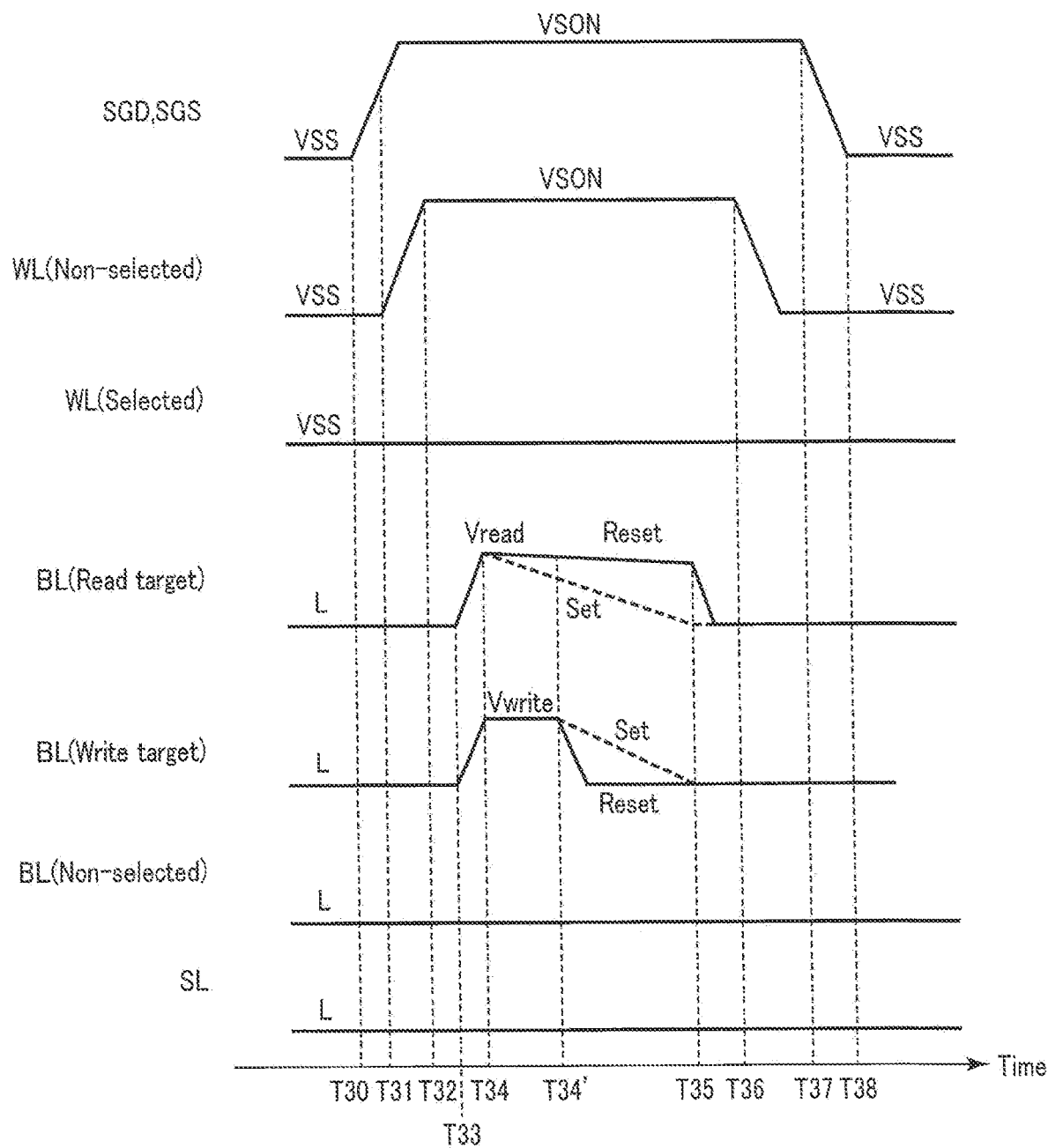
FIG. 44 is a timing chart showing an operation waveform in a memory chip according to a third embodiment.

A third embodiment will be described with reference to FIG. 44. FIG. 44 is a timing chart showing an operation waveform according to the third embodiment. FIG. 44 shows an operation waveform in a memory cell string MS according to the second embodiment and the first to fourth modifications of the second embodiment. The present embodiment intends to reduce a disturbance at the time when the voltages of a non-selected word lines are decreased. Hereinafter, the explanation will focus mainly on matters which differ from the first and second embodiments.

First, a read operation will be described. At time T30, the sequencer 170 maintains the voltage of the bit line BL (bit line voltage) and the voltage of the source line SL (source line voltage) at the L level, and the voltages of the word lines WL at VSS, and increases the voltages of the select gate lines SGD and SGS from VSS to VSON. In other words, at time T30, the selectors SW of all memory cells MC are in the off state.

At time T31, the voltages of the select gate lines SGD and SGS become VMON. At this time, the transistors ST(1) and ST(2) are in the on state.

At time T31, when the voltages of the select gate lines SGD and SGS are increased to at least VMQN, the sequencer 170 increases the voltages of the non-selected word lines WL from VSS to VSON.

At time T33, the voltages of the select gate lines SGD and SGS and the voltages of the non-select word lines WL becomes VSON, and the voltage of the selected word line WL becomes VSS. Accordingly, in a period from time T33 to time T36, the selectors SW of the non-selected memory cells MC among the memory cells MC in the selected memory cell string MS are in the on state.

At time T33, the sequencer 170 increases the voltage of the selected bit line BL from the L level to the H level.

At time T34, the sequencer 170 applies the read voltage Vread to the bit line BL, and then brings the bit line BL to a floating state. Accordingly, the voltage of the bit line BL is gradually decreased (the voltage is substantially maintained until time T35) when the selected memory cell MC is in the high-resistance (reset) state, and the voltage of the bit line BL is rapidly decreased when the selected memory cell MC is in the low-resistance (set) state. As a sense operation, after a predetermined period of time has passed after the voltage Vread is applied to the bit line BL, for example at time T35, the sense amplifier 140 senses the H level or L level by comparing the voltage of the bit line BL with a reference potential.

At time T36, the sequencer 170 decreases the voltages of the non-selected word lines WL from VSON to VSS.

At time T37 when the voltages of the word lines WL are decreased to VSS, the sequencer 170 decreases the voltages of the select gate lines SGD and SGS from VSON to VSS.

At time T38, the select transistors ST(1) and ST(2) and the selectors SW of all memory cells MC are in the off state.

In the third embodiment, when the voltages of the non-selected word lines are decreased, the advantage of reducing a disturbance can be attained in the same manner as in the first and second embodiments.

Next, a write operation will be described below. As described above with reference to FIG. 14 of the first embodiment, the operation waveforms of the select gate lines SGD and SGS, the word lines WL, and the source line SL are the same in both the read operation and the write operation. In the case of the write operation, in a period from time T33 to time T34, the sequencer 170 increases the voltage of the bit line BL from the L level to the voltage Vwrite. Next, in a period from time T34 to time T34', the sequencer 170 applies a pulse of the voltage Vwrite to the bit line BL.

For example, in a period from time T34' to time T35, when the voltage of the bit line BL is rapidly decreased from Vwrite to the L level, the memory element MR turns to a high-resistance reset state. In the period from time T34' to time T35, when the voltage of the bit line BL is gradually decreased from Vwrite to the L level, the memory element MR turns to a low-resistance set state.

<3-2> First Modification

A first modification of the third embodiment will be described.

An operation waveform of the third embodiment described with reference to FIG. 44 can also be applied to a memory string MS that is not provided with the select transistor ST(2) described for the first embodiment. More specifically, even in a memory string MS that is not provided with the transistor ST(2), the same operation as that of the third embodiment shown in FIG. 44 can be performed by omitting the select gate line SGS in the third embodiment of FIG. 44.

The present modification can also attain the same advantages as those of the third embodiment.

<4> Fourth Embodiment

<4-1> Overview

Figure 45:
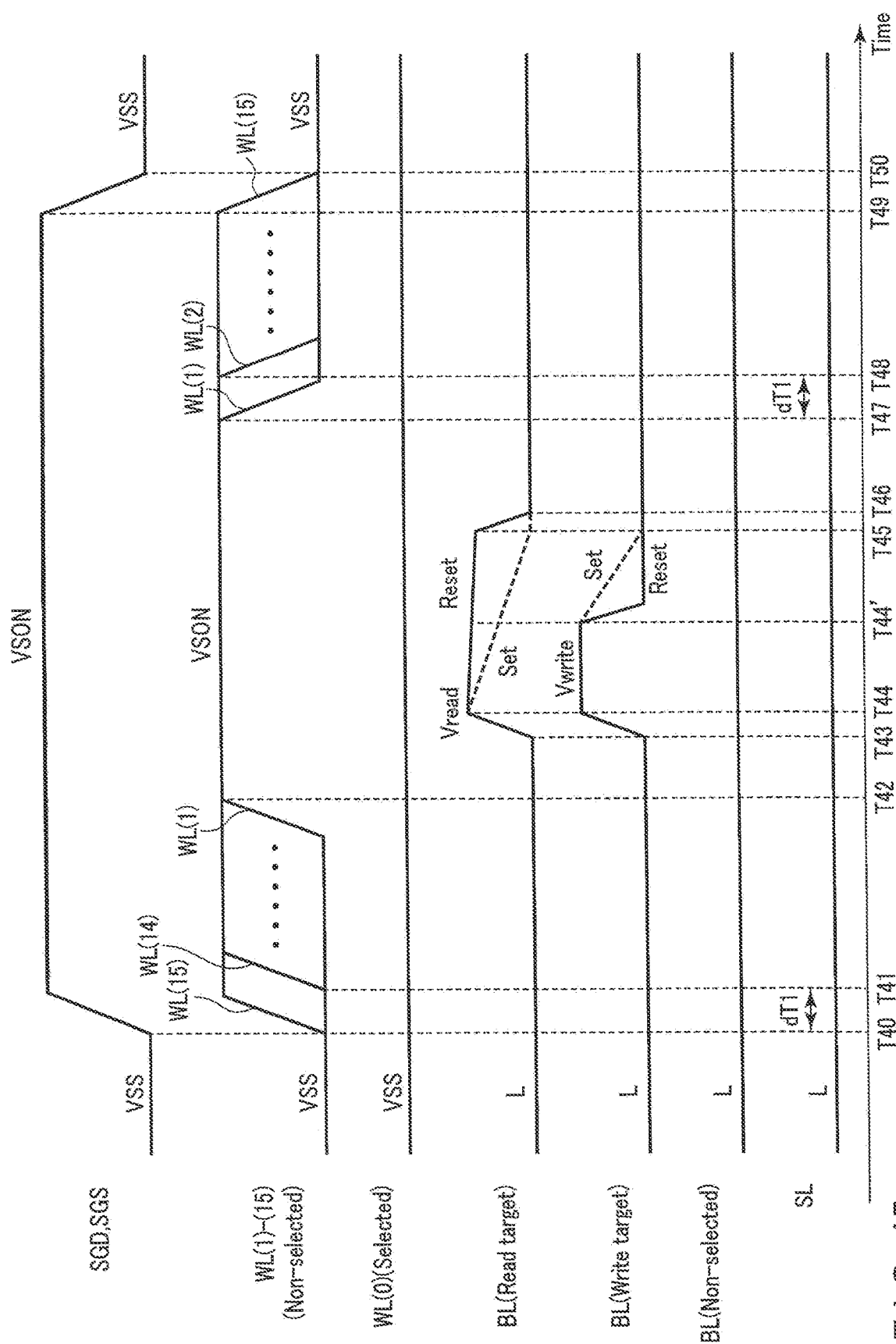
FIG. 45 is a timing chart showing an operation waveform in a memory chip according to a fourth embodiment.

A fourth embodiment will be described with reference to FIG. 45. FIG. 45 is a timing chart showing an operation waveform according to the fourth embodiment. FIG. 45 is a timing chart showing an operation waveform in a memory cell string MS when a word line WL(0) is selected, according to the second embodiment and the first to fourth modifications of the second embodiment. Hereinafter, the description will focus mainly on matters different from those of the first to third embodiments.

First, a read operation will be described. At time T40, the sequencer 170 maintains the voltage of the bit line BL (bit line voltage) and the voltage of the source line SL (source line voltage) at the L level, and the voltage of the selected word line WL(0) at VSS, and increases the voltages of the select gate lines SGD and SGS from VSS to VSON. Furthermore, in a period from time T40 to time T42, the sequencer 170 increases the voltages of the non-selected word lines WL(1) to WL(15) at intervals of a first period of dT1 from VSS to VSON in the order of the non-selected word lines WL(15) to WL(1). The voltages of the select gate lines SGD and SGS may be increased earlier than the first non-selected word line WL (the non-selected word line WL (15) in the example of FIG. 45), or may be increased at the same time when the voltage of the first non-selected word line WL is increased.

Thus, the selectors SW of the non-selected memory cells MC(15) to MC(1) are sequentially turned on.

In other words, the sequencer 170 sequentially increases the voltages of the non-selected word lines WL in the order from a position farthest from the selected word line WL toward the selected word line WL. In the case shown in FIG. 45, the voltages of the word lines are sequentially increased in the order from the lower portion of the memory cell string MS (namely, the word line WL (15)) toward the upper portion (namely, the word line WL (1)). Accordingly, the potential that has increased by the coupling can easily be released toward the source line, and the disturbance can be reduced.

At time T43, the sequencer 170 increases the voltage of the selected bit line BL from the L level to the read voltage Vread.

At tine T44, the sequencer 170 applies the read voltage Vread to the bit line BL, and then brings the bit line BL to a floating state. Thereby, the voltage of the bit line BL is gradually decreased when the selected memory cell MC is in the high-resistance (reset) state, and the voltage of the bit line BL is rapidly decreased when the selected memory cell MC is in the low-resistance (set) state. As a sense operation, after a predetermined period of time has passed after the voltage Vread is applied to the bit line BL, for example at time T45, the sense amplifier 140 senses the H level or L level by comparing the voltage of the bit line BL with a reference potential.

In a period from time T47 to time T50, the sequencer 170 sequentially decreases the voltages of the non-selected word lines WL(1) to WL(15) from VSOH to VSS at intervals of a first period of dT1. Thus, the selectors SW of the non-selected memory cells MC(1) to MC(15) are sequentially turned off. Accordingly, the potential that has decreased by the coupling can easily be released toward the source line SL, and the disturbance can be reduced.

At time T49, the sequencer 170 decreases the voltages of the select gate lines SGD and SGS from VSON to VSS. The voltages of the select gate lines SGD and SGS may be decreased later than the last non-selected word line WL (the non-selected word line WL(15) in the example of FIG. 45), or may be decreased at the same time when the voltage of the last non-selected word line WL is decreased.

At time T50, the select transistors ST(1) and ST(2) and the selectors SW of all memory cells MC are in the off state.

Next, a write operation will be described below. As described above with reference to FIG. 14 of the first embodiment, the operation waveforms of the select gate lines SGD and SGS, the word lines WL, and the source line SL are the same in both the read operation and the write operation. In the case of the write operation, in a period from time T43 to time T44, the sequencer 170 increases the voltage of the bit line BL from the L level to the voltage Vwrite. Next, in a period from time T44 to time T44', the sequencer 170 applies a pulse of the voltage Vwrite to the bit line BL.

For example, in a period from time T44' to time T45, when the voltage of the bit line BL is rapidly decreased from Vwrite to the L level, the memory element MR turns to a high-resistance reset state. In the period from time T44' to time T45, when the voltage of the bit line BL is gradually decreased from Vwrite to the L level, the memory element MR turns to a low-resistance set state.

According to the fourth embodiment, the same advantages as those of the second embodiment can be attained.

<4-2> First Modification

Figure 46:
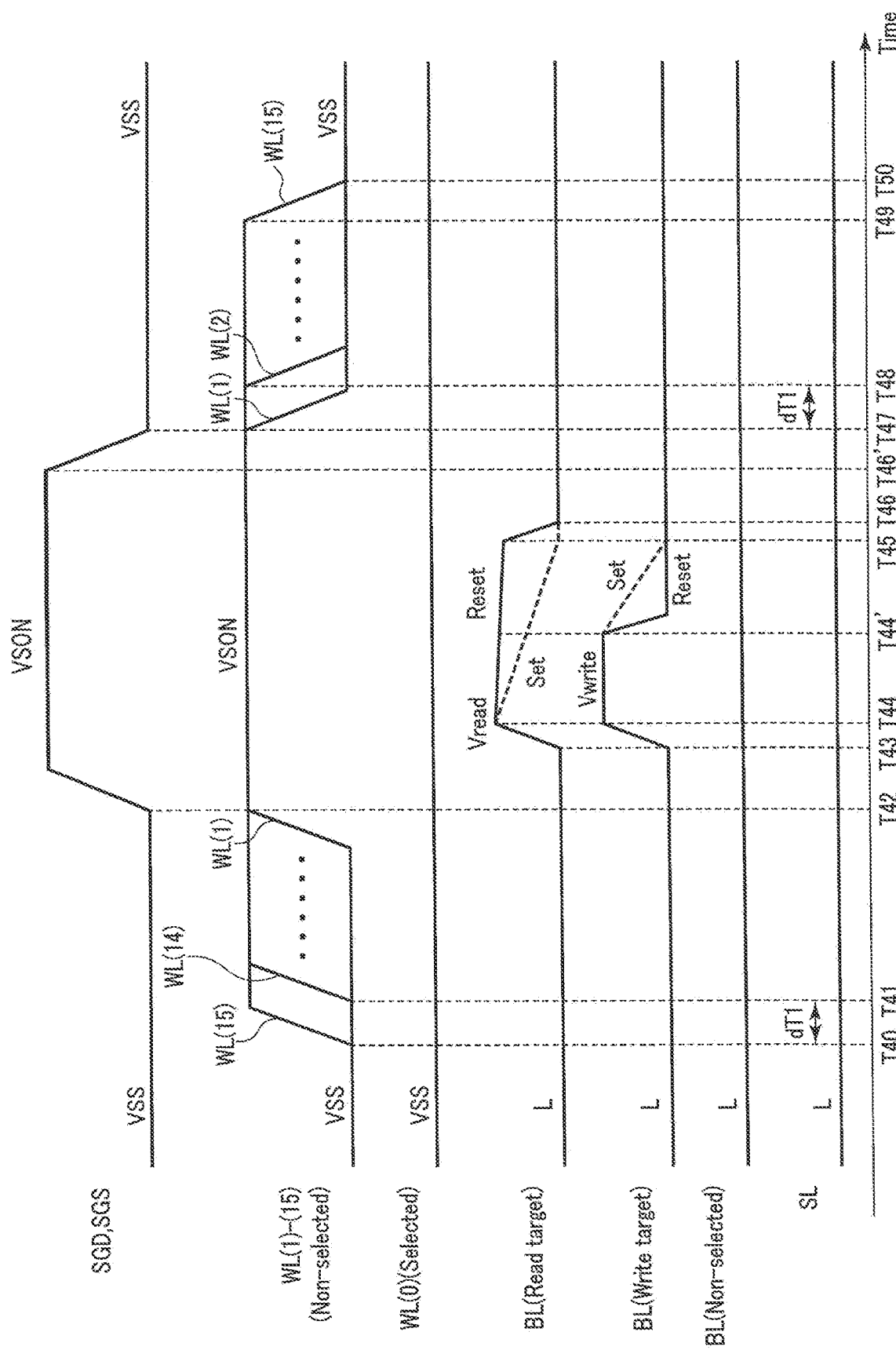
FIG. 46 is a timing chart showing an operation waveform in a memory chip according to a first modification of the fourth embodiment.

A first modification of the fourth embodiment will be described with reference to FIG. 46. FIG. 46 is a timing chart showing an operation waveform according to the first modification of the fourth embodiment. FIG. 46 shows a timing chart of an operation waveform when a word line WL(0) is selected. In the timing chart of FIG. 46, the waveforms of the select gate lines SGD and SGS are different from those of the timing chart of the fourth embodiment shown in FIG. 45. Hereinafter, differences from FIG. 45 will be mainly explained.

In a period from time T40 to T50, the voltages of the word lines WL, the bit lines BL, and the source line SL are the same as those shown in FIG. 45.

The sequencer 170 increases the voltages of the non-selected word lines WL(1) to WL(15) from VSS to VSON. Thereafter, at time T42, the sequencer 170 increases the voltages of the select gate lines SGD and SGS from VSS to VSON. The voltages of the select gate lines SGD and SGS may be increased at the same time as the last non-selected word line WL (the non-selected word line WL(1) in the example of FIG. 46).

At time T46', the sequencer 170 decreases the voltages of the select gate lines SGD and SGS from VSON to VSS. In other words, after the voltages of the select gate lines SGD and SGS are decreased, the voltages of non-selected word lines WL are sequentially decreased. The voltages of the select gate lines SGD and SGS may be decreased at the same time as the first non-selected word line WL (the non-selected word line WL(1) in the example of FIG. 46). Accordingly, at a given time, coupling noise is applied to either one of the source and the drain of the selector SW of a non-selected memory cell MC due to a decrease in the voltage of an adjacent non-selected word line WL. When the coupling noise has attenuated, coupling noise is applied to the other of the source and the drain of the selector SW of the non-selected memory cell MC due to a decrease in the voltage of the adjacent word line WL. Therefore, in the case of sequentially decreasing the voltages of the non-selected word lines WL, the coupling noise applied to the non-selected memory cells MC is smaller than in the case of decreasing the voltages of all the non-selected word lines WL at one time.

According to the first modification of the fourth embodiment, the same advantages as those of the first to third embodiment can be attained.

<4-3> Second Modification

A second modification of the fourth embodiment will be described with reference to FIG. 47. FIG. 47 is a timing chart showing an operation waveform according to the second modification of the fourth embodiment. FIG. 47 shows a timing chart of an operation waveform when a word line WL(7) is selected.

First, a read operation will be described. At time T60, the sequencer 170 maintains the voltage of the bit line BL (bit line voltage) and the voltage of the source line SL (source line voltage) at the L level, and increases the voltage of the selected word line WL(7) and the voltages of select gate lines SGD and SGS from VSS to VSON.

Furthermore, in a period from time T60 to T62, the sequencer 170 sequentially increases the voltages of the non-selected word lines WL(0) to WL(6) and WL(8) to WL(155 in the order from a position farthest in the Z direction (upper and lower portions of the memory string MS) from the selected word line WL(7) toward a position closest to the selected word line WL at intervals of a first period of dT1.

More specifically, at time T60, the sequencer 170 maintains the voltages of the non-selected word lines WL(1) to WL(6) and WL(8) to WL(14) at VSS, and increases the voltages of the non-selected word lines WL(0) and WL(15) from VSS to VSON. Accordingly, first, the selectors SW of the non-selected memory cells MC(0) and MC(15) are turned on.

Next, after the first period of dT1 has passed since time T60 (at time T61), the sequencer 170 increases the voltages of the non-selected word lines WL(1) and WL(14) from VSS to VSON. Thus, the selectors SW of the non-selected memory cells MC(1) and MC(14) are turned on.

After the first period dT1 has further passed, the sequencer 170 increases the voltages of the non-selected word lines WL(2) and WL(13) from VSS to VSON. Thus, the selectors SW of the non-selected memory cells MC(2) and MC(13) are turned on.

After the first period dT1 has further passed, the sequencer 170 increases the voltages of the non-selected word lines WL(3) and WL(12) from VSS to VSON. Thus, the selectors SW of the non-selected memory cells MC(3) and MC(12) are turned on.

After the first period dT1 has further passed, the sequencer 170 increases the voltages of the non-selected word lines WL(4) and WL(11). Thus, the selectors SK of the non-selected memory cells MC(4) and MC(11) are turned on.

After the first period dT1 has further passed, the sequencer 170 increases the voltages of the non-selected word lines WL(5) and WL(10) from VSS to VSON. Thus, the selectors SW of the non-selected memory cells MC(5) and MC(10) are turned on.

After the first period dT1 has further passed, the sequencer 170 increases the voltages of the non-selected word lines WL(6) and WL(9) from VSS to VSON. Thus, the selectors SW of the non-selected memory cells MC(6) and MC(9) are turned on.

After the first period dT1 has further passed, the sequencer 170 increases the voltage of the non-selected word line WL(8) from VSS to VSON. Thus, the selector SW of the non-selected memory cell MC(8) is turned on.

In a period from time T63 to time T64, the sequencer 170 increases the voltage of the selected bit line BL from the L level to the read voltage Vread.

The voltages of the select gate lines SGD and SGS may be increased earlier than or at the same time as the first non-selected word lines WL (the non-selected word lines WL(0) and WL(15) in the example of FIG. 47).

At time T64, the sequencer 170 applies the read voltage Vread to the bit line BL, and then brings the bit line BL to a floating state. Accordingly, the voltage of the bit line BL is gradually decreased (the voltages is substantially maintained until time T65) when the selected memory cell MC is in the high-resistance (reset) state, and the voltage of the bit line BL is rapidly decreased when the selected memory cell MC is in the low-resistance (set) state. As a sense operation, after a predetermined period of time has passed after the voltage Vread is applied to the bit line BL, for example at time T65, the sense amplifier 140 senses the H level or L level by comparing the voltage of the bit line BL with a reference potential.

Furthermore, in a period from time T67 to T70, the sequencer 170 decreases the voltages of the non-selected word lines WL(0) to WL(6) and WL(8) to WL(15) in the order from a position closest in the Z direction from the selected word line WL(7) toward a position farthest from the selected word line WL at intervals of a first period of dT1.

More specifically, at time T67, first, the sequencer 170 decreases the voltage of the non-selected word line WL(8) from VSON to VSS. Accordingly, first, the selector SW of the non-selected memory cell MC(8) is turned off.

Next, after the first period of a71 has passed since time T67 (at time T88), the sequencer 170 decreases the voltages of the non-selected word lines WL(6) and WL(9) from VSON to VSS. Thus, the selectors SW of the non-selected memory cells MC(6) and MC(9) are turned off.

After the first period dT1 has further passed, the sequencer 170 decreases the voltages of the non-selected word lines WL(5) and WL(10) from VSON to VSS. Thus, the selectors SW of the non-selected memory cells MC(5) and MC(10) are turned off.

After the first period dT1 has further passed, the sequencer 170 decreases the voltages of the non-selected word lines WL(4) and WL(11) from VSON to VSS. Thus, the selectors SW cf the non-selected memory cells MC(4) and MC(11) are turned off.

After the first period dT1 has further passed, the sequencer 170 decreases the voltages of the non-selected word lines WL(3) and WL(12) from VSON to VSS. Thus, the selectors SW of the non-selected memory cells MC(3) and MC(12) are turned off.

After the first period dT1 has further passed, the sequencer 170 decreases the voltages of the non-selected word lines WL(2) and WL(13) from VSON to VSS. Thus, the selectors SW of the non-selected memory cells MC(2) and MC(13) are turned off.

After the first period dT1 has further passed, the sequencer 170 decreases the voltages cf the non-selected word lines WL(1) and WL(14) from VSON to VSS. Thus, the selectors SW of the non-selected memory cells MC(1) and MC(14) are turned off.

After the first period dT1 has further passed, the sequencer 170 decreases the voltages of the non-selected word lines WL(0) and WL(15) from VSON to VSS. Thus, the selectors SW of the non-selected memory cells MC(0) and MC(15) are turned off.

Accordingly, the internal node potential that has increased by the coupling can easily be released toward the drain or source side, so that the potential difference between both electrodes of the memory element MR can be reduced, thereby reducing the disturbance.

At time T69, the sequencer 170 decreases the voltages of the select gate lines SGD and SGS from VSON to VSS.

The voltages of the select gate lines SGD and SGS may be decreased later than or at the same time as the last non-selected word lines WL (the non-selected word lines WL(0) and WL(15) in the example of FIG. 47).

Next, a write operation will be described below. As described above with reference to FIG. 14 of the first embodiment, the operation waveforms of the select gate lines SGD and SGS, the word lines WL, and the source line SL are the same in both the read operation and the write operation. In the case of the write operation, in a period from time T63 to time T64, the sequencer 170 increases the voltage of the bit line BL from the L level to the voltage Vwrite. Next, in a period from time T64 to time T64', the sequencer 170 applies a pulse of the voltage Vwrite to the bit line BL.

For example, in a period from time T64' to time T65, when the voltage of the bit line BL is rapidly decreased from Vwrite to the L level, the memory element MR turns to a high-resistance reset state. In the period from time T65' to time T66, when the voltage of the bit line BL is gradually decreased from Vwrite to the L level, the memory element MR turns to a low-resistance set state.

According to the second modification of the fourth embodiment, the same advantages as those of the second embodiment can be attained.

<4-4> Third Modification

A third modification of the fourth embodiment will be described with reference to FIG. 48. FIG. 48 is a timing chart showing an operation waveform according to the third modification of the fourth embodiment. FIG. 48 shows a timing chart of an operation waveform when a word line WL(7) is selected. In the timing chart of FIG. 48, the waveforms of the select gate lines SGD and SGS are different from those of the timing chart of FIG. 47 according to the second modification of the third embodiment. Hereinafter, differences from FIG. 47 will be mainly explained.

In a period from time T60 to T70, the voltages of the word lines WL, the bit lines BL, and the source line SL are the same as those shown in FIG. 47.

The sequencer 170 increases the voltages of the non-selected word lines WL(0) to WL(6) and WL(8) to WL(15) from VSS to VSON in a period from time T60 to time T62. Thereafter, at time T62, the sequencer 170 increases the voltages of the select gate lines SGD and SGS from VSS to VSON. The voltages of the select gate lines SGD and SGS may be increased later than or at the same time as the last non-selected word line WL (the non-selected word line WL(8) in the example of FIG. 48).

At time T66', the sequencer 170 decreases the voltage of the select gate line SGD from VSON to VSS. In other words, after the voltages of the select gate line SGD is decreased, the voltages of non-selected word lines WL are sequentially decreased. The voltage of the select gate line SGD may be decreased at the same time as the first non-selected word line WL (the non-selected word line WL(8) in the example cf FIG. 48). Accordingly, at a given time, coupling noise is applied to either one of the source and the drain of the selector SW of a non-selected memory cell MC due to a decrease in the voltage of an adjacent non-selected word line WL. When the coupling noise has attenuated, coupling noise is applied to the other of the source and the drain of the selector SW of the non-selected memory cell MC due to a decrease in the voltage of the adjacent non-selected word line WL. Therefore, in the case of sequentially decreasing the voltages of the non-selected word lines WL, the coupling noise applied to the non-selected memory cells MC is smaller than in the case of decreasing the voltages of all the non-selected word lines WL at one time.

At time T69, the sequencer 170 decreases the voltage of the select gate line SGS from VSON to VSS. The sequencer 170 may decrease, at time T66', the voltage of the select gate line SGS from VSON to VSS. The voltage of the select gate line SGS may be decreased later than or at the same time as the last non-selected word lines WL (the non-selected word lines WL(0) and WL(15) in the example of FIG. 48).

According to the third modification of the fourth embodiment, the same advantages as those of the second embodiment can be attained.

The second to fourth embodiments have been described for the case including a select gate line SGS, as an example; however, in these embodiments, the select gate line SGS may be deleted. In that case, the select gate lines SGD and SGS shall be simply read as the select gate line SGD. The select gate line SGS shall be deleted from the drawings.

<5> Others

While several embodiments have been described, these embodiments have been presented by way of example and are not intended to limit the scope of the invention. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A memory device comprising:
a variable resistance memory region extending in a first direction that is orthogonal to a semiconductor substrate;
a semiconductor layer extending in the first direction and being in contact with the variable resistance memory region;
an insulating layer extending in the first direction and being in contact with the semiconductor layer;
a first word line extending in a second direction that is orthogonal to the first direction and being in contact with the insulating layer;
a second word line extending in the second direction, being in contact with the insulating layer, and being located at a position different from the first word line in the first direction;
a first select gate line extending in the second direction and being in contact with the insulating layer; and
a bit line extending in a third direction that is orthogonal to the first direction and the second direction and being in contact with the semiconductor layer,
wherein
in a first plane defined by the second direction and the third direction, a portion where the variable resistance memory region, the semiconductor layer, and the insulating layer intersect the first word line functions as a first memory cell,
in the first plane, a portion where the variable resistance memory region, the semiconductor layer, and the insulating layer intersect the second word line functions as a second memory cell,
in the first plane, a portion where the semiconductor layer and the insulating layer intersect the first select gate line functions as a first select transistor, and
when information stored in the first memory cell is read, or when information is written into the first memory cell,
after a voltage of the first select gate line is set to a first voltage, and a voltage of the first word line and a voltage of the second word line are set to a second voltage higher than the first voltage,
the voltage of the first select gate line is increased from the first voltage to a third voltage higher than the second voltage, and
after the voltage of the first select gate line is increased to at least the second voltage,
the voltage of the first word line is decreased from the second voltage to the first voltage, and
the voltage of the second word line is increased from the second voltage to a fourth voltage.

2. The memory device according to claim 1, further comprising:
a second select gate line extending in the second direction and being in contact with the insulating layer,
wherein
in the first plane, a portion where the semiconductor layer and the insulating layer intersect the second select gate line functions as a second select transistor,
in the first direction, the first memory cell and the second memory cell are sandwiched between the first select transistor and the second select transistor, and
when information stored in the first memory cell is read, or when information is written into the first memory cell,
after the voltage of the first select gate line and a voltage of the second select gate line are set to the first voltage, and the voltage of the first word line and the voltage of the second word line are set to the second voltage,
the voltage of the first select gate line and the voltage of the second select gate line are increased from the first voltage to the third voltage, and
after the voltage of the first select gate line and the voltage of the second select gate line are increased to at least the second voltage,
the voltage of the first word line is decreased from the second voltage to the first voltage, and
the voltage of the second word line is increased from the second voltage to the fourth voltage.

3. The memory device according to claim 1, wherein when information stored in the first memory cell is read, or when information is written into the first memory cell,
after the voltage of the first word line is decreased from the second voltage to the first voltage and the voltage of the second word line is increased from the second voltage to the fourth voltage,
the voltage of the first select gate line is set to the first voltage, and the voltage of the first word line and the voltage of the second word line are set to the second voltage.

4. The memory device according to claim 2, wherein
when information stored in the first memory cell is read, or when information is written into the first memory cell,
after the voltage of the first word line is decreased from the second voltage to the first voltage and the voltage of the second word line is increased from the second voltage to the fourth voltage,
the voltage of the first select gate line and the voltage of the second select gate line are set to the first voltage, and the voltage of the first word line and the voltage of the second word line are set to the second voltage.

5. The memory device according to claim 3, wherein
when information stored in the first memory cell is read,
after the voltage of the first word line is decreased from the second voltage to the first voltage and the voltage of the second word line is increased from the second voltage to the fourth voltage,
a fifth voltage higher than the first voltage is applied to the bit line,
after the fifth voltage is applied to the bit line,
the bit line is brought to a floating state, and
after the voltage of the bit line attenuates from the fifth voltage to a sixth voltage lower than the fifth voltage, the voltage of the first word line and the voltage of the second word line are set to the second voltage.

6. The memory device according to claim 3, wherein
when information is written into the first memory,
after the voltage of the first, word line is decreased from the second voltage to the first voltage and the voltage of the second word line is increased from the second voltage to the fourth voltage,
a seventh voltage higher than the first voltage is applied to the bit line, and
after the voltage of the bit line is decreased from the seventh voltage to the first voltage,
the voltage of the first word line and the voltage of the second word line are set to the second voltage.

7. The memory device according to claim 1, further comprising:
a source line being in contact with the semiconductor layer;
a plurality of third memory cells including the first memory cell and the second memory cell; and
a memory cell string including the first select transistor and the third memory cells, the third memory cells being coupled in series in the first direction, the first select transistor being coupled to a first end of the third memory cells coupled in series, and the source line being coupled to a second end of the third memory cells.

8. The memory device according to claim 2, further comprising:
a source line being in contact with the semiconductor layer;
a plurality of third memory cells including the first memory cell and the second memory cell; and
a memory cell string including the first select transistor, the second select transistor, and the third memory cells, the third memory cells being coupled in series in the first direction, the first select transistor being coupled to a first end of the third memory cells coupled in series, and the source line being coupled to a second end of the third memory cells via the second select transistor.

9. The memory device according to claim 1, wherein
the third voltage and the fourth voltage are equal.

10. The memory device according to claim 1, further comprising;
a source line being in contact with the semiconductor layer; and
a plurality of third memory cells including the first memory cell and the second memory cell,
wherein
the second voltage is a voltage that strongly inverts the plurality of third memory cells when the first voltage is applied to the source line.

11. The memory device according to claim 1, wherein
the portion that functions as the first select transistor is provided with the variable resistance memory region.

12. The memory device according to claim 2, wherein
the portion that functions as the second select transistor is provided with the variable resistance memory region.

13. The memory device according to claim 1, further comprising:
a source line being in contact with the semiconductor layer; and
a plurality of third memory cells including the first memory cell and the second memory cell,
wherein
the third voltage is a voltage that strongly inverts the first select transistor and the plurality of third memory cells when the first voltage is applied to the source line.

14. The memory device according to claim 1, wherein
the third voltage is higher than a sum of a voltage of the bit line and a threshold voltage of the first select transistor.

15. A memory device comprising:
a variable resistance memory region extending in a first direction that is orthogonal to a semiconductor substrate;
a semiconductor layer extending in the first direction and being in contact with the variable resistance memory region;
an insulating layer extending in the first direction and being in contact with the semiconductor layer;
a first word line extending in a second direction that is orthogonal to the first direction and being in contact with the insulating layer;
a second word line extending in the second direction, being in contact with the insulating layer, and being located at a position different from the first word line in the first direction;
a first select gate line extending in the second direction and being in contact with the insulating layer; and
a bit line extending in a third direction that is orthogonal to the first direction and the second direction, and being in contact with the semiconductor layer,
wherein
in a first plane defined by the second direction and the third direction, a portion where the variable resistance memory region, the semiconductor layer, and the insulating layer intersect the first word line functions as a first memory cell,
in the first plane, a portion where the variable resistance memory region, the semiconductor layer, and the insulating layer intersect the second word line functions as a second memory cell,
in the first plane, a portion where the semiconductor layer and the insulating layer intersect the first select gate line functions as a first select transistor, and
when information stored in the first memory cell is read, or when information is written into the first memory cell, after a voltage of the first select gate line, a voltage of the first word line, and a voltage of the second word line are set to a first voltage,
the voltage of the first select gate line is increased from the first voltage to a third voltage higher than the first voltage,
after at least the voltage of the first select gate line is increased to a second voltage between the first voltage and the third voltage,
the voltage of the first word line and the voltage of the second word line are increased from the first voltage to a fourth voltage, and
after the voltage of the first word line and the voltage of the second word line become the fourth voltage, the voltage of the first word line is decreased from the fourth voltage to the first voltage.

16. The memory device according to claim 15, further comprising:
a second select gate line extending in the second direction and being in contact with the insulating layer, wherein
in the first plane, a portion where the semiconductor layer and the insulating layer intersect the second select gate line functions as a second select transistor,
in the first direction, the first memory cell and the second memory cell are sandwiched between the first select transistor and the second select transistor, and
when information stored in the first memory cell is read, or when information is written into the first memory cell,
after the voltage of the first select gate line, a voltage of the second select gate line, the voltage of the first word line, and the voltage of the second word line are set to the first voltage,
the voltage of the first select gate line and the voltage of the second select gate line are increased from the first voltage to the third voltage,
after the voltage of the first select gate line and the voltage of the second select gate line are increased to at least the second voltage,
the voltage of the first word line and the voltage of the second word line are increased from the first voltage to the fourth voltage, and
after the voltage of the first word line and the voltage of the second word line become the fourth voltage, the voltage of the first word line is decreased from the fourth voltage to the first voltage.

17. The memory device according to claim 15, further comprising:
a source line being in contact with the semiconductor layer;
a plurality of third memory cells including the first memory cell and the second memory cell; and
a memory cell string including the first select transistor and the third memory cells, the third memory cells being coupled in series in the first direction, the first select transistor being coupled to a first end of the third memory cells coupled in series, and the source line being coupled to a second end of the third memory cells.

18. The memory device according to claim 16, further comprising:
a source line being in contact with the semiconductor layer;
a plurality of third memory cells including the first memory cell and the second memory cell; and
a memory cell string including the first select transistor, the second select transistor, and the third memory cells, the third memory cells being coupled in series in the first direction, the first select transistor being coupled to a first end of the third memory cells coupled in series, and the source line being coupled to a second end of the third memory cells via the second select transistor.

19. The memory device according to claim 15, wherein when information stored in the first memory cell is read,
after the voltage cf the first word line is decreased from the fourth voltage to the first voltage,
a fifth voltage higher than the first voltage is applied to the bit line,
after the fifth voltage is applied to the bit line, the bit line is brought to a floating state,
after the voltage of the bit line attenuates to a sixth voltage lower than the fifth voltage,
the voltage of the first word line is increased from the first voltage to the fourth voltage, and
after the voltage of the first word line and the voltage of the second word line become the fourth voltage,
the voltage of the first select gate line is decreased from the third voltage to the first voltage, and
the voltage of the first word line and the voltage of the second word line are decreased from the fourth voltage to the first voltage.

20. The memory device according to claim 15, wherein when information is written into the first memory cell,
after the voltage of the first word line is decreased from the fourth voltage to the first voltage,
a seventh voltage higher than the first voltage is applied to the bit line,
after the voltage of the bit line is decreased from the seventh voltage to the first voltage,
the voltage of the first word line is increased from the first voltage to the fourth voltage, and
after the voltage of the first word line and the voltage of the second word line become the fourth voltage,
the voltage of the first select gate line is decreased from the third voltage to the first voltage, and
the voltage of the first word line and the voltage of the second word line are decreased from the fourth voltage to the first voltage.

21. The memory device according to claim 16, wherein when information stored in the first memory cell is read,
after the voltage of the first word line is decreased from the fourth voltage to the first voltage,
a fifth voltage higher than the first voltage is applied to the bit line,
after the fifth voltage is applied to the bit line, the bit line is brought to a floating state,
after the voltage of the bit line attenuates to a sixth voltage lower than the fifth voltage,
the voltage of the first word line is increased from the first voltage to the fourth voltage, and
after the voltage of the first word line and the voltage of the second word line become the fourth voltage,
the voltage of the first select gate line and the voltage of the second select, gate line are decreased from the third voltage to the first voltage, and
the voltage of the first word line and the voltage of the second word line are decreased from the fourth voltage to the first voltage.

22. The memory device according to claim 16, wherein when information is written into the first memory cell,
after the voltage of the first word line is decreased from the fourth voltage to the first voltage, a seventh voltage higher than the first voltage is applied to the bit line,
after the voltage of the bit line is decreased from the seventh voltage to the first voltage,
the voltage of the first word line is increased from the first voltage to the fourth voltage, and
after the voltage of the first word line and the voltage of the second word line become the fourth voltage, the voltage of the first select gate line and the voltage of the second select gate line are decreased from the third voltage to the first voltage, and
the voltage of the first word line and the voltage of the second word line are decreased from the fourth voltage to the first voltage.

23. A memory device comprising:
a variable resistance memory region extending in a first direction that is orthogonal to a semiconductor substrate;
a semiconductor layer extending in the first direction and being in contact with the variable resistance memory region;
an insulating layer extending in the first direction and being in contact, with the semiconductor layer;
a first word line extending in a second direction that is orthogonal to the first direction and being in contact with the insulating layer;
a plurality of second word lines extending in the second direction, being in contact with the insulating layer, being located at a position different from the first word line in the first direction, and being stacked in the first direction;
a first select gate line extending in the second direction and being in contact with the insulating layer; and
a bit line extending in a third direction that is orthogonal to the first direction and the second direction and being in contact with the semiconductor layer,
wherein
in a first plane defined by the second direction and the third direction, a portion where the variable resistance memory region, the semiconductor layer, and the insulating layer intersect the first word line functions as a first memory cell,
in a first plane defined by the second direction and the third direction, a portion where the variable resistance memory region, the semiconductor layer, and the insulating layer intersect the second word lines functions as a plurality of second memory cells,
in the first plane, a portion where the semiconductor layer and the insulating layer intersect the first select gate line functions as a first select transistor, and
when information stored in the first memory cell is read, or when information is written into the first memory cell,
after a voltage of the first select gate line, a voltage of the first word line, and voltages of the second word lines are set to a first voltage,
the voltages of the second word lines are sequentially increased from the first voltage to a second voltage in order from a second word line at a longest distance from the first word line among the second word lines toward a second word line at a shortest distance from the first word line among the second word lines in the first direction.

24. The memory device according to claim 23, further comprising:
a second select gate line extending in the second direction and being in contact with the insulating layer,
wherein
in the first plane, a portion where the semiconductor layer and the insulating layer intersect the second select gate line functions as a second select transistor,
in the first direction, the first memory cell and the second memory cells are sandwiched between the first select transistor and the second select transistor, and
when information stored in the first memory cell is read, or when information is written into the first memory cell,
after the voltage of the first select gate line, a voltage of the second select gate line, the voltage of the first word line, and the voltages of the second word lines are set to the first voltage,
the voltages of the second word lines are sequentially increased from the first voltage to the second voltage in order from the second word line at the longest distance from the first word line among the second word lines toward the second word line at the shortest distance from the first word line among the second word lines in the first direction.

25. The memory device according to claim 23, further comprising:
a source line being in contact with the semiconductor layer;
a plurality of third memory cells including the first memory cell and the second memory cells; and
a memory cell string including the first select transistor and the third memory cells, the third memory cells being coupled in series in the first direction, the first select transistor being coupled to a first end of the third memory cells coupled in series, and the source line being coupled to a second end of the third memory cells.

26. The memory device according to claim 24, further comprising:
a source line being in contact with the semiconductor layer;
a plurality of third memory cells including the first memory cell and the second memory cells; and
a memory cell string including the first select transistor, the second select transistor, and the third memory cells, the third memory cells being coupled in series in the first direction, the first select transistor being coupled to a first end of the third memory cells coupled in series, and the source line being coupled to a second end of the third memory cells via the second select transistor.

27. The memory device according to claim 23, wherein when information stored in the first memory cell is read,
after the voltage of the first select gate line is increased from the first voltage to a third voltage,
a fourth voltage higher than the first voltage is applied to the bit line,
after the fourth voltage is applied to the bit line, the bit line is brought to a floating state, and
after the voltage of the bit line attenuates from the fourth voltage to a fifth voltage lower than the fourth voltage,
the voltages of the second word lines are sequentially decreased from the second voltage to the first voltage in order from the second word line at the shortest distance from the first word line among the second word lines toward the second word line at the longest distance from the first word line among the second word lines in the first, direction.

28. The memory device according to claim 24, wherein when information stored in the first memory cell is read, after the voltage of the first select gate, line and the voltage of the second select gate line are increased from the first voltage to a third voltage, and a fourth voltage higher than the first voltage is applied to the bit line, the bit line is brought to a floating state, and after the voltage of the bit line attenuates from the fourth voltage to a fifth voltage lower than the fourth voltage, the voltages of the second word lines are sequentially decreased from the second voltage to the first voltage in order from the second word line at the shortest distance from the first word line among the second word lines toward the second word line at the longest distance from the first word line among the second word lines in the first direction.

29. The memory device according to claim 23, wherein the voltage of the first select gate line is increased from the first voltage to a third voltage earlier than or simultaneously with a time when a voltage of one of the second word lines is first increased from the first voltage to the second voltage.

30. The memory device according to claim 24, wherein the voltage of the first select gate line and the voltage of the second select gate line are increased from the first voltage to a third voltage earlier than or simultaneously with a time when a voltage of one of the second word lines is first increased from the first voltage to the second voltage.

31. The memory device according to claim 27, wherein the voltage of the first select, gate line is decreased from the third voltage to the first voltage later than or simultaneously with a time when a voltage of one of the second word lines is first decreased from the second voltage to the first voltage.

32. The memory device according to claim 28, wherein the voltage of the second select gate line is decreased from the third voltage to the first voltage later than or simultaneously with a time when a voltage of one of the second word lines is first decreased from the second voltage to the first voltage.

33. The memory device according to claim 23, wherein when information stored in the first memory cell is read, after the voltages of the second word lines are sequentially increased from the first voltage to the second voltage in order from the second word line at the longest distance from the first word line among the second word lines toward the second word line at the shortest distance from the first word line among the second word lines in the first direction, a fourth voltage higher than the first voltage is applied to the bit line, after the fourth voltage is applied to the bit line, the bit line is brought to a floating state, and after the voltage of the bit line attenuates from the fourth voltage to a fifth voltage lower than the fourth voltage, the voltages of the second word lines are sequentially decreased from the second voltage to the first voltage in order from the second word line at the shortest, distance from the first word line among the second word lines toward the second word line at the longest distance from the first word line among the second word lines in the first direction.

34. The memory device according to claim 23, wherein when information is written into the first memory cell, after the voltages of the second word lines are sequentially increased from the first voltage to the second voltage in order from the second word line at the longest distance from the first word line among the second word lines toward the second word line at the shortest distance from the first word line among the second word lines in the first direction, a sixth voltage higher than the first voltage is applied to the bit line, and after the voltage of the bit line is decreased from the sixth voltage to the first voltage, the voltages of the second word lines are sequentially decreased from the second voltage to the first voltage, in order from the second word line at the shortest distance from the first word line among the second word lines toward the second word line at the longest distance from the first word line among the second word lines in the first direction.

35. The memory device according to claim 24, wherein when information stored in the first memory cell is read, after the voltage of the first select gate line and the voltage of the second select gate line are increased from the first voltage to a third voltage, a fourth voltage higher than the first voltage is applied to the bit line, after the voltage of the bit line attenuates from the fourth voltage to a fifth voltage lower than the fourth voltage through a sense operation, the voltages of the second word lines are sequentially decreased from the second voltage to the first voltage in order from the second word line at the shortest distance from the first word line among the second word lines toward the second word line at the longest distance from the first word line among the second word lines in the first direction, and the voltage of the first select gate line and the voltage of the second select gate line are decreased from the third voltage to the first voltage later than or simultaneously with a time when a voltage of one of the second word lines is first decreased from the second voltage to the first voltage.

\* \* \* \* \*